(12) United States Patent  
Park et al.

(10) Patent No.: US 11,997,807 B2  
(45) Date of Patent: May 28, 2024

(54) HINGE STRUCTURE AND FOLDABLE ELECTRONIC DEVICE INCLUDING THE SAME

(71) Applicant: SAMSUNG ELECTRONICS CO., LTD., Suwon-si (KR)

(72) Inventors: Daehyeong Park, Suwon-si (KR); Jaehee Kim, Suwon-si (KR); Jongyoon Kim, Suwon-si (KR); Minsung Lee, Suwon-si (KR); Uyhyeon Jeong, Suwon-si (KR); Yonghwa Han, Suwon-si (KR); Seunghyun Hwang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 205 days.

(21) Appl. No.: 17/741,094

(22) Filed: May 10, 2022

(65) Prior Publication Data

US 2023/0044949 A1 Feb. 9, 2023

Related U.S. Application Data

(63) Continuation of application No. PCT/KR2022/004326, filed on Mar. 28, 2022.

(30) Foreign Application Priority Data

Aug. 9, 2021 (KR) .................. 10-2021-0104720  
Aug. 20, 2021 (KR) .................. 10-2021-0110072

(51) Int. Cl.  
*H05K 5/00* (2006.01)  
*F16C 11/04* (2006.01)  
*H05K 5/02* (2006.01)

(52) U.S. Cl.  
CPC .......... *H05K 5/0226* (2013.01); *F16C 11/04* (2013.01); *H05K 5/0017* (2013.01)

(58) Field of Classification Search  
CPC .................... H05K 5/0017; H05K 5/0217  
(Continued)

(56) References Cited

U.S. PATENT DOCUMENTS 9,611,680 B2    4/2017   Xu  
9,720,447 B2    8/2017   In-Sung et al.  
(Continued)

FOREIGN PATENT DOCUMENTS

CN    210919786      7/2020  
JP    2012-129968    7/2012  
(Continued)

OTHER PUBLICATIONS

Korean Notice of Allowance dated Oct. 5, 2023 in corresponding Korean Patent Application No. 10-2021-0110072.  
(Continued)

*Primary Examiner* — Hung S. Bui  
(74) *Attorney, Agent, or Firm* — Nixon & Vanderhye, P.C.

(57) ABSTRACT

The disclosure discloses a foldable electronic device including rotary supports connected to housings, arm parts connected to the rotary supports, and rotary shafts disposed in the arm parts. At least one arm part among the arm parts includes arm cam structures in which fastening holes spaced apart from each other by a predetermined gap are formed. A shape of a cross-section of a rotary shaft inserted into the fastening holes includes flat areas and curved areas when viewed in an axial direction in which the rotary shaft is inserted. The rotary shaft is formed such that a first thickness of a first portion at least partially disposed in one fastening hole among the fastening holes differs from a second thick- (Continued)

ness of a second portion at least partially disposed in another fastening hole among the fastening holes.

15 Claims, 32 Drawing Sheets

(58) Field of Classification Search
USPC .......................................... 361/807, 809, 810
See application file for complete search history.

(56) References Cited

U.S. PATENT DOCUMENTS

| | | |
|---|---|---|
| 9,778,704 B2 | 10/2017 | Motosugi |
| 9,999,144 B2 | 6/2018 | Xu |
| 10,845,850 B1 | 11/2020 | Kang et al. |
| 10,963,020 B2 | 3/2021 | Kim et al. |
| 11,231,754 B2 | 1/2022 | Kang et al. |
| 11,516,932 B2 | 11/2022 | Sim et al. |
| 2012/0149438 A1 | 6/2012 | Kwon |
| 2015/0227175 A1 | 8/2015 | Motosugi |
| 2016/0060927 A1 | 3/2016 | Xu |
| 2017/0131741 A1 | 5/2017 | In-Sung et al. |
| 2020/0264674 A1 | 8/2020 | Km et al. |
| 2020/0348732 A1 | 11/2020 | Kang et al. |
| 2020/0375046 A1 | 11/2020 | Sim et al. |
| 2021/0165466 A1 | 6/2021 | Kang et al. |
| 2022/0113770 A1 | 4/2022 | Kang et al. |
| 2022/0400565 A1* | 12/2022 | Shin ...................... G06F 1/1616 |

FOREIGN PATENT DOCUMENTS

| | | |
|---|---|---|
| KR | 10-2020-0101238 | 8/2020 |
| KR | 10-2020-0126524 | 11/2020 |
| KR | 10-2020-0135636 | 12/2020 |
| KR | 10-2021-0068880 | 6/2021 |

OTHER PUBLICATIONS

Search Report and Written Opinion dated Jul. 29, 2022 issued in International Patent Application No. PCT/KR2022/004326.

* cited by examiner

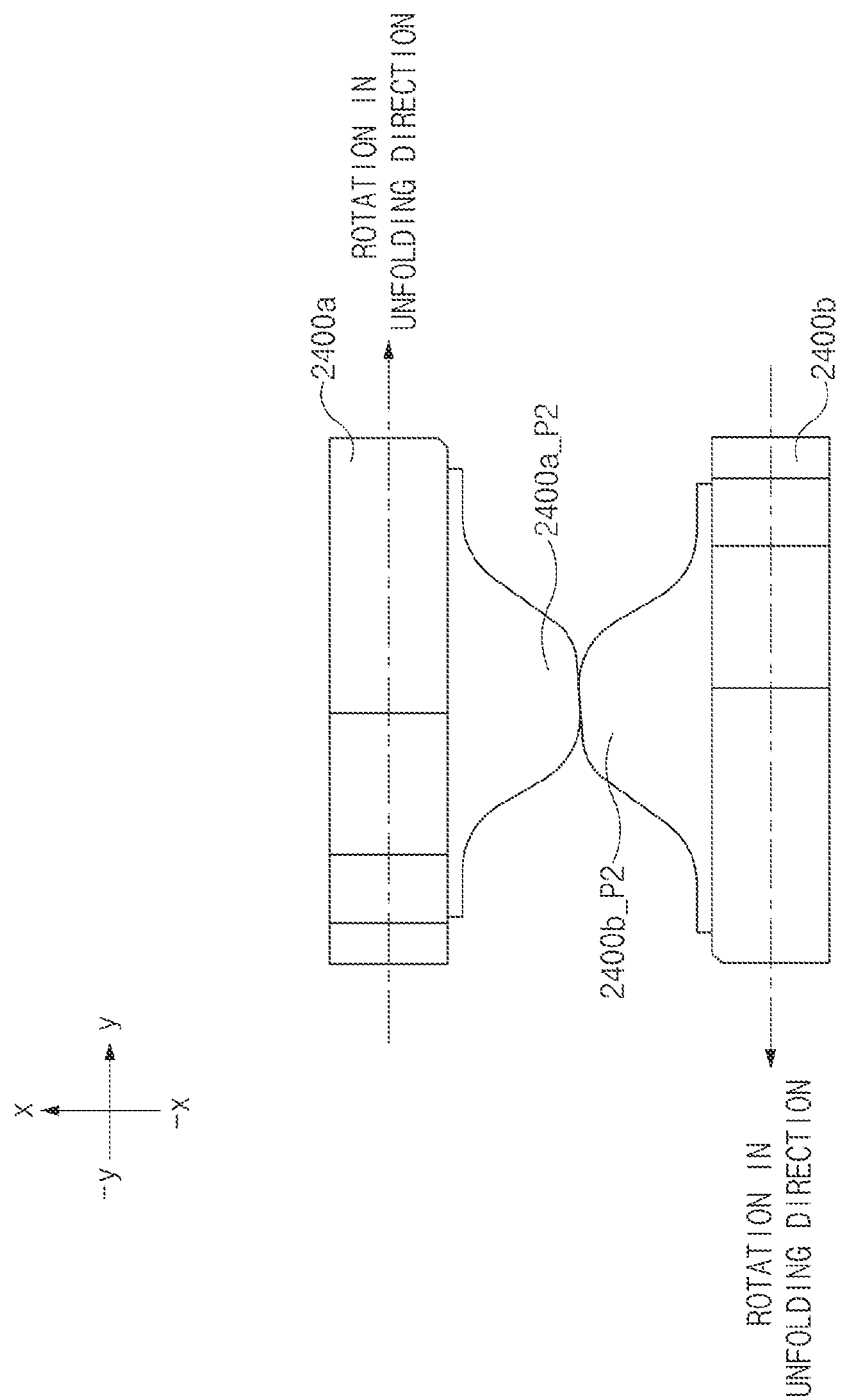

HINGE STRUCTURE AND FOLDABLE ELECTRONIC DEVICE INCLUDING THE SAME

CROSS-REFERENCE TO RELATED APPLICATIONS

This application is continuation of International Application No. PCT/KR2022/004326 designating the United States, filed on Mar. 28, 2022 in the Korean Intellectual Property Receiving Office and claiming priority to Korean Patent Application No. 10-2021-0104720, filed on Aug. 9, 2021, in the Korean Intellectual Property Office, and to Korean Patent Application No. 10-2021-0110072, filed on Aug. 20, 2021, in the Korean Intellectual Property Office, the disclosures of all of which are incorporated by reference herein in their entireties.

BACKGROUND

Field

The disclosure relates to a foldable electronic device including a hinge structure.

Description of Related Art

A portable electronic device such as a smartphone may provide various functions, such as telephone call, video playback, Internet search, and the like, based on various types of applications. A user may want to use the aforementioned various functions through a wider screen. However, portability may be lowered with an increase in screen size. Accordingly, a foldable portable electronic device capable of increasing portability using a foldable structure is being developed.

In the foldable electronic device, a hinge structure may be connected with adjacent housings and may perform a rotary motion while supporting the housings during rotation of the housings through a predetermined angle.

The foldable electronic device may include the hinge structure so as to be foldable. The hinge structure may be disposed to connect at least two housings. Various abnormal sounds (or, noises) may be generated in the hinge structure due to a force applied to the hinge structure while the housings have a folded or flat state in relation to a hinge motion.

Furthermore, foldable electronic devices currently on the market are often manufactured to be thick by a predetermined size or more, and therefore a foldable electronic device having a slimmer shape and capable of a natural hinge motion needs to be developed.

SUMMARY

Embodiments of the disclosure provide a hinge structure having reduced noise, and a foldable electronic device including the hinge structure.

Embodiments of the disclosure provide a hinge structure having a slimmer structure and capable of stably providing various mounting angles, and a foldable electronic device including the hinge structure.

A foldable electronic device (or, a portable electronic device, a portable communication device, a foldable electronic device, or a foldable electronic device having a communication function) according to various example embodiments of the disclosure includes: rotary supports (or rotary members) connected to housings, arm parts connected to the rotary supports, and rotary shafts disposed in the arm parts. At least one arm part among the arm parts includes arm cam structures including a cam in which fastening holes (or holes) spaced apart from each other by a specified gap are formed. A shape of a cross-section of a rotary shaft inserted into the fastening holes includes flat areas and curved areas when viewed in an axial direction in which the rotary shaft is inserted. The rotary shaft is formed such that a first thickness of a first portion at least partially disposed in one fastening hole among the fastening holes differs from a second thickness of a second portion at least partially disposed in another fastening hole among the fastening holes.

According to various example embodiments, the hinge structure and the foldable electronic device including the same may reduce noise in the hinge structure and may support a more natural hinge motion.

Furthermore, according to various example embodiments, the hinge structure and the foldable electronic device including the same may stably provide various mounting angles while providing a slimmer structure.

Moreover, according to various example embodiments, the hinge structure and the foldable electronic device including the same may improve force transmission or force balance between the housings as the hinge structure connected to the housings has a symmetrical structure with respect to the axis facing the lengthwise direction of the hinge housing.

In addition, according to various example embodiments, the hinge structure and the foldable electronic device including the same may provide a structure having more accurate dimensions due to reduction of torsion in a manufacturing process.

Various other aspects and effects provided by the arm structure, the hinge structure, and the electronic device including the same according to the various example embodiments may be provided.

BRIEF DESCRIPTION OF THE DRAWINGS

The above and other aspects, features and advantages of certain embodiments of the present disclosure will be more apparent from the following detailed description, taken in conjunction with the accompanying drawings, in which:

FIG. 30 is a diagram illustrating an example of a contact state of some ridges of a cam and a cam structure according to various embodiments.

DETAILED DESCRIPTION

Figure 1A:
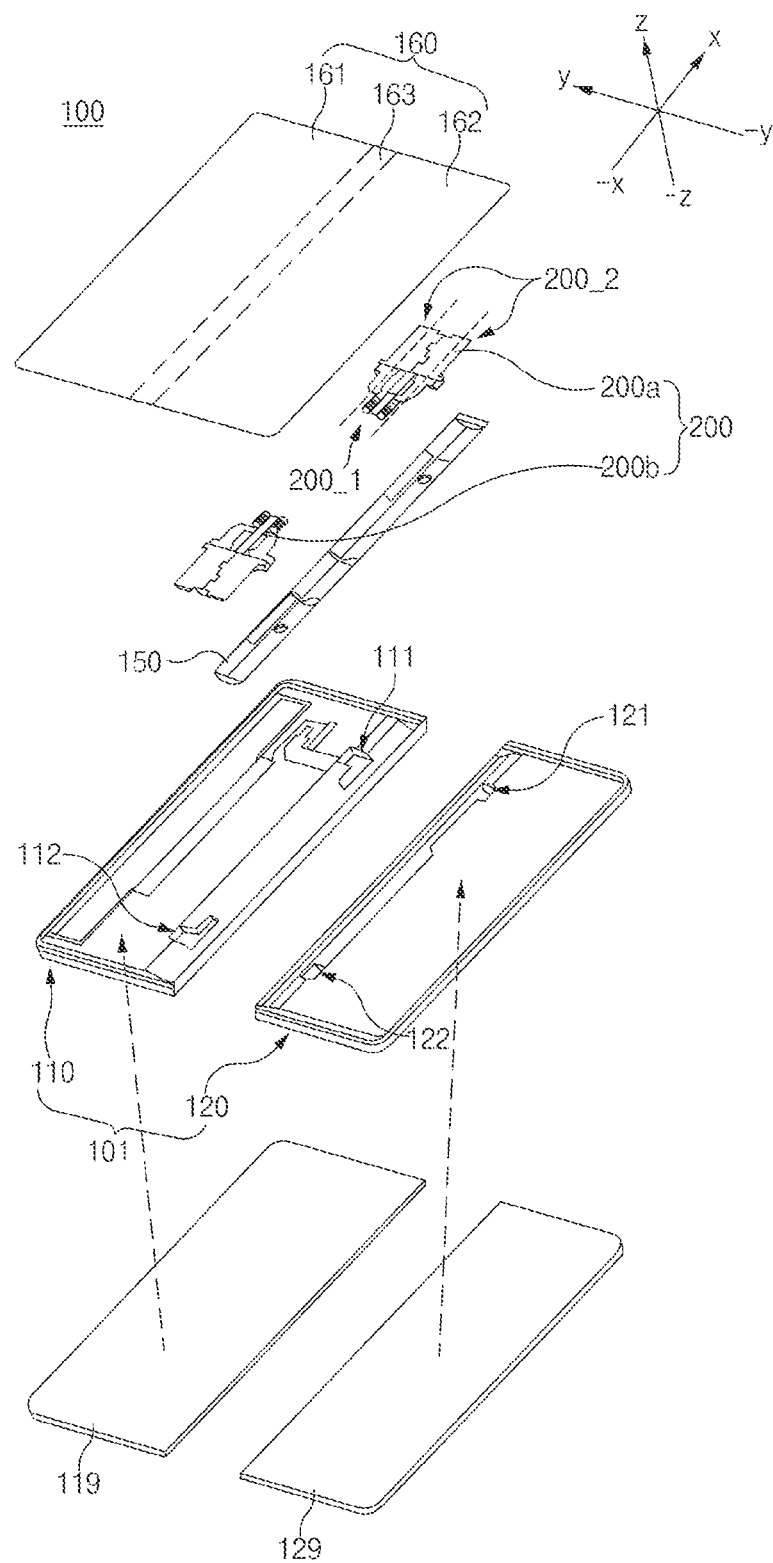
FIG. 1A is an exploded perspective view of a foldable electronic device according to various embodiments.

Hereinafter, various example embodiments of the disclosure may be described with reference to accompanying drawings. Accordingly, those of ordinary skill in the art will recognize that various modifications, equivalents, and/or alternatives on the various embodiments described herein can be variously made without departing from the scope and spirit of the disclosure. In the following description made with respect to the accompanying drawings, similar components will be assigned with similar reference numerals.

In the disclosure, the expressions "have", "may have", "include" and "comprise", or "may include" and "may comprise" used herein indicate existence of corresponding features (e.g., components such as numeric values, functions, operations, or parts) but do not exclude presence of additional features.

In the disclosure, the expressions "A or B", "at least one of A or/and B", or "one or more of A or/and B", and the like may include any and all combinations of one or more of the associated listed items. For example, the term "A or B", "at least one of A and B", or "at least one of A or B" may refer to all of the case (1) where at least one A is included, the case (2) where at least one B is included, or the case (3) where both of at least one A and at least one B are included.

The terms, such as "first", "second", and the like used in the disclosure may be used to refer to various components regardless of the order and/or the priority and to distinguish the relevant components from other components, but do not limit the components. For example, "a first user device" and "a second user device" indicate different user devices regardless of the order or priority. For example, without departing the scope of the disclosure, a first component may be referred to as a second component, and similarly, a second component may be referred to as a first component.

It will be understood that when a component (e.g., a first component) is referred to as being "(operatively or communicatively) coupled with/to" or "connected to" another component (e.g., a second component), it may be directly coupled with/to or connected to the other component or an intervening component (e.g., a third component) may be present. When a component (e.g., a first component) is referred to as being "directly coupled with/to" or "directly connected to" another component (e.g., a second component), it should be understood that there are no intervening component (e.g., a third component).

According to the situation, the expression "configured to" used in the disclosure may be used as, for example, the expression "suitable for", "having the capacity to", "designed to", "adapted to", "made to", or "capable of". The term "configured to" may not refer only to "specifically designed to" in hardware. Instead, the expression "a device configured to" may refer, for example, to the device being "capable of" operating together with another device or other parts. For example, a "processor configured to (or set to) perform A, B, and C" may refer, for example, and without limitation, to a dedicated processor (e.g., an embedded processor) for performing a corresponding operation or a generic-purpose processor (e.g., a central processing unit (CPU) or an application processor) which performs corresponding operations by executing one or more software programs which are stored in a memory device.

Terms used in the disclosure are used to describe specified embodiments and are not intended to limit the scope of the disclosure. The terms of a singular form may include plural forms unless otherwise specified. All the terms used herein, which include technical or scientific terms, may have the same meaning that is generally understood by a person skilled in the art. It will be further understood that terms, which are defined in a dictionary and commonly used, should also be interpreted as is customary in the relevant related art and not in an idealized or overly formal unless expressly so defined in various embodiments of the disclosure. In some cases, even if terms are terms which are defined in the disclosure, they may not be interpreted to exclude embodiments of the disclosure.

An electronic device according to various embodiments of the disclosure may include at least one of, for example, and without limitation, smartphones, tablet personal computers (PCs), mobile phones, video telephones, electronic book readers, desktop PCs, laptop PCs, netbook computers, workstations, servers, personal digital assistants (PDAs), portable multimedia players (PMPs), Motion Picture Experts Group (MPEG-1 or MPEG-2) Audio Layer 3 (MP3) players, mobile medical devices, cameras, wearable devices, or the like. According to various embodiments, the wearable device may include, for example, and without limitation, at least one of an accessory type (e.g., watches, rings, bracelets, anklets, necklaces, glasses, contact lens, or head-mounted-devices (HMDs)), a fabric or garment-integrated type (e.g., an electronic apparel), a body-attached type (e.g., a skin pad or tattoos), a bio-implantable type (e.g., an implantable circuit), or the like.

Hereinafter, electronic devices according to various embodiments will be described with reference to the accompanying drawings. In the disclosure, the term "user" may refer to a person who uses an electronic device or may refer to a device (e.g., an artificial intelligence electronic device) that uses the electronic device.

Figure 1B:
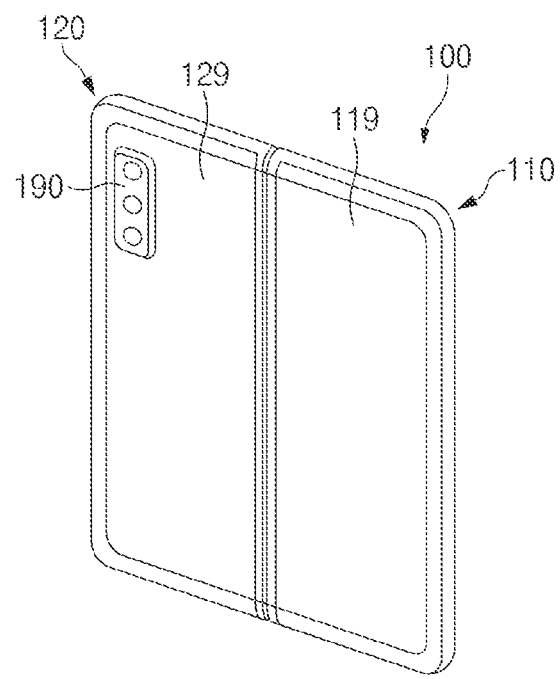
FIG. 1B is a rear perspective view illustrating an example foldable electronic device according to various embodiments.
Figure 1C:
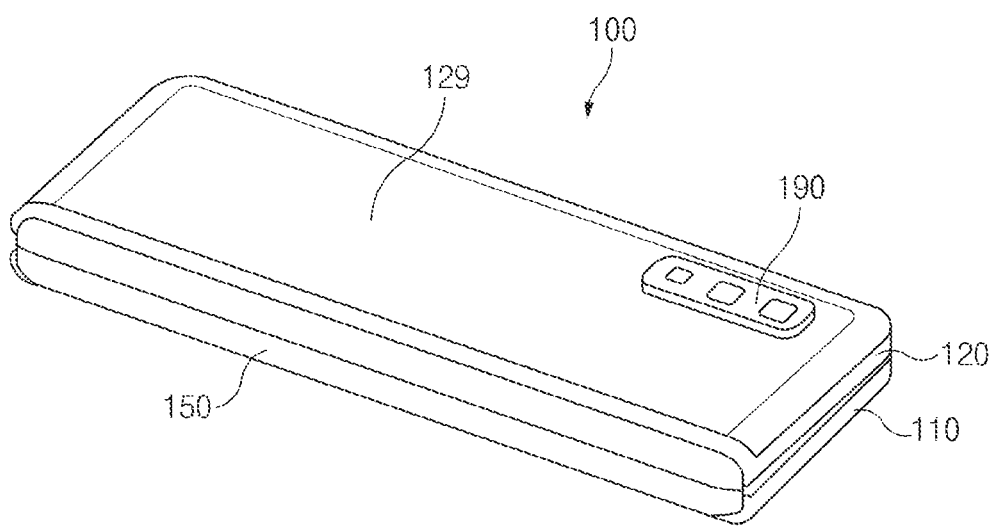
FIG. 1C is a perspective view illustrating the foldable electronic device in a folded state according to various embodiments.

FIG. 1A is an exploded perspective view of a foldable electronic device according to various embodiments, FIG. 1B is a rear view illustrating side of the foldable electronic device according to various embodiments, and FIG. 1C is a view illustrating a folded state of the foldable electronic device according to various embodiments.

Referring to FIGS. 1A, 1B and 1C (which may be referred to as FIGS. 1A to 1C), the foldable electronic device 100 (or, the electronic device, the flexible display device, or the flexible & foldable electronic device) according to an embodiment may include a housing 101 (e.g., a first housing 110 (or, a first housing portion, a first housing part, or a first housing unit) and a second housing 120 (or, a second housing portion, a second housing part, or a second housing unit)), a hinge housing 150 (or, a hinge cover or a hinge case—a housing, frame, cover, or case accommodating at least a portion of a hinge structure), a hinge structure 200 (or, a hinge module, a hinge, a hinge unit, a hinge structure member, a hinge member or a hinge part) (e.g., a first hinge structure 200a and a second hinge structure 200b), and a display 160 (or, a flexible display or a display module—a display, at least a portion of which can be bent) that is at least partially disposed in the front direction of the hinge structure 200 (e.g., the z-axis direction). The electronic device 100 may further include a first cover 119 that covers at least a portion of the rear surface (e.g., the surface facing the −z-axis direction) of the first housing 110 and a second cover 129 that covers at least a portion of the rear surface (e.g., the surface facing the −z-axis direction) of the second housing 120. The first cover 119 may integrally form a rear surface with the first housing 110, and the second cover 129 may integrally form a rear surface with the second housing 120.

The housing 101 may include at least a pair of housings that are rotatable about a predetermined (e.g., specified) axis. For example, the housing 101 may include the first housing 110 and the second housing 120. Depending on an arrangement, the first housing 110 may be disposed to be continuous with the second housing 120 (e.g., when a central portion 163 of the display 160 is unfolded to be flat or when the housing 101 is in a flat state), or may be disposed side by side with the second housing 120. When the central portion 163 of the display 160 is folded, one surface of the first housing 110 may be disposed to face one surface of the second housing 120.

For example, at least a portion of the first housing 110 may be formed of a metallic material, or at least a portion of the first housing 110 may be formed of a non-metallic material (or, the entire first housing 110 may be formed of metal or non-metal). To support at least a portion of the display 160, the first housing 110 may be formed of a material having a predetermined stiffness. One area of the display 160 (e.g., at least part of a first portion 161 of the display 160 and at least part of one side of the central portion 163) may be disposed on at least a portion of the front surface of the first housing 110. At least a portion of the first housing 110 may be attached with at least part of the first portion 161 of the display 160 (e.g., may be attached through an adhesive material, an adhesive, an adhesive tape, or an adhesive layer) (hereinafter, applied to the meaning of "adhesion"). At least a portion of the periphery of the front surface of the first housing 110 may be attached with the periphery of the first portion 161 of the display 160. At least a portion of the front surface (e.g., the surface facing the z-axis direction) of the first housing 110 may be attached with at least part of the first portion 161 of the display 160. In this regard, an adhesive layer may be at least partially disposed between the first housing 110 and the first portion 161 of the display 160. The first housing 110 may have an empty space inside, or may be coupled with the first cover 119 to form an empty space inside. Electronic components (e.g., a printed circuit board, and components, such as at least one processor, at least one memory, and a battery, which are mounted on the printed circuit board) that are required to drive the electronic device 100 may be disposed in the empty space.

According to various embodiments, edges of the first housing 110 (e.g., the remaining three edges other than the edge facing the second housing 120 in a flat state of the electronic device 100) may protrude above the bottom surface of a central portion of the first housing 110 by a specified height to surround at least one edge of the display 160. Sidewalls may be disposed on at least one of the edges of the first housing 110 to at least partially face the periphery of the display 160. The sidewalls may be formed on the remaining three edges of the first housing 110 other than the edge facing the second housing 120 and may have a specified height. The edge portion of the first housing 110 that faces the second housing 120 may include a depression, at least a portion of which has a predetermined curvature such that at least a portion of the hinge housing 150 is disposed therein. For example, the first housing 110 may include, on the edge portion facing the second housing 120, a first step portion 111 in which a portion of the first hinge structure 200a located on the hinge housing 150 is disposed and a second step portion 112 in which a portion of the second hinge structure 200b located on the hinge housing 150 is disposed.

According to various embodiments, depending on an arrangement, the second housing 120 may be disposed side by side with the first housing 110, or may be disposed such that at least one surface thereof faces one surface of the first housing 110 (e.g., the surface on which the display 160 is disposed). For example, the second housing 120 may be formed of the same material as that of the first housing 110. The second housing 120 may be disposed to be symmetrical to the first housing 110 in the left/right direction or the up/down direction, and at least a portion of the remaining area of the display 160 other than the area disposed on the first housing 110 (e.g., at least part of a second portion 162 of the display 160 and at least part of an opposite side of the central portion 163) may be disposed on the front surface of the second housing 120. At least a portion of the second housing 120 may be attached with at least part of the second portion 162 of the display 160. The periphery of the front surface of the second housing 120 may be attached with the periphery of the second portion 162 of the display 160. One side of the lower portion of the front surface of the second housing 120 may be attached with one side of the second portion 162 of the display 160. In this regard, an adhesive layer may be at least partially disposed between the second housing 120 and the second portion 162 of the display 160. Similarly to the first housing 110, the second housing 120 may have an empty space inside or may be coupled with the second cover 129 to form an empty space inside, and an electronic component required to drive the electronic device 100 may be disposed in the empty space. According to various embodiments, a camera 190 may be disposed on the rear surface of the second housing 120, and with regard to the arrangement of the camera 190, the second cover 129 may have a hole formed therein in which the camera 190 is disposed.

According to various embodiments, edges of the second housing 120 (e.g., the remaining three edges other than the edge facing the first housing 110) may protrude above the bottom surface of a central portion of the second housing 120 by a specified height to surround the periphery on the opposite side of the display 160. Similarly to the sidewalls formed on the first housing 110, sidewalls may be disposed on at least one of the edges of the second housing 120 to at least partially face the periphery of the display 160. The sidewalls may be formed on the remaining three edges of the second housing 120 other than the edge facing the first housing 110 and may have a specified height.

According to various embodiments, the edge portion of the second housing 120 that faces the first housing 110 may include a depression, at least a portion of which has a predetermined curvature such that at least a portion of the hinge housing 150 is disposed therein. For example, the second housing 120 may include, on the edge portion facing the first housing 110, a third step portion 121 in which a portion of the hinge housing 150 having the first hinge structure 200a mounted thereon is disposed and a fourth step portion 122 in which a portion of the hinge housing 150 having the second hinge structure 200b mounted thereon is disposed.

According to various embodiments, the electronic device 100 may include at least one sensor disposed in the first housing 110 or the second housing 120. The sensor may include, for example, and without limitation, at least one of a proximity sensor, an illuminance sensor, an iris sensor, an image sensor (or, a camera), or a fingerprint sensor.

According to various embodiments, depending on a folded or flat state of the electronic device 100, the hinge housing 150 may be hidden by one side of the first housing 110 and one side of the second housing 120 (e.g., in a flat state of the housing 101), or may be exposed to the outside (e.g., in a folded state of the housing 101). For example, when the first housing 110 and the second housing 120 are disposed side by side, the hinge housing 150 may be hidden by the first housing 110 and the second housing 120. When one surface of the first housing 110 and one surface of the second housing 120 face each other, at least a portion of the hinge housing 150 may be exposed to the outside from between one edge of the first housing 110 and one edge of the second housing 120 (e.g., the edges of the first housing 110 and the second housing 120 that face each other in a flat state). The hinge housing 150 may have an empty space inside and may include sidewalls disposed to at least partially close the opposite edges (e.g., the edges in the x-axis direction and the −x-axis direction). At least one boss fastened with the first hinge structure 200a and the second hinge structure 200b may be disposed on at least a portion of the inside surface of the hinge housing 150.

According to various embodiments, at least a portion of the display 160 may have flexibility. According to an embodiment, the display 160 may include the first portion 161 (or, the first area) that is disposed on the first housing 110, the second portion 162 (or, the second area) that is disposed on the second housing 120, and the central portion 163 (or, the central area) to which the first housing 110 and the second housing 120 are adjacent in a flat state of the electronic device 100 and that corresponds to the position of the hinge structure 200. According to various embodiments, the entire display 160 may have flexibility. At least part of the central portion 163 of the display 160 may have flexibility. The central portion 163 of the display 160 may be disposed such that the first housing 110 and the second housing 120 are not attached thereto. For example, the central portion 163 of the display 160 may be spaced apart from the front surface (e.g., the surface facing the z-axis direction) of the hinge structure in a folding motion of the electronic device 100. The first portion 161 of the display 160 may be attached with at least a portion of the first housing 110, and the second portion 162 of the display 160 may be attached with at least a portion of the second housing 120. In this regard, an adhesive layer may be disposed in at least a partial area between the display 160 and the first housing 110, and an adhesive layer may be disposed in at least a partial area between the display 160 and the second housing 120. The display 160 may include various layers. For example, the display 160 may include at least one of an outer protective layer (or, a glass layer or a polymer layer) that has a predetermined transparency and has a specified size or more, a display panel layer that is disposed under the outer protective layer and that displays a screen, or a first rear layer disposed under the display panel layer. The first rear layer may include at least one of a shock absorbing layer (or, an embo) or a heat radiating layer (or, a metal sheet layer). The first rear layer may further include an electromagnetic induction panel (e.g., a digitizer). According to various embodiments, the display 160 may further include a second rear layer disposed under the first rear layer. The second rear layer may include at least one metal layer (or, metal sheet), at least a portion of which is formed of a metallic material. The display 160 may include all or some of the layers described above. The second rear layer may include a specified pattern (e.g., a lattice pattern or a slit pattern) such that at least a portion thereof can be bent. Alternatively, at least a portion of the second rear layer may be formed of a flexible material (e.g., a polymer material, rubber, or a leather material).

According to various embodiments, at least one hinge structure 200 may be disposed based on the x-axis direction. For example, the hinge structure 200 may include the first hinge structure 200a and the second hinge structure 200b. The hinge structure 200 may include first portions 200_1 disposed inside the hinge housing 150 and second portions 200_2 corresponding to peripheral structures that are disposed over the hinge housing 150 or do not overlap the hinge housing 150 based on the z-axis (e.g., structures coupled with the first housing 100 and the second housing 120). Among the first portions of the hinge structure 200, the first portion of the first hinge structure 200a may be disposed on a first inside of the hinge housing 150 (e.g., an area biased in the x-axis direction within the hinge housing 150). Among the first portions of the hinge structure 200, the first portion of the second hinge structure 200b may be disposed on a second inside of the hinge housing 150 (e.g., an area biased in the −x-axis direction within the hinge housing 150). At least parts of the second portions of the hinge structure 200 may rotate in response to rotary motions of the first housing 110 and the second housing 120. At least one of the first hinge structure 200a or the second hinge structure 200b according to an embodiment may include a plurality of detent structures.

Figure 2:
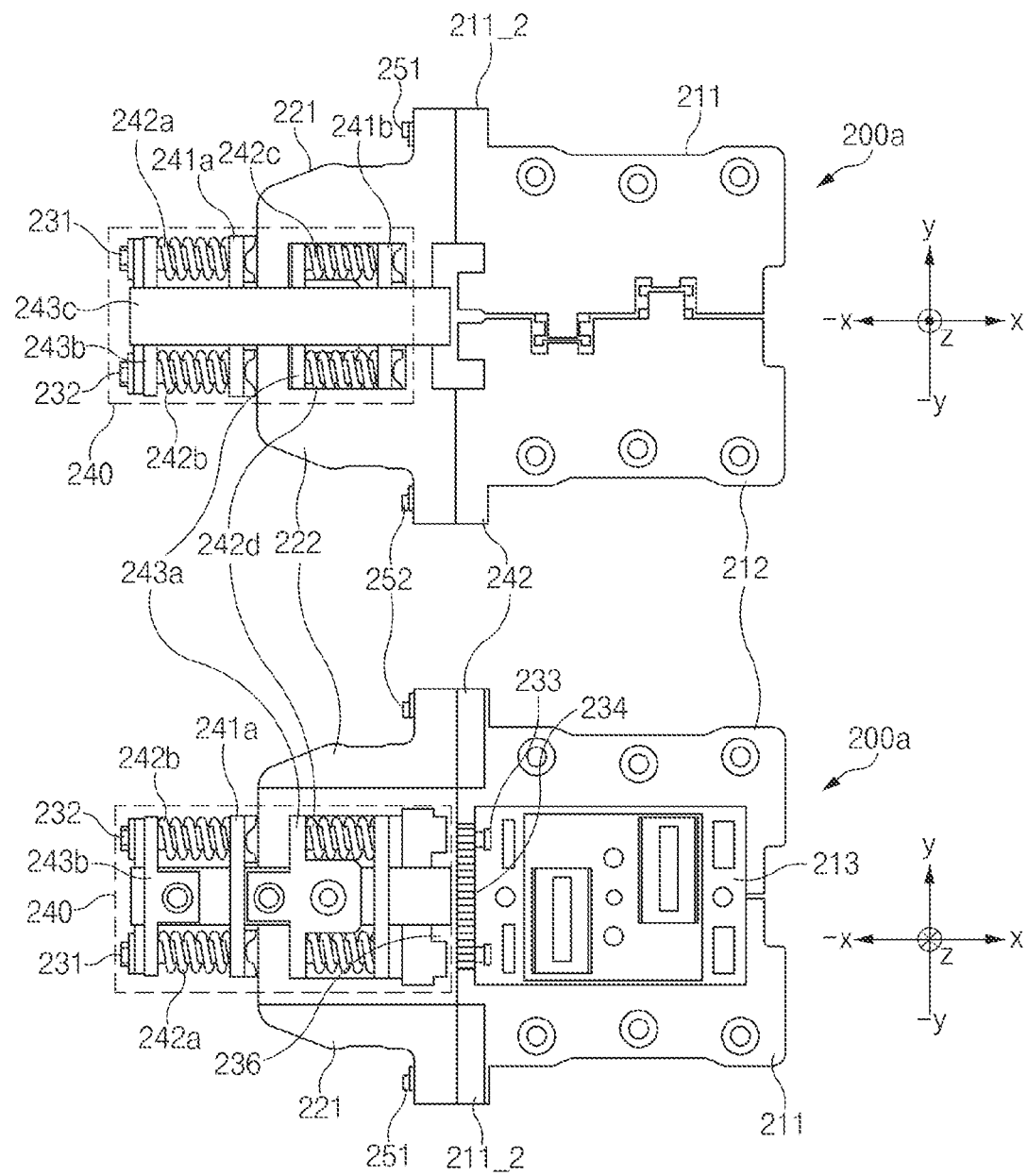
FIG. 2 is a diagram illustrating an example of the front side and the rear side of a hinge structure of the foldable electronic device according to various embodiments.
Figure 3:
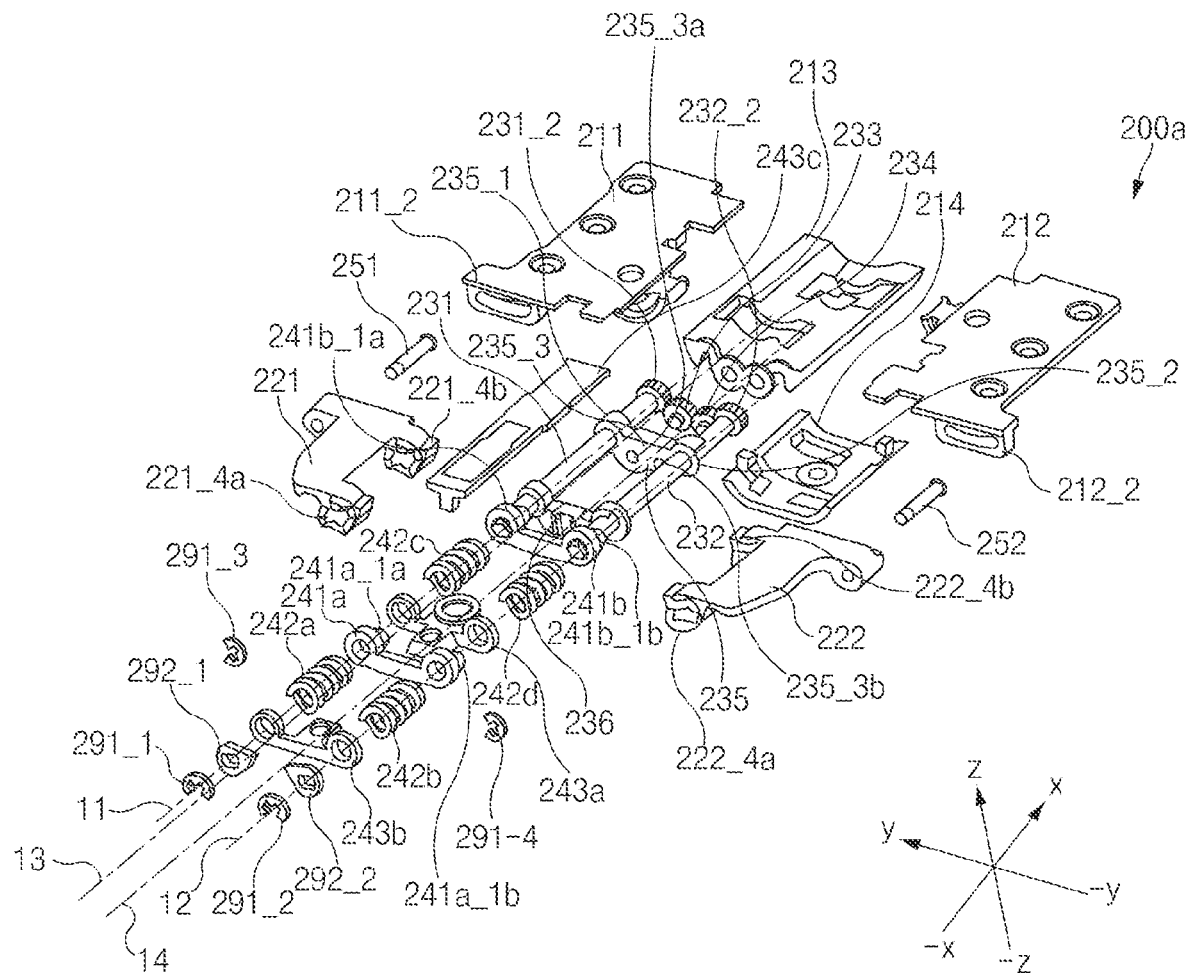
FIG. 3 is an exploded perspective view of the hinge structure when viewed in a first direction according to various embodiments.
Figure 4:
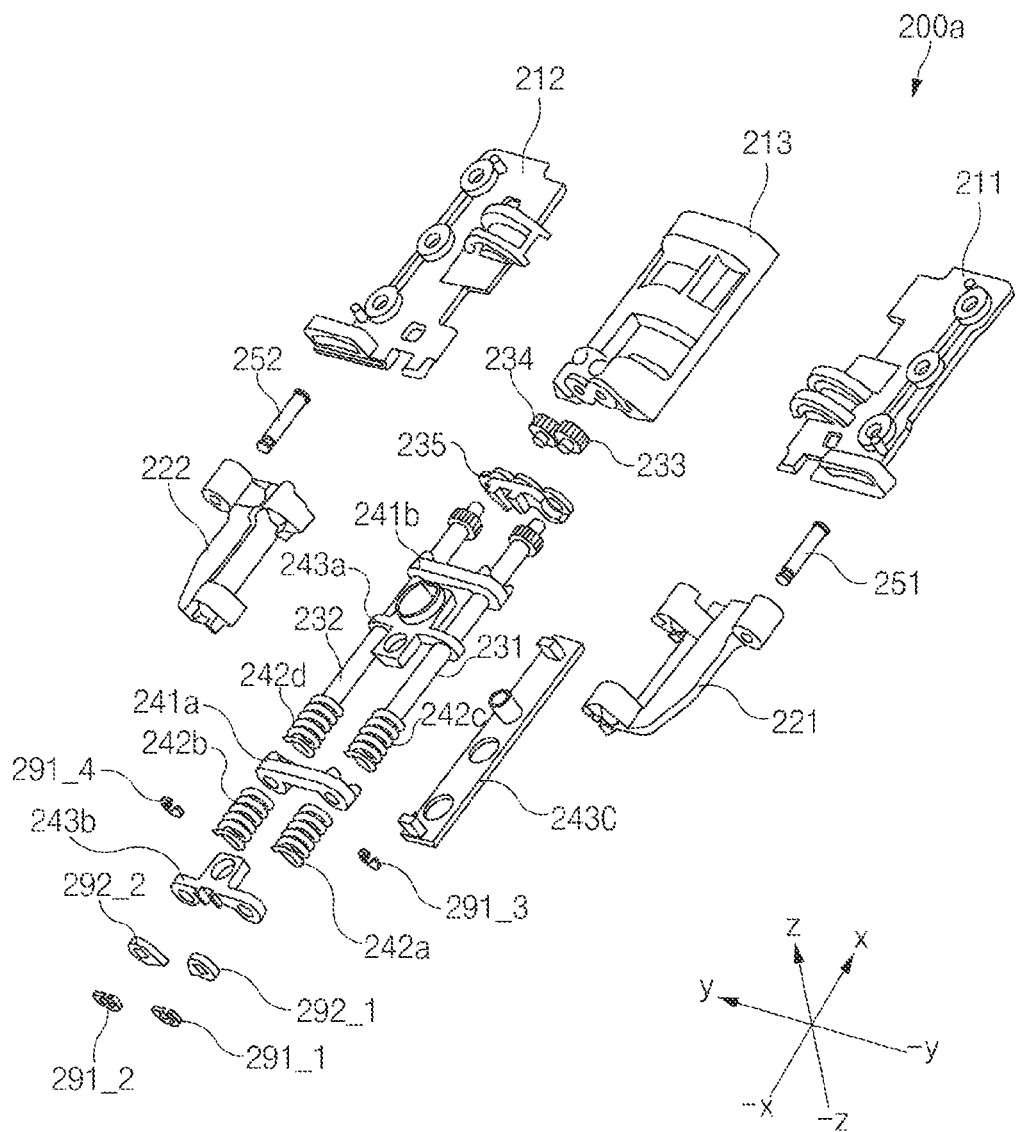
FIG. 4 is an exploded perspective view of the hinge structure when viewed in a second direction according to various embodiments.

FIG. 2 is a diagram illustrating an example of the front side and the rear side of a hinge structure of the foldable electronic device according to various embodiments, FIG. 3 is an exploded perspective view of the hinge structure when viewed in a first direction according to various embodiments, and FIG. 4 is an exploded perspective view of the hinge structure when viewed in a second direction according to various embodiments.

Referring to FIGS. 1A, 1B, 1C, 3 and 4 (which may be referred to as FIGS. 1A to 4), the electronic device 100 according to an embodiment may include a plurality of hinge structures 200, and the first hinge structure 200a may have a structure and a shape similar to those of the second hinge structure 200b. The following description will be given based on the first hinge structure 200a. Although FIG. 1A illustrates the structure in which the first hinge structure 200a and the second hinge structure 200b are disposed on the hinge housing 150, the disclosure is not limited thereto, and three or more hinge structures may be mounted on the hinge housing 150.

According to various embodiments, the first hinge structure 200a may include rotary members 211 and 212 (or, support members or members), a fixed bracket 213 (or, a fixed part, a fixed unit, or a fixed plate), arm parts 221 and 222, idle gears 233 and 234, and a multi-detent structure 240.

According to various embodiments, the rotary members 211 and 212 may form a driving trajectory of the display 160. The rotary members 211 and 212 may include a first rotary member 211 (or a first rotational member) coupled to one side of the fixed bracket 213 and a second rotary member 212 (or a second rotational member) coupled to an opposite side of the fixed bracket 213. The first rotary member 211 may rotate (e.g., in the clockwise or counterclockwise direction based on the x-axis) within a first angle range while being coupled to the one side of the fixed bracket 213. The second rotary member 212 may rotate (e.g., in the counterclockwise or clockwise direction based on the x-axis) within a second angle range while being coupled to the opposite side of the fixed bracket 213. The magnitudes of the first and second angle ranges may be the same as or similar to each other, and the directions of the first and second angle ranges may be opposite to each other. When the electronic device 100 is in a flat state, the edge of the first rotary member 211 that faces the −y-axis direction may be adjacent to the edge of the second rotary member 212 that faces the y-axis direction. When the electronic device 100 is in a folded state, the upper surface (e.g., the surface facing the z-axis direction) of the first rotary member 211 may face the upper surface (e.g., the surface facing the z-axis direction) of the second rotary member 212. The first rotary member 211 may rotate about a third axis 13 (refer to FIG. 14) (or, a virtual axis) within a predetermined angle range (e.g., a range of 0 degrees to 100 degrees or a range of 0 degrees to 95 degrees). The second rotary member 212 may rotate about a fourth axis 14 (refer to FIG. 14) (or, a virtual axis) within a predetermined angle range (e.g., a range of 0 degrees to −100 degrees or a range of 0 degrees to −95 degrees). The third axis 13 and the fourth axis 14 may be located to be spaced apart from each other by a predetermined gap. The third axis 13 and the fourth axis 14 may be located above a first axis 11 and a second axis 12 based on the z-axis.

According to various embodiments, at least one portion of the fixed bracket 213 may be fixedly disposed in the empty space of the hinge housing 150. In this regard, the at least one portion of the fixed bracket 213 may have a size corresponding to the empty space of the hinge housing 150. Furthermore, the at least one portion of the fixed bracket 213 may have a shape corresponding to the empty space of the hinge housing 150, for example, a semi-cylindrical shape. The fixed bracket 213 may include at least one hole into which the at least one boss formed on the hinge housing 150 is inserted. The first rotary member 211 may be disposed on the one side of the fixed bracket 213 so as to be rotatable within a predetermined angle range, and the second rotary member 212 may be disposed on the opposite side of the fixed bracket 213 so as to be rotatable within a predetermined angle range. A part of the multi-detent structure 240 (e.g., one side of a first rotary shaft 231 (or, a first shaft) and one side of a second rotary shaft 232 (or, a second shaft) and a part of the idle gears 233 and 234 may be disposed on one side of the front surface (e.g., the end portion facing the −x-axis direction) of the fixed bracket 213. According to various embodiments, the first hinge structure 200a may further include a bracket cover 214 disposed in the rear direction of the fixed bracket 213 (e.g., the −z-axis direction) and fastened with the rear surface (e.g., the surface facing the −z-axis direction) of the fixed bracket 213.

According to various embodiments, in response to rotation of the rotary members 211 and 212 of the electronic device 100, the arm parts (or, the arm structures) 221 and 222 may rotate about axes of rotation (e.g., the first axis of rotation 11 and the second axis of rotation 12) while sliding relative to the rotary members 211 and 212 and may be engaged with moving cam members 241a and 241b to implement a detent operation. For example, the arm parts 221 and 222 may be connected, at sides thereof, with the rotary members 211 and 212 through fastening parts 251 and 252 and may move while sliding along at least parts of lateral portions of the rotary members 211 and 212 in response to rotation of the rotary members 211 and 212. The moving cam members 241a and 241b of the foldable electronic device may include bridges connecting cams (e.g., a first bridge that connects cams of the first moving cam member 241a and a second bridge that connects cams of the second moving cam member 241b).

The arm parts 221 and 222 may include, for example, a first arm part 221 (or a first arm portion) connected with the first rotary member 211 through the first fastening part 251 and a second arm part 222 (or a second arm portion) connected with the second rotary member 212 through the second fastening part 252.

The first arm part 221 may include at least one arm cam structure (or, an arm cam, an arm cam part, or an arm cam member—a cam formed on, brought into contact with, or connected to an arm) (e.g., a first arm cam structure 221_4a and a second arm cam structure 221_4b) fastened with the moving cam members 241a and 241b (or, the moving cams or the cam members—the cams, the positions of which are changed depending on a motion of the first arm part 221) included in the multi-detent structure 240, and the second arm part 222 may include at least one arm cam structure (e.g., a third arm cam structure 222_4a and a fourth arm cam structure 222_4b) fastened with the moving cam members 241a and 241b included in the multi-detent structure 240. The first arm cam structure 221_4a and the second arm cam structure 221_4b fastened with the moving cam members 241a and 241b may implement a detent of a cam type in folding and unfolding motions of the electronic device 100. The first arm part 221 and the second arm part 222 may provide a hinge force (or, a feeling of detent) of the electronic device 100 using the arm cam structures 221_4a, 221_4b, 222_4a, and 222_4b engaged with the moving cam members 241a and 241b. The arm parts 221 and 222 may support providing improved wear resistance and a softer hinge force (or, a softer feeling of detent) through the multi-detent structure 240 while providing a more robust and stable hinge force (or, a more robust and stable feeling of detent) based on the multi-detent structure 240. According to various embodiments, protruding structures for preventing and/or reducing movements of the first rotary shaft 231 and the second rotary shaft 232 may be disposed on the arm cam structures 221_4a, 221_4b, 222_4a, and 222_4b.

According to various embodiments, the multi-detent structure 240 may include the first rotary shaft 231 (or, the shaft or the shaft member), the second rotary shaft 232, a rotary shaft support member 235, a stopper 236, the first moving cam member 241a, the second moving cam member 241b, a center bar 243c, a center bracket 243a, a shaft bracket 243b, support rings 292_1 and 292_2, a plurality of fixing clips 291_1, 291_2, 291_3, and 291_4 (or, fixing parts or fixing members), and a plurality of elastic bodies 242a, 242b, 242c, and 242d.

According to various embodiments, the first rotary shaft 231 and the second rotary shaft 232 may provide a hinge force (or, a feeling of detent) of a cam type. The first rotary shaft 231 and the second rotary shaft 232 may have a length greater than the separation distances between the cam structures formed on the arm parts 221 and 222. The first rotary shaft 231 and the second rotary shaft 232 may be spaced apart from each other and may be disposed in the x-axis direction in parallel. Shaft gears 231_2 and 232_2 may be formed on the first rotary shaft 231 and the second rotary shaft 232. The shaft gears 231_2 and 232_2 may be disposed to be engaged with different idle gears (e.g., the first idle gear 233 and the second idle gear 234). Accordingly, the arm parts 221 and 222 of the hinge structure 200 may be rotated through the same angle at the same time by forces generated while the first rotary member 211 and the second rotary member 212 rotate. The first rotary shaft 231 may rotate about the first axis 11, and the second rotary shaft 232 may rotate about the second axis 12.

According to various embodiments, one side of the rotary shaft support member 235, one side of the stopper 236, one side of the center bracket 243a, one side of the shaft bracket 243b, the first support ring 292_1, and the first fixing clip 291_1 may be mounted on the first rotary shaft 231. A first cam 241a_1a formed on the first moving cam member 241a, a third cam 241b_1a formed on the second moving cam member 241b, the first arm cam structure 221_4a and the second arm cam structure 221_4b of the first arm part 221, the first elastic body 242a, and the third elastic body 242c may be mounted on the first rotary shaft 231. The first shaft gear 231_2 may be formed on the first rotary shaft 231, and at least a portion of the first shaft gear 231_2 may be disposed to be engaged with the first idle gear 233. One end (e.g., the end facing the x-axis direction) of the first rotary shaft 231 may be disposed on one side surface (e.g., the end portion facing the −x-axis direction) of the fixed bracket 213. The first rotary shaft 231 may be differently formed depending on the positions of the z-axis cross-sections thereof such that the first rotary shaft 231 is sequentially press-fit into the first arm cam structure 221_4a and the second arm cam structure 221_4b.

According to various embodiments, an opposite side of the rotary shaft support member 235, an opposite side of the stopper 236, an opposite side of the center bracket 243a, an opposite side of the shaft bracket 243b, the second support ring 292_2, and the second fixing clip 291_2 may be mounted on the second rotary shaft 232. A second cam 241a_1b formed on the first moving cam member 241a, a fourth cam 241b_1b formed on the second moving cam member 241b, the third arm cam structure 222_4a and the fourth arm cam structure 222_4b of the second arm part 222, the second elastic body 242b, and the fourth elastic body 242d may be mounted on the second rotary shaft 232. The second shaft gear 232_2 may be formed on the second rotary shaft 232, and at least a portion of the second shaft gear 232_2 may be disposed to be engaged with the second idle gear 234. One end (e.g., the end facing the x-axis direction) of the second rotary shaft 232 may be disposed on the one side surface (e.g., the end portion facing the −x-axis direction) of the fixed bracket 213. The second rotary shaft 232 may be differently formed depending on the positions of the z-axis cross-sections thereof such that the second rotary shaft 232 is sequentially press-fit into the third arm cam structure 222_4a and the fourth arm cam structure 222_4b.

According to various embodiments, the rotary shaft support member 235 may include a first ring 235_1 fastened with the first rotary shaft 231, a second ring 235_2 fastened with the second rotary shaft 232, and a ring body 235_3 connecting the first ring 235_1 and the second ring 235_2 and facing sides surfaces of the idle gears 233 and 234. The ring body 235_3 may include a first hole 235_3a into which one side of the first idle gear 233 is inserted and a second hole 235_3b into which one side of the second idle gear 234 is inserted. The rotary shaft support member 235 may be disposed between the stopper 236 and the shaft gears 231_2 and 232_2 formed on the rotary shafts 231 and 232. The rotary shaft support member 235 may be disposed to surround at least portions of the idle gears 233 and 234 and may guide the idle gears 233 and 234 such that the idle gears 233 and 234 do not deviate from specified positions.

According to various embodiments, the center bar 243c may have a rod shape longer in the y-axis direction than in the x-axis direction and may be disposed between the first rotary shaft 231 and the second rotary shaft 232 to hide the space between the first rotary shaft 231 and the second rotary shaft 232. The center bar 243c may include one or more protrusions formed in the −z-axis direction. The protrusions may be fastened with a hole formed in the center bracket 243a and a hole formed in the shaft bracket 243b. The center bar 243c may move in the z-axis direction or the −z-axis direction depending on rotation of the first arm part 221 and the second arm part 222. For example, in a flat state of the electronic device 100, the center bar 243*c* may move in the z-axis direction to support the display 160, and in a folded state of the electronic device 100, the center bar 243*c* may move a predetermined distance downward in the −z-axis direction to secure the distance from the display 160 such that the display 160 is not damaged by a drop impact or an external force.

According to various embodiments, the shaft bracket 243*b* may be disposed between the support rings 292_1 and 292_2 and the first and second elastic bodies 242*a* and 242*b*. The shaft bracket 243*b* may include ring-shaped wings mounted on the first rotary shaft 231 and the second rotary shaft 232 and a body supporting the wings. The shaft bracket 243*b* may be fastened with one of the protrusions formed on the center bar 243*c*. The shaft bracket 243*b* may guide the first rotary shaft 231 and the second rotary shaft 232 to maintain a predetermined gap therebetween during rotation of the first rotary shaft 231 and the second rotary shaft 232.

According to various embodiments, the plurality of fixing clips 291_1, 291_2, 291_3, and 291_4 may include the first fixing clip 291_1 coupled to one side (e.g., the end facing the −x-axis direction) of the first rotary shaft 231, the second fixing clip 291_2 coupled to one side (e.g., the end facing the −x-axis direction) of the second rotary shaft 232, the third fixing clip 291_3 coupled to one side (e.g., the end facing the −x-axis direction) of the first fastening part 251, and the fourth fixing clip 291_4 coupled to one side (e.g., the end facing the −x-axis direction) of the second fastening part 252. The first fixing clip 291_1 may serve to fix components mounted on the first rotary shaft 231 (e.g., at least one of the first support ring 292_1, the one side of the shaft bracket 243*b*, the first elastic body 242*a*, the first cam 241*a*_1*a*, the one side of the center bracket 243*a*, the third elastic body 242*c*, the third cam 241*b*_1*a*, the one side of the stopper 236, or the one side of the rotary shaft support member 235) such that the components mounted on the first rotary shaft 231 are not separated to one side (e.g., in the −x-axis direction). The second fixing clip 291_2 may serve to fix components mounted on the second rotary shaft 232 (e.g., at least one of the second support ring 292_2, the opposite side of the shaft bracket 243*b*, the second elastic body 242*b*, the second cam 241*a*_1*b*, the opposite side of the center bracket 243*a*, the fourth elastic body 242*d*, the fourth cam 241*b*_1*b*, the one opposite of the stopper 236, or the opposite side of the rotary shaft support member 235) such that the components mounted on the second rotary shaft 232 are not separated to one side (e.g., in the −x-axis direction). The third fixing clip 291_3 may serve to prevent and/or reduce the first fastening part 251 inserted through the first arm part 221 and the first rotary member 211 from being separated from the first arm part 221 or the first rotary member 211 while the first arm part 221 slides along a side surface of the first rotary member 211. The fourth fixing clip 291_4 may serve to prevent and/or reduce the second fastening part 252 inserted through the second arm part 222 and the second rotary member 212 from being separated from the second arm part 222 or the second rotary member 212 while the second arm part 222 slides along a side surface of the second rotary member 212.

According to various embodiments, the plurality of elastic bodies 242*a*, 242*b*, 242*c*, and 242*d* may include, for example, the first elastic body 242*a* disposed between the one side of the shaft bracket 243*b* and the first cam 241*a*_1*a* of the first moving cam member 241*a*, the second elastic body 242*b* disposed between the opposite side of the shaft bracket 243*b* and the second cam 241*a*_1*b* of the first moving cam member 241*a*, the third elastic body 242*c* disposed between the one side of the center bracket 243*a* and the third cam 241*b*_1*a* of the second moving cam member 241*b*, and the fourth elastic body 242*d* disposed between the opposite side of the center bracket 243*a* and the fourth cam 241*b*_1*b* of the second moving cam member 241*b*. The plurality of elastic bodies 242*a*, 242*b*, 242*c*, and 242*d* may provide elastic forces required for cam motions of the first moving cam member 241*a* and the second moving cam member 241*b*. According to an embodiment, to provide the same hinge force (or, the same feeling of detent) during a rotary motion of the electronic device 100, the first elastic body 242*a* and the second elastic body 242*b* (or, the third elastic body 242*c* and the fourth elastic body 242*d*) may have the same characteristics. For example, the plurality of elastic bodies 242*a*, 242*b*, 242*c*, and 242*d* may have spring structures having the same or similar lengths, thicknesses, and diameters. According to various embodiments, the plurality of elastic bodies 242*a*, 242*b*, 242*c*, and 242*d* may have different lengths, thicknesses, and diameters. For example, the first elastic body 242*a* and the second elastic body 242*b* may have a first length, a first thickness, and a first diameter, and the third elastic body 242*c* and the fourth elastic body 242*d* may have a second length different from the first length, a second thickness different from the first thickness, and a second diameter different from the first diameter.

As described above, the hinge structures 200*a* and 200*b* according the embodiment may include the rotary members 211 and 212 coupled with the hinge housing 150 and the housings 110 and 120 and involved in folding and unfolding motions of the display 160 located over the rotary members 211 and 212, the multi-detent structure 240 connected to the rotary members 211 and 212, and the gear structure (e.g., the shaft gear of the first rotary shaft 231, the shaft gear of the second rotary shaft 232, and the idle gears 233 and 234) that supports simultaneous rotary motions of the first housing 110 and the second housing 120.

Based on these components, the hinge structures 200*a* and 200*b* may rotate about the virtual axes (e.g., the first axis 13 and the fourth axis 14) formed above surfaces of the rotary members 211 and 212 to implement folding and unfolding of the display 160. Based on the plurality of cam structures, the hinge structures 200*a* and 200*b* may provide an improved feeling of detent, and based on the gear structure (e.g., the shaft gear of the first rotary shaft 231, the shaft gear of the second rotary shaft 232, and the idle gears 233 and 234), the hinge structures 200*a* and 200*b* may support simultaneous hinge motions of the housings 110 and 120 to suppress torsion of the housings 110 and 120 in the hinge motions. Furthermore, the hinge structure 200*a* and 200*b* may support not only a flat state or a folded state of the housings 110 and 120 but also a temporarily fixed state including a partially folded state in which the front surface of the first housing 110 and the front surface of the second housing 120 have a predetermined included angle therebetween, for example, an angle of 30 degrees to 60 degrees.

In a hinge structure according to an embodiment, to increase a detent load (or, to increase a force maintaining a mounting angle of housings or to increase a frictional force between components), an elastic force acting in a cam motion has to be increased. In this regard, the free length of a spring (e.g., an elastic body) has to be extended, the number of turns of the spring has to be decreased, or the wire diameter of the spring has to be increased. However, the extension of the free length and the decrease in the number of turns may be less effective in increasing the load, and to increase the load above a predetermined value, the allowable stress limit of the spring may be exceeded, which may lead to damage to the spring. Meanwhile, to increase the spring load, the inner diameter of the spring may be decreased, or the outer diameter of the spring may be increased. In the case of decreasing the inner diameter, the diameters of the rotary shafts 231 and 232 have to be decreased, and therefore deterioration in the concentricity of the rotary shafts 231 and 232 and a deflection phenomenon in the manufacturing process may occur. Furthermore, in the case of increasing the outer diameter, interference of surrounding parts related to the spring may occur, or there may be a condition in which an additional space for excluding the part interference is required (e.g., an increase in the thickness of the hinge structure and an increase in the thickness of the electronic device 100). In addition, in the case of a limited increase in the elastic force of the spring, the load may be concentrated on a cam part, which may worsen wear. In this regard, the hinge structures 200a and 200b of the electronic device 100 according to various embodiments may reduce an increase in space (e.g., may reduce or prevent and/or reduce an increase in the thickness of the hinge structure) and may improve wear performance (e.g., the loss load is decreased with an increase in the number of cam structures and cams, for example, four cam structures provide ¼ loss load) while increasing the maximum load and the ordinary load acting in a cam motion by the plurality of elastic bodies 242a, 242b, 242c, and 242d in the state in which the plurality of moving cam members 241a and 241b and the arm parts 221 and 222 are fastened. According to various embodiments, the first elastic body 242a and the third elastic body 242c may have the same length, and the second elastic body 242b and the fourth elastic body 242d may have the same length. According to various embodiments, in the state in which the first elastic body 242a and the third elastic body 242c have different lengths and the second elastic body 242b and the fourth elastic body 242d have different lengths, the sum of the lengths of the first elastic body 242a and the third elastic body 242c may be equal to the sum of the lengths of the second elastic body 242b and the fourth elastic body 242d.

Figure 5:
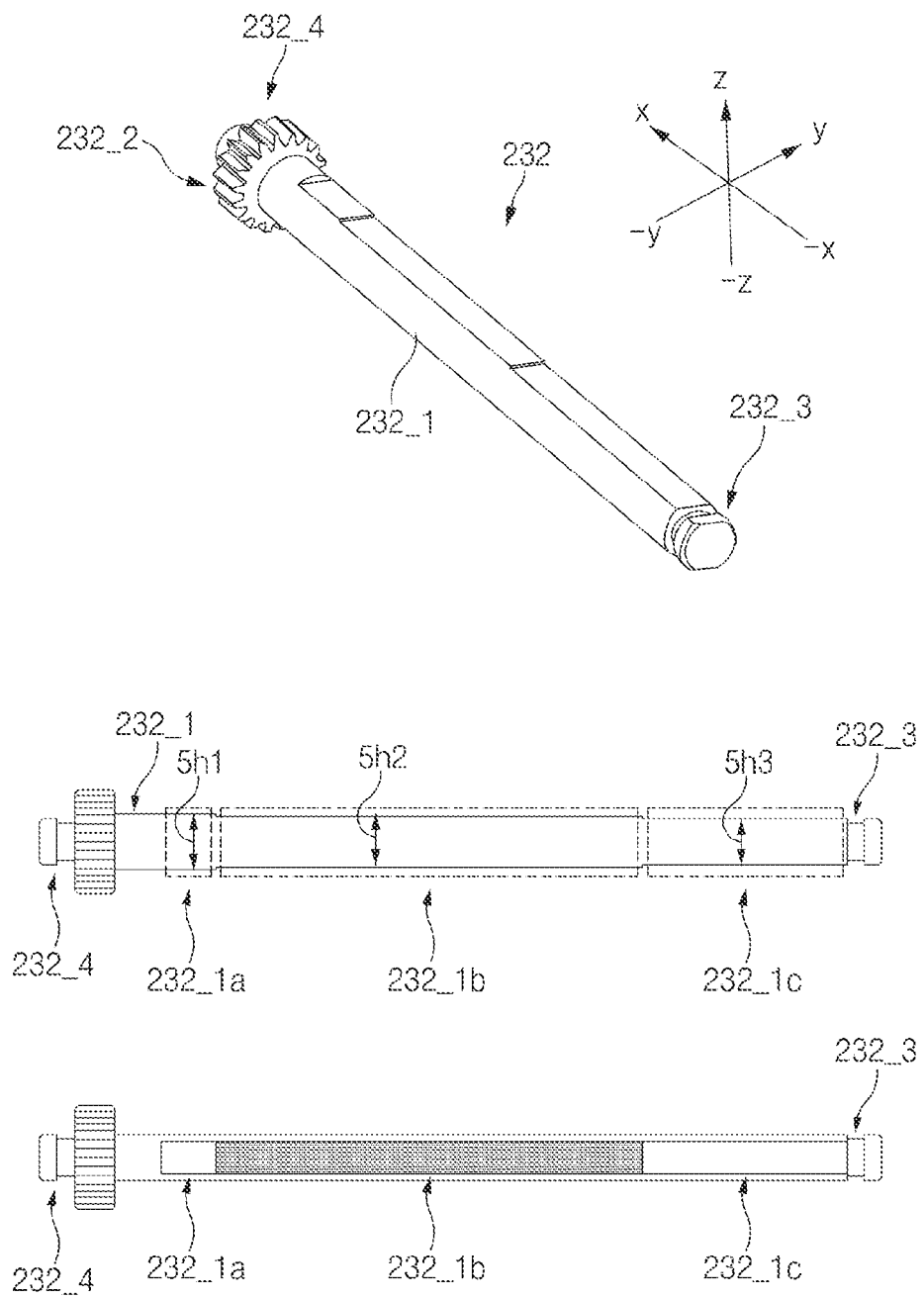
FIG. 5 is a perspective view and diagram illustrating an example second rotary shaft according to various embodiments.

FIG. 5 is a diagram including a perspective view illustrating an example of the second rotary shaft according to various embodiments. The second rotary shaft illustrated in FIG. 5 may have the same shape and material as the first rotary shaft. According to various embodiments, the structure of the rotary shaft to be described with reference to FIG. 5 may be applied to one of the rotary shafts included in the hinge structure, or may be applied to both the rotary shafts.

Referring to FIGS. 3 and 5, according to an embodiment, the second rotary shaft 232 may include a pillar portion 232_1, the shaft gear 232_2 (e.g., the second shaft gear 232_2 of FIG. 3 or the main gear), a ring mounting groove 232_3, and a mounting portion 232_4. The second rotary shaft 232 may rotate about the second axis 12 in a predetermined angle range (e.g., the angle range of 0 degrees to 100 degrees or the angle range of 0 degrees to −100 degrees) depending on rotation of the second arm part 222.

According to various embodiments, one end of the pillar portion 232_1 (e.g., the end facing the x-axis direction or the portion where the mounting portion 232_4 is disposed) may be fastened to one side of the fixed bracket 213, and an opposite end of the pillar portion 232_1 (e.g., the end facing the −x-axis direction or the ring mounting groove 232_3) may be fastened with the fixing clip 292_1. The pillar portion 232_1 may have a rod shape longer in the y-axis direction than in the x-axis direction. At least a portion of the z-axis cross-section (e.g., the cross-section cut in the direction from the z-axis to the −z-axis) of the pillar portion 232_1 may include a curve, and the remaining portion may include a straight line. For example, the pillar portion 232_1 may be formed such that at least a portion of one surface in the z-axis direction and at least a portion of one surface in the −z-axis direction have a straight shape and at least a portion of one surface in the y-axis direction and at least a portion of one surface in the −y-axis direction have a curved shape. Accordingly, at least part of an upper portion of the pillar portion 232_1 in the z-axis direction or the −z-axis direction may form a flat surface, and at least a portion of a side surface of the pillar portion 232_1 in the y-axis direction or the −y-axis direction may form a curved surface. The total length of the pillar portion 232_1 may vary depending on components mounted on the second rotary shaft 232. For example, at least one of the one side of the rotary shaft support member 235, the one side of the stopper 236, a first fastening hole 222_4a1 (or a first hole) of the third arm cam structure 222_4a, a second fastening hole 222_4b1 (or a second hole) of the fourth arm cam structure 222_4b, the second cam 241a_1b, the fourth cam 241b_1b, the second elastic body 242b, the fourth elastic body 242d, the one side of the center bracket 243a, the one side of the shaft bracket 243b, the support rings 292_1 and 292_2, or the fixing clip may be coupled to the pillar portion 232_1.

According to various embodiments, the pillar portion 232_1 may be press-fit into the third arm cam structure 222_4a and the fourth arm cam structure 222_4b. In this regard, the pillar portion 231_1 may include a first portion 232_1a having a first thickness 5h1, a second portion 232_1b having a second thickness 5h2 smaller than the first thickness 5h1, and a third portion 232_1c having a third thickness smaller than the second thickness 5h2. At least part of the first portion 232_1a may be inserted into the hole formed in the fourth arm cam structure 222_4b, and in the process of being inserted into the fourth arm cam structure 222_4b, at least part of the first portion 232_1a and at least part of the fourth arm cam structure 222_4b may have a press-fit state. At least part of the second portion 232_1b may be inserted into the hole formed in the third arm cam structure 222_4a, and in the process of being inserted into the third arm cam structure 222_4a, at least part of the second portion 232_1b and at least part of the third arm cam structure 222_4a may have a press-fit state. An elastic member may be mounted on the third portion 232_1c having the third thickness 5h3. The third portion 232_1c having the third thickness 5h3 may be disposed through the third arm cam structure 222_4a and the fourth arm cam structure 222_4b, the second portion 232_1b having the second thickness 5h2 may be fastened with the third arm cam structure 222_4a in a press-fit state while passing through the fourth arm cam structure 222_4b, and the first portion 232_1a having the first thickness 5h1 may be fastened with at least part of the fourth arm cam structure 222_4b in a press-fit state. According to various embodiments, the thickness between the shaft gear 232_2 and the first portion 232_1a may be greater than or equal to the first thickness 5h1 of the first portion 232_1a.

According to various embodiments, the shaft gear 232_2 may be disposed to be biased toward the end of the pillar portion 232_1 that faces the x-axis direction. The shaft gear 232_2 may have a cross-section larger than the z-axis cross-section (e.g., the cross-section cut in the direction from the z-axis to the −z-axis) of the pillar portion 232_1 and may include gears formed on the outer circumferential surface thereof. The shaft gear 232_2 may be disposed to be engaged with, for example, the idle gear 234. The shaft gear 232_2 may be disposed between the end of the pillar portion 232_1 that faces the x-axis direction and the plate mounting groove 232_4.

According to various embodiments, the mounting portion 232_4 may be formed at one end (e.g., the end facing the x-axis direction) of the pillar portion 232_1. The mounting portion 232_4 may be mounted on one side of the fixed bracket 213. The mounting portion 232_4 may prevent and/or reduce the second rotary shaft 232 from moving left and right or up and down. A groove (e.g., a ring-shaped groove) may be provided between the mounting portion 232_4 and the shaft gear 232_2, and at least a portion of the rotary shaft support member may be inserted into the groove.

According to various embodiments, the ring mounting groove 232_3 may be disposed to be biased in the −x-axis direction with respect to the pillar portion 232_1. For example, the ring mounting groove 232_3 may be formed in a position spaced a predetermined distance apart from the end of the pillar portion 232_1 that faces the −x-axis direction and may have a lower height than the surrounding portions. The ring mounting groove 232_3 may be formed on the entire circumference of the pillar portion 232_1. Accordingly, the ring mounting groove 232_3 may be provided in an engraved strap shape on the pillar portion 232_1. For example, the fixing clip 292_2 may be inserted into the ring mounting groove 232_3.

Meanwhile, although the second rotary shaft 232 has been described in the above description, the first rotary shaft 231 may have the same or similar configuration and material as the second rotary shaft 232. For example, the first rotary shaft 231 may include a pillar portion, a shaft gear, a ring mounting groove, and a plate mounting groove and may rotate about the first axis 11, which is spaced a predetermined distance apart from the second axis 12, in the direction opposite to the direction of rotation of the second rotary shaft 232. According to various embodiments, likewise to the pillar portion 231_1 of the second rotary shaft 232, the pillar portion of the first rotary shaft 231 may include a first portion fastened with the second arm cam structure 221_4b such that at least a portion thereof has a press-fit state, a second portion fastened with the first arm cam structure 221_4a such that at least a portion thereof has a press-fit state, and a third portion disposed through the first arm cam structure 221_4a and the second arm cam structure 221_4b.

Furthermore, as each structure is assigned with the name based on the second rotary shaft 232 and the second arm part 222 in FIG. 5, it has been described that the first fastening hole 222_4a1 is formed in the third arm cam structure 222_4a and the second fastening hole 222_4b1 is formed in the fourth arm cam structure 222_4b. However, the disclosure is not limited thereto. For example, based on the first rotary shaft 231 and the first arm part 221, the first arm cam structure 221_4a and the second arm cam structure 221_4b may be disposed on the first arm part 221, the hole formed in the first arm cam structure 221_4a may be the first fastening hole, and the hole formed in the second arm cam structure 221_4b may be the second fastening hole. In this case, the hole formed in the third arm cam structure 222_4a of the second arm part 222 may be the third fastening hole (or the third hole), and the hole formed in the fourth arm cam structure 222_4b may be the fourth fastening hole (or the fourth hole).

According to various embodiments, when the hole formed in the third arm cam structure 222_4a is referred to as the first fastening hole and the hole formed in the fourth arm cam structure 222_4b is referred to as the second fastening hole, the hole formed in the first arm cam structure 221_4a may be referred to as the third fastening hole, and the hole formed in the second arm cam structure 221_4b may be referred to as the fourth fastening hole. The third fastening hole formed in the first arm cam structure 221_4a may have a third press-fit protrusion (or a third protrusion) disposed on the inside surface thereof, identically or similarly to the first fastening hole formed in the third arm cam structure 222_4a, and the fourth fastening hole formed in the second arm cam structure 221_4b may have a fourth press-fit protrusion (or a fourth protrusion) disposed on the inside surface thereof, identically or similarly to the second fastening hole formed in the fourth arm cam structure 222_4b. When one edge of the first rotary shaft (e.g., the edge facing away from the shaft gear) is inserted into the third fastening hole through the fourth fastening hole, the thickness of the one edge of the first rotary shaft may be smaller than the thickness of the opposite edge of the first rotary shaft (e.g., the edge adjacent to the shaft gear). The height of the third press-fit protrusion from the bottom surface may be greater than the height of the fourth press-fit protrusion from the bottom surface such that the first rotary shaft is press-fit into the first arm part at a plurality of positions while the first rotary shaft is fastened to the first arm part. Alternatively, the height of the fourth press-fit protrusion from the bottom surface may be smaller than the height of the third press-fit protrusion from the bottom surface. According to various embodiments, the z-axis cross-sectional area (or, the size of the empty space) of the third fastening hole may be smaller than the z-axis cross-sectional area (or, the size of the empty space) of the fourth fastening hole.

Figure 6:
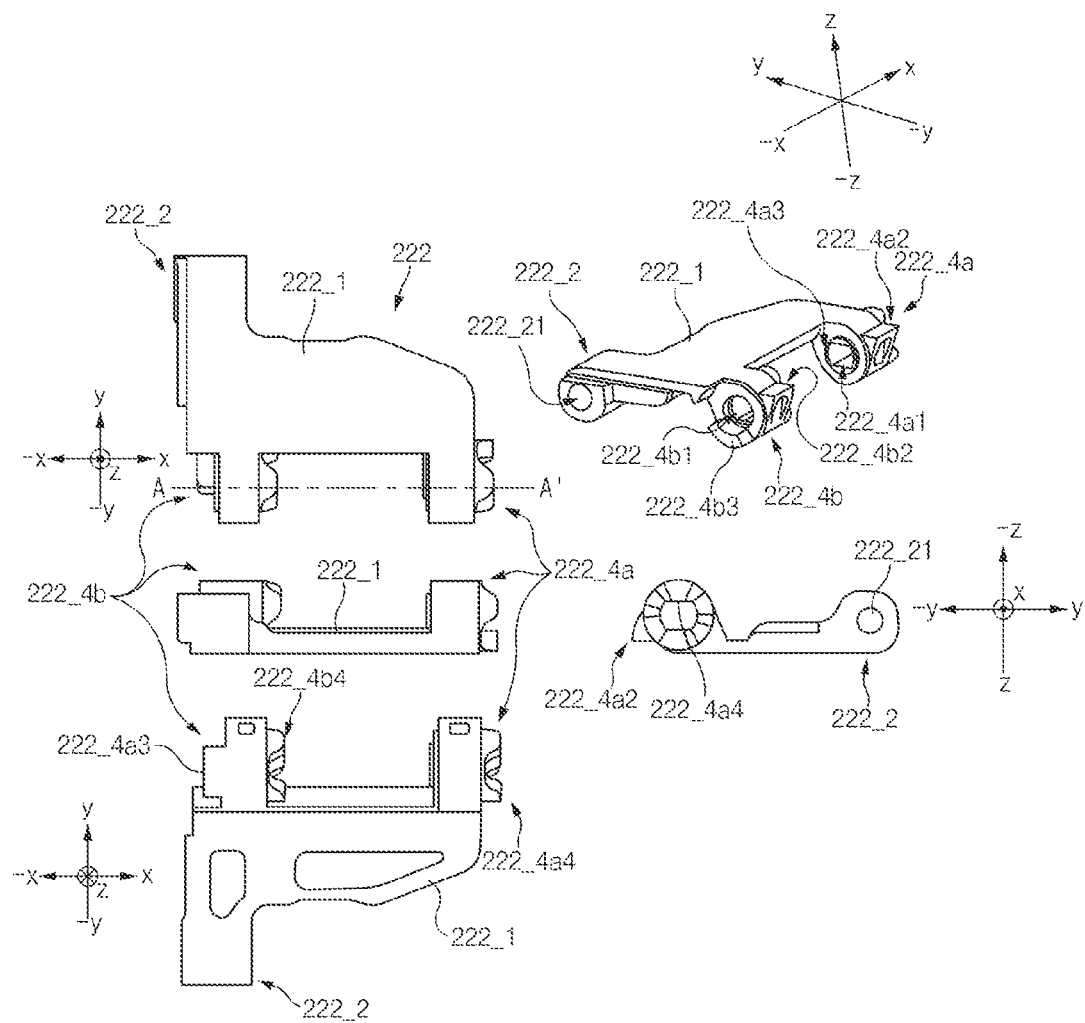
FIG. 6 is a perspective view and diagram illustrating an example arm part according to various embodiments.
Figure 7:
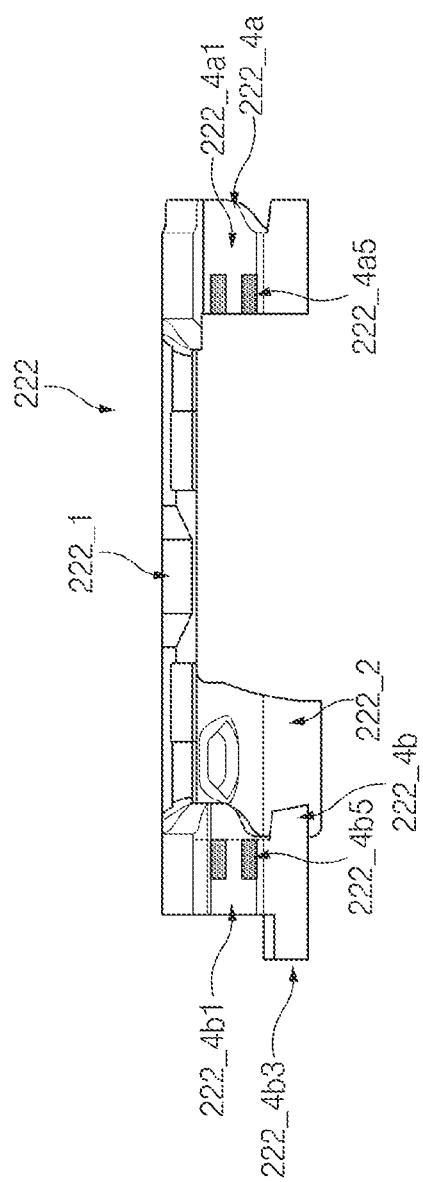
FIG. 7 is a cross-sectional view illustrating taken along line A-A' on one side of the arm part according to various embodiments.

FIG. 6 includes various views illustrating an example of an arm part according to various embodiments, and FIG. 7 is a cross-sectional view illustrating taken along line A-A' on one side of the arm part according to various embodiments.

Prior to description, FIGS. 6 and 7 are views illustrating the second arm part based on FIG. 3. The second arm part 222 may have a shape similar to the shape of the first arm part 221 (e.g., a shape symmetrical to the shape of the first arm part 221 with respect to the x-axis). The second arm part 222 may have the same size as the first arm part 221 and may be formed of the same material as the first arm part 221. The following description will be given based on the second arm part of FIG. 3.

Referring to FIGS. 3, 6, and 7, the second arm part 222 according to an embodiment may be fastened with the second rotary member 212 through the second fastening part (e.g., the second fastening part 252 of FIG. 3) and may rotate in conjunction with the second rotary member 212 when a hinge motion is performed. According to an embodiment, the second arm part 222 may include a basic body 222_1, a connecting portion 222_2, the third arm cam structure 222_4a, and the fourth arm cam structure 222_4b.

According to various embodiments, at least a portion of the upper surface (e.g., the surface facing the z-axis direction) of the basic body 222_1 may be formed to be flat. The connecting portion 222_2 may be disposed on at least a portion of the lower surface (e.g., the surface facing the −z-axis direction) of the upper edge portion (e.g., the end portion facing the y-axis direction) of the basic body 221_1. The connecting portion 222_2 may be formed in a ring or pipe shape having a predetermined thickness. For example, the connecting portion 222_2 may include a hole 222_21 that is open in the third direction (e.g., the x-axis direction) (or, the −x-axis direction). At least a portion of the second fastening part 252 may be disposed in the hole 222_21 of the connecting portion 222_2. In this regard, the hole 222_21 of the connecting portion 222_2 may have a size similar to the diameter of the second fastening part 252. The third arm cam structure 222_4a and the fourth arm cam structure 222_4b may be disposed on the lower surface (e.g., the surface facing the −z-axis direction) of the lower edge portion (e.g., the end portion facing the −y-axis direction) of the basic body 221_1. The third arm cam structure 222_4a and the fourth arm cam structure 222_4b may be disposed at the edge of the basic body 222_1 that faces the −y-axis direction, and the connecting portion 222_2 may be disposed at the edge of the basic body 222_1 that faces the y-axis direction.

According to various embodiments, the third arm cam structure 222_4a may include the first fastening hole 222_4a1 facing the direction from the x-axis to the −x-axis and having a uniform diameter, a first mounting portion 222_4a2 supporting the center bar 243c, a step 222_4a3 at least partially engaged with the center bracket 243a, and a first cam protrusion 222_4a4 for a cam motion.

According to various embodiments, at least a portion of the second rotary shaft 232 may be inserted into the first fastening hole 222_4a1. The first fastening hole 222_4a1 may be formed in a shape that is the same as, or similar to, the shape of the cross-section of one side of the second rotary shaft 232 (e.g., the cross-section cut in the direction from the z-axis to the −z-axis). For example, at least a partial cross-section of the first fastening hole 222_4a1 (e.g., the cross-section of the first fastening hole 222_4a1 when the third arm cam structure 222_4a is cut in the direction from the z-axis to the −z-axis) may include a straight line. The first fastening hole 222_4a1 may be disposed on the same axis (e.g., the second axis 12) as the second fastening hole 222_4b1 of the fourth arm cam structure 222_4b. According to various embodiments, at least one first press-fit protrusion 222_4a5 (or at least one first protrusion) may be disposed on the inner wall of the first fastening hole 222_4a1. For example, the first press-fit protrusion 222_4a5 may protrude from at least a portion of the inner wall of the first fastening hole 222_4a1 in the direction toward the center of the first fastening hole 222_4a1 (or, the direction perpendicular to the inner wall of the first fastening hole 222_4a1 or the direction protruding from the bottom surface of the inner wall of the first fastening hole 222_4a1). For example, the first press-fit protrusion 222_4a5 may be provided in a form that is long in the lengthwise direction of the first fastening hole 222_4a1 (e.g., the x-axis direction or the −x-axis direction) (e.g., in a form that is longer in the x-axis direction than in the other directions). The y-axis cross-section of the first press-fit protrusion 222_4a5 may have, for example, a semi-elliptical or semi-circular shape. After the insertion of the second rotary shaft 232, the first press-fit protrusion 222_4a5 may be deformed while being pressed by a specific portion of the second rotary shaft 232. According to an embodiment, the first press-fit protrusion 222_4a5 may be disposed at the point where a flat area (or, an area where the z-axis cross-section is straight) and a curved area (or, an area where the z-axis cross-section is curved) of the inner wall of the first fastening hole 222_4a1 meet each other. The first press-fit protrusion 222_4a5 may be formed in a semi-cylindrical shape having the first length that extends from a start point to an end point of the first fastening hole 222_4a1, or may be formed in a semi-cylindrical shape having the second length (e.g., shorter than the first length) that extends from a point on the inner wall of the first fastening hole 222_4a1 to the end point. According to various embodiments, based on the x-axis direction or the −x-axis direction, the first press-fit protrusion 222_4a5 may be formed in a semi-cylindrical shape having the second length that extends from a central portion of the first fastening hole 222_4a1 to the end point facing the −x-axis direction, and a plurality of first press-fit protrusions 222_4a5 may be formed inside the first fastening hole 222_4a1 and may be spaced apart from each other.

According to various embodiments, the first mounting portion 222_4a2 may protrude, by a predetermined length in the −y-axis direction, from one side of the peripheral portion forming the first fastening hole 222_4a1. At least a portion of the z-axis cross-section of the first mounting portion 222_4a2 may include a triangle. According to various embodiments, the size of the z-axis cross-section of the first mounting portion 222_4a2 may be gradually decreased from the y-axis toward the −y-axis. The upper surface (e.g., the surface facing the z-axis direction) of the first mounting portion 222_4a2 may be located in a lower position based on the z-axis than the upper surface (e.g., the surface facing the z-axis direction) of the basic body 222_1. According to an embodiment, the first mounting portion 222_4a2 may be located between the upper side (e.g., a point in the z-axis direction) and the lower side (e.g., a point in the −z-axis direction) of the peripheral portion forming the first fastening hole 222_4a1 and may protrude in the −y-axis direction from a lateral portion (e.g., a point in the −y-axis direction) of the peripheral portion of the first fastening hole 222_4a1. The first mounting portion 222_4a2 may be integrated into the peripheral portion forming the first fastening hole 222_4a1. In this regard, the first mounting portion 222_4a2 may be formed of the same material as the peripheral portion of the first fastening hole 222_4a1 or the basic body 222_1.

According to various embodiments, the step 222_4a3 may be provided for ease of assembly with the center bracket 243a and may guide the center bracket 243a such that the center bracket 243a is not separated until the rotary shaft is assembled. The step 222_4a3 may protrude, by a predetermined height in the x-axis direction, from a side surface of the peripheral portion of the first fastening hole 222_4a1 that faces the x-axis direction. The step 222_4a3 may be disposed to surround the first fastening hole 222_4a1. In this regard, at least one of the outer circumferential surface or the inner circumferential surface of the step 222_4a3 may have a circular or elliptical shape. According to various embodiments, the inner circumferential surface of the step 222_4a3 may have a shape (e.g., at least a portion of the z-axis cross-section includes a straight line) that corresponds to the shape of the first fastening hole 222_4a1. At least a portion of the step 222_4a3 may be disposed in an annular ring provided on the center bracket 243a.

According to various embodiments, the first cam protrusion 222_4a4 may protrude, by a predetermined height in the −x-axis direction, from a side surface of the peripheral portion of the first fastening hole 222_4a1 that faces the −x-axis direction and may be formed such that the protrusion heights are different for respective positions. For example, the z-axis cross-section (e.g., the cross-section cut in the direction from the z-axis to the −z-axis) of the first cam protrusion 222_4a4 may have a circular shape or a shape (e.g., at least a portion includes a D-cut shape) in which at least a portion includes a straight line and the remaining portion includes a curve. The first cam protrusion 222_4a4 may have a bumpy structure in the −x-axis direction. At least a portion of the first cam protrusion 222_4a4 having the bumpy structure in the −x-axis direction may include a curved section. The ridges of the bumpy structure may have the same height in the −x-axis direction, and the valleys of the bumpy structure may have the same depth in the x-axis direction. The central portions of the ridges and valleys of the bump structure may include a flat area having a predetermined length.

According to various embodiments, the fourth arm cam structure 222_4b may include the second fastening hole 222_4b1 facing the direction from the x-axis to the −x-axis and having a uniform diameter, a second mounting portion 222_4b2 supporting the center bar 243c, a protrusion 222_4b3 at least partially engaged with the stopper 236, and a second cam protrusion 222_4b4 for a cam motion. The fourth arm cam structure 222_4b may be disposed on one side of the basic body 222_1 and may be spaced apart from the third arm cam structure 222_4a by a predetermined gap. The separation distance between the third arm cam structure 222_4a and the fourth arm cam structure 222_4b may vary depending on the size or shape of at least one of the elastic bodies, the cam member, or the center bracket 243a disposed between the third arm cam structure 222_4a and the fourth arm cam structure 222_4b.

According to various embodiments, at least a portion of the second rotary shaft 232 may be inserted into the second fastening hole 222_4b1. The second fastening hole 222_4b1 may be formed in a shape that is the same as, or similar to, the shape of the cross-section of one side of the second rotary shaft 232 (e.g., the cross-section cut in the direction from the z-axis to the −z-axis). Accordingly, at least a partial cross-section (e.g., the cross-section cut in the direction from the z-axis to the −z-axis) of the second fastening hole 222_4b1 may have the same shape as the first fastening hole 222_4a1. The second fastening hole 222_4b1 may be disposed on the same axis (e.g., the second axis 12) as the first fastening hole 222_4a1 of the fourth arm cam structure 242_4b. According to various embodiments, similarly to the first press-fit protrusion 222_4a5 formed on the inner wall of the first fastening hole 222_4a1, at least one second press-fit protrusion 222_4b5 (or at least one second protrusion) may be disposed on the inner wall of the second fastening hole 222_4b1. For example, the second press-fit protrusion 222_4b5 may protrude from at least a portion of the inner wall of the second fastening hole 222_4b1 in the direction toward the center of the second fastening hole 222_4b1 (or, the direction perpendicular to the inner wall of the second fastening hole 222_4b1 or the direction protruding from the bottom surface of the inner wall of the second fastening hole 222_4b1). For example, similarly to the first press-fit protrusion 222_4a5, the second press-fit protrusion 222_4b5 may be provided in a form that is long in the lengthwise direction of the second fastening hole 222_4b1 (e.g., the x-axis direction or the −x-axis direction) (e.g., in a form that is longer in the x-axis direction than in the other directions). The y-axis cross-section of the second press-fit protrusion 222_4b5 may have, for example, a semi-elliptical or semi-circular shape, and the second press-fit protrusion 222_4b5 may be formed in a semi-cylindrical shape having a predetermined length in the x-axis direction. After the insertion of the second rotary shaft 232, the second press-fit protrusion 222_4b5 may be deformed while being pressed by a specific portion of the second rotary shaft 232. According to an embodiment, the second press-fit protrusion 222_4b5 may be disposed at the point where a flat area (or, an area where the z-axis cross-section is straight) and a curved area (or, an area where the z-axis cross-section is curved) of the inner wall of the second fastening hole 222_4b1 meet each other. The second press-fit protrusion 222_4b5 may be formed in a semi-cylindrical shape having a third length that extends from a start point to an end point of the second fastening hole 222_4b1. Based on the x-axis direction or the −x-axis direction, the second press-fit protrusion 222_4b5 may be formed in a semi-cylindrical shape having the second length (e.g., shorter than the first length) that extends from a central portion of the second fastening hole 222_4b1 to the end point facing the −x-axis direction, and a plurality of second press-fit protrusions 222_4b5 may be formed inside the second fastening hole 222_4b1 and may be spaced apart from each other. The length of the second press-fit protrusion 222_4b5 may be the same as, or different from, the length of the first press-fit protrusion 222_4a5. Meanwhile, although it has been illustrated by way of non-limiting example that the first press-fit protrusion 222_4a5 and the second press-fit protrusion 222_4b5 are formed in a semi-cylindrical shape having a relatively long length in the x-axis direction, the disclosure is not limited thereto. For example, the first press-fit protrusion 222_4a5 and the second press-fit protrusion 222_4b5 may protrude from the bottom surfaces of the inner walls of the first fastening hole 222_4a1 and the second fastening hole 222_4b1 and may be formed in the shape of part of a sphere or polyhedron or in a concave-convex shape. Alternatively, at least one of the first press-fit protrusion 222_4a5 or the second press-fit protrusion 222_4b5 may include a plurality of protrusions protruding from the bottom surface of a hole in a predetermined pattern (e.g., a zigzag pattern). Although the first press-fit protrusion 222_4a5 is illustrated as being formed in the position spaced apart from the cam protrusion of the third arm cam structure 222_4a and the second press-fit protrusion 222_4b5 is illustrated as being formed in the position close to the cam protrusion of the fourth arm cam structure 222_4b, the disclosure is not limited thereto. For example, the first press-fit protrusion 222_4a5 may be formed in a position close to the cam protrusion of the third arm cam structure 222_4a, and the second press-fit protrusion 222_4b5 may be formed in a position spaced apart from the cam protrusion of the fourth arm cam structure 222_4b.

According to various embodiments, the second mounting portion 222_4b2 may be provided in a shape that is the same as, or similar to, the shape of the first mounting portion 222_4a2. For example, the second mounting portion 222_4b2 may be formed between the upper side (e.g., a point in the z-axis direction) and the lower side (e.g., a point in the −z-axis direction) of the peripheral portion of the second fastening hole 222_4b1 and may be disposed to protrude in the −y-axis direction. According to an embodiment, similarly to the first mounting portion 222_4a2, the second mounting portion 222_4b2 may have a shape, the width of which is gradually decreased in the direction from the z-axis to the −z-axis.

According to various embodiments, the protrusion 222_4b3 may protrude, by a predetermined length in the −x-axis direction, from the surface of the peripheral portion of the second fastening hole 222_4b1 that faces the −x-axis direction and may have a predetermined thickness. According to an embodiment, the protrusion 222_4b3 may have a protrusion height corresponding to the shape of one side of the stopper 236. The protrusion 222_4b3 may have the same thickness as the peripheral portion of the second fastening hole 222_4b1 and may have an area smaller than the entire area of the peripheral portion. The protrusion 222_4b3 may define a limit angle through which the second arm part 222 rotates in a specified angle range (e.g., a range of 0 degrees to 100 degrees or a range of 0 degrees to −100 degrees).

According to various embodiments, the second cam protrusion 222_4b4 may have a shape that is the same as, or similar to, the shape of the first cam protrusion 222_4a4. According to an embodiment, the second cam protrusion 222_4*b*4 may include a bumpy structure protruding in the x-axis direction from the surface of the peripheral portion of the second fastening hole 222_4*b*1 that faces the x-axis direction. The second cam protrusion 222_4*b*4 may include one or more ridges and valleys. The central portions of the ridges or valleys of the second cam protrusion 222)4*b*4 may be formed to be flat. The sizes of predetermined areas of the central portions of the ridges or valleys of the second cam protrusion 222_4*b*4 (e.g., the sizes of the flat areas) may be the same as or similar to the sizes of predetermined areas of the central portions of the ridges or valleys of the first cam protrusion 222_4*a*4. According to various embodiments, to make a hinge force (or, a feeling of detent) softer, the sizes of the predetermined areas of the central portions of the ridges or valleys of the second cam protrusion 222_4*b*4 (e.g., the sizes of the flat areas) may be different from the sizes of the predetermined areas of the central portions of the ridges or valleys of the first cam protrusion 222_4*a*4.

According to various embodiments, the protrusions (or, the bumpy structures or the ridges and valleys) of the third arm cam structure 222_4*a* and the fourth arm cam structure 222_4*b* may face a different direction (e.g., the −x-axis direction). The directions of the protrusions of the third arm cam structure 222_4*a* and the fourth arm cam structure 222_4*b* may differ from each other. For example, the protrusion of the third arm cam structure 222_4*a* may face the −x-axis direction, and the protrusion of the fourth arm cam structure 222_4*b* may face the x-axis direction. Depending on the arrangement direction of the arm cam structures 222_4*a* and 222_4*b*, the cams 241*a*_1*b* and 241*b*_1*b* may be disposed to be engaged with the cam structures 222_4*a* and 222_4*b*.

According to various embodiments, the second arm part 222 having the above-described structure may rotate about the second rotary shaft 232. In the state in which one side (e.g., the second cam 241*a*_1*b*) of the first cam member 241*a* is engaged with the third arm cam structure 222_4*a* and one side (e.g., the fourth cam 241*b*_1*b*) of the second cam member 241*b* is engaged with the fourth arm cam structure 222_4*b*, the second elastic body 242*b* may provide an elastic force to the second cam 241*a*_1*b* and the third arm cam structure 222_4*a*, and the fourth elastic body 242*d* may provide an elastic force to the fourth cam 241*b*_1*b* and the fourth arm cam structure 222_4*b*. The third arm cam structure 222_4*a* and the fourth arm cam structure 222_4*b* may perform a cam motion simultaneously or in multiple stages. According to an embodiment, in the electronic device 100, the cam structure required for the cam motion may be divided into the third arm cam structure 222_4*a* and the fourth arm cam structure 222_4*b*, and thus the sizes of the elastic bodies (e.g., the diameters of the elastic bodies) or the thicknesses of the elastic bodies (e.g., the widths of the wires forming the elastic bodies) may not be increased. Accordingly, high elastic forces may be provided even without an increase in the thickness of the electronic device 100. In addition, the electronic device 100 may provide an improved (or, larger) hinge force (or, a feeling of detent or pressure) through the high elastic forces, and thus a folded or flat state of the electronic device 100 may be stably provided even though a display having increased tension, stiffness, or reaction force (e.g., a display having increased thickness) is used. The electronic device 100 may more stably provide various mounting angles using the arm parts including the plurality of cam structures.

Meanwhile, based on the first axis 11 or the second axis 12, the second arm part 222 including the third arm cam structure 222_4*a* and the fourth arm cam structure 222_4*b* described above may have a configuration and a shape that are the same as, or similar to, the configuration and the shape of the first arm part 211 including the first arm cam structure 221_4*a* and the second arm cam structure 221_4*b*. For example, the third press-fit protrusion and the fourth press-fit protrusion may be disposed in the first arm cam structure 221_4*a* and the second arm cam structure 221_4*b* included in the first arm part 221, and in the process in which the first rotary shaft 231 is inserted, the third press-fit protrusion and the fourth press-fit protrusion may be brought into contact with the first rotary shaft 231 and may press-fit and fix the first rotary shaft 231. As the first rotary shaft 231 and the second rotary shaft 232 are press-fit into the arm cam structures 221_4*a*, 221_4*b*, 222_4*a*, and 222_4*b* of the first and second arm parts 221 and 222 having the above-described structure, the spaces between the rotary shafts 231 and 232 and the sidewalls (or, the bottom surfaces) of the holes in the arm cam structures 221_4*a*, 221_4*b*, 222_4*a*, and 222_4*b* may be removed, and thus collision of the rotary shafts 231 and 232 with the sidewalls of the holes in the arm cam structures 221_4*a*, 221_4*b*, 222_4*a*, and 222_4*b* in a folding or unfolding motion of the foldable electronic device 100 may be prevented and/or reduced. The arm cam structures 221_4*a*, 221_4*b*, 222_4*a*, and 222_4*b* including the above-described press-fit protrusions may suppress the occurrence of noise in the folding or unfolding motion of the foldable electronic device 100.

Figure 8:
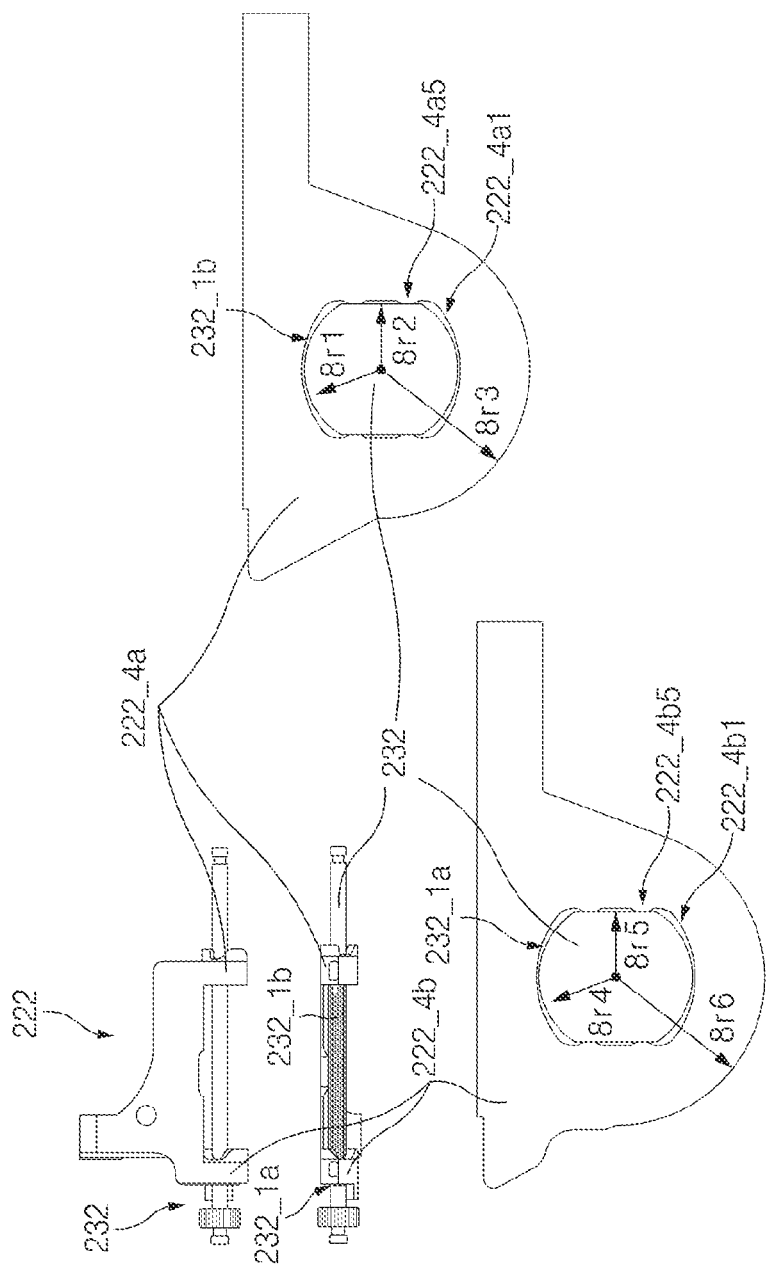
FIG. 8 is a diagram including cross-sectional views of cam structures in a coupled state of a second arm part and the second rotary shaft according to various embodiments.

FIG. 8 includes diagrams and cross-sectional views illustrating an example of the cam structures in a coupled state of the second arm part and the second rotary shaft according to various embodiments.

Referring to FIG. 8, as illustrated, the hinge structure applied to the foldable electronic device may include, for example, at least the second arm part 222 and the second rotary shaft 232. The second rotary shaft 232 may be fastened with the third arm cam structure 222_4*a* and the fourth arm cam structure 222_4*b*. When the second rotary shaft 232 is inserted into the first fastening hole 222_4*a*1 of the third arm cam structure 222_4*a* and the second fastening hole 222_4*b*1, one or more first press-fit protrusions 222_4*a*5 and one or more second press-fit protrusions 222_4*b*5 may have a press-fit state with the second rotary shaft 232. According to an embodiment, the first press-fit protrusions 222_4*a*5 may be pressed against one side of the second portion 232_1*b* of the second rotary shaft 232. In the second portion 232_1*b* of the second rotary shaft 232, the shortest distance from the center point of the shaft to the curved surface may be a first distance 8*r*1, the shortest distance from the center point of the shaft to the flat surface may be a second distance 8*r*2, and the distance from the center point of the shaft to the outer surface of the third arm cam structure 222_4*a* may be a third distance 8*r*3. The first distance 8*r*1 may be greater than the second distance 8*r*2, and the third distance 8*r*3 may be greater than the first distance 8*r*1.

According to an embodiment, the second press-fit protrusions 222_4*b*5 may be pressed against one side of the first portion 232_1*a* of the second rotary shaft 232. In the first portion 232_1*a* of the second rotary shaft 232, the shortest distance from the center point of the shaft to the curved surface may be a fourth distance 8*r*4, the shortest distance from the center point of the shaft to the flat surface may be a fifth distance 8*r*5, and the distance from the center point of the shaft to the outer surface of the fourth arm cam structure 222_4*b* may be a sixth distance 8*r*6. The fourth distance 8*r*4 may be greater than the fifth distance 8*r*5, and the sixth distance 8*r*6 may be greater than the fourth distance 8*r*4.

According to various embodiments, the fourth distance 8r4 may be greater than the first distance 8r1, the fifth distance 8r5 may be greater than the second distance 8r2, and the sixth distance 8r6 may be greater than the third distance 8r3. Correspondingly, the size of the z-axis cross-section of the first fastening hole 222_4a1 may be smaller than the size of the z-axis cross-section of the second fastening hole 222_4b1.

Although the first press-fit protrusions 222_4a5 and the second press-fit protrusions 222_4b5 are illustrated as making contact with the flat surfaces of the second rotary shaft 232, the disclosure is not limited thereto. For example, at least some of the first press-fit protrusions 222_4a5 may be formed between the curved surfaces of the second rotary shaft 232 and the inner curved surfaces of the first fastening hole 222_4a1, and at least some of the second press-fit protrusions 222_4b5 may be formed between the curved surfaces of the second rotary shaft 232 and the inner curved surfaces of the second fastening hole 222_4b1.

According to various embodiments, the above-described coupled state of the second arm part and the second rotary shaft may have a coupled state that is the same as or similar to the coupled state of the first arm part and the first rotary shaft. For example, when the first rotary shaft 231 is inserted into the first arm cam structure 221_4a and the second arm cam structure 221_4b formed on the first arm part 221, the first rotary shaft 231 may include the first portion, the second portion, and the third portion having different thicknesses, similarly to the second rotary shaft 232. The third press-fit protrusions formed in the first arm cam structure 221_4a may be disposed to make contact with the second portion of the first rotary shaft 231, and the fourth press-fit protrusions formed in the second arm cam structure 221_4b may be disposed to make contact with the first portion of the first rotary shaft 231. The third press-fit protrusions and the fourth press-fit protrusions may have the same structure and size as the first press-fit protrusions 222_4a5 and the second press-fit protrusions 222_4b5 described with reference to FIG. 8.

Figure 9:
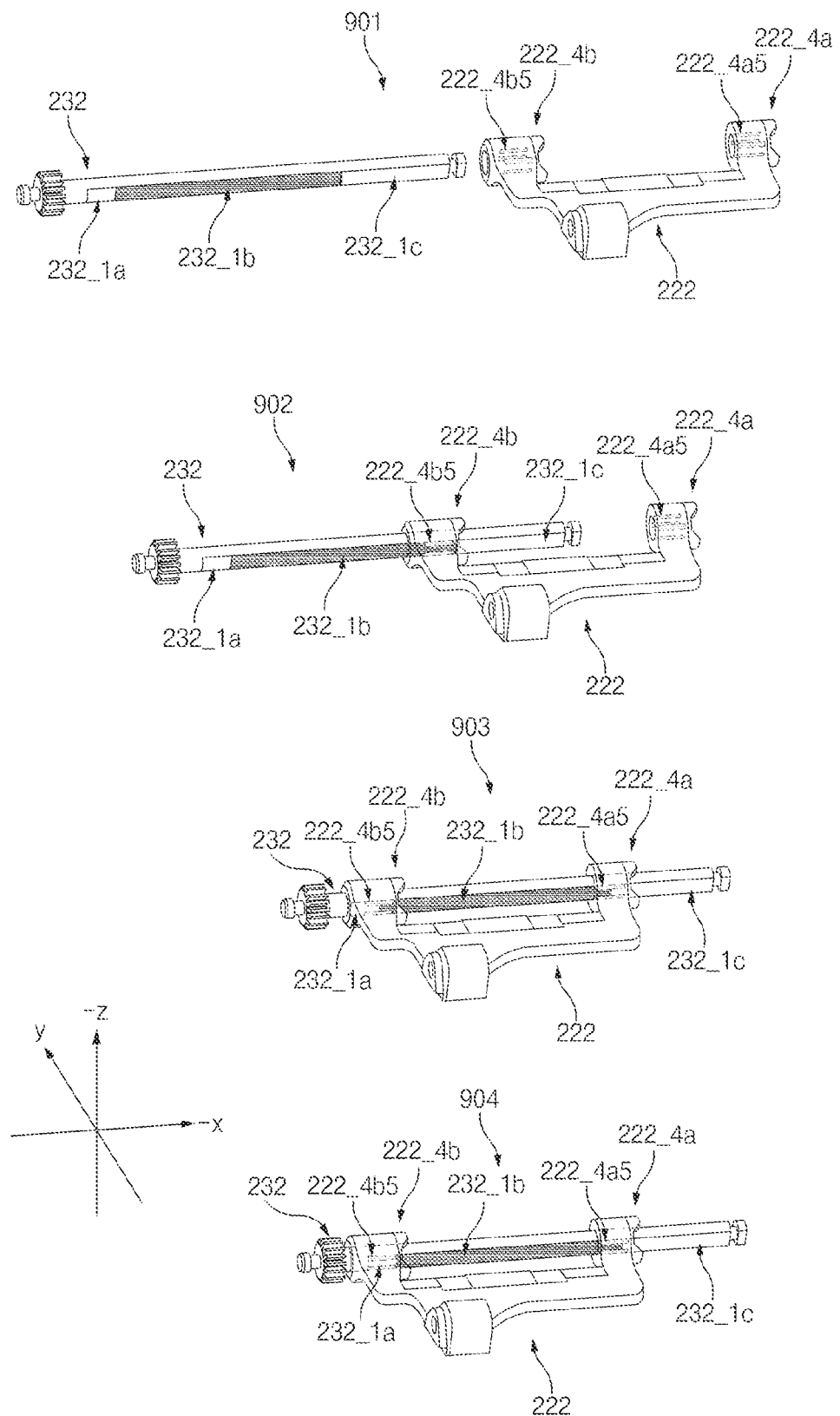
FIG. 9 is a perspective view illustrating an example of a coupling process of the second arm part and the second rotary shaft according to various embodiments.

FIG. 9 is a perspective view illustrating an example of a coupling process of the second arm part and the second rotary shaft according to various embodiments.

Referring to FIG. 9, at least part of the foldable electronic device may include the second rotary shaft 232 and the second arm part 222. As described above with reference to FIG. 5, the second rotary shaft 232 may have a structure in which flat surfaces are disposed to face each other in the z-axis direction and curved surfaces are disposed between the flat surfaces. The second rotary shaft 232 may be formed such that thicknesses are different for respective positions. For example, the thickness of the second rotary shaft 232 may be increased gradually or in a stepwise manner from one end toward the second shaft gear 232_2.

Referring to state 901, the ring mounting groove of the second rotary shaft 232 may be disposed close to the fourth arm cam structure 222_4b of the second arm part 222 at the time when the second rotary shaft 232 and the second arm part 222 are aligned with each other. Accordingly, the third portion 232_1c of the pillar portion of the second rotary shaft 232 may be disposed close to the fourth arm cam structure 222_4b, and the first portion 232_1a of the pillar portion of the second rotary shaft 232 may be disposed far away from the fourth arm cam structure 222_4b. Here, the third portion 232_1c of the second rotary shaft 232 may be first inserted into the fourth arm cam structure 222_4b (e.g., inserted into the second fastening holes 222_4b1 formed in the fourth arm cam structure 222_4b).

Referring to state 902, while the second rotary shaft 232 is fastened with the second arm part 222, the third portion 232_1c of the second rotary shaft 232 may be first inserted into the fourth arm cam structure 222_4b (e.g., inserted into the second fastening holes 222_4b1 formed in the fourth arm cam structure 222_4b), and while the third portion 232_1c is located between the third arm cam structure 222_4a and the fourth arm cam structure 222_4b, part of the second portion 232_1b of the second rotary shaft 232 (e.g., the edge of the second portion 232_1b in the −x-axis direction) may be located in the second fastening hole 222_4b1 of the fourth arm cam structure 222_4b. According to an embodiment, the size of the z-axis cross-section of the second rotary shaft 232 may be smaller than the size of the z-axis cross-section of the second fastening hole 222_4b1. The size of a virtual z-axis cross-section connecting ends of the second press-fit protrusion 222_4b5 located in the second fastening hole 222_4b1 (e.g., the uppermost ends of a press-fit protrusion protruding from the bottom surface of the second fastening hole 222_4b1) may be larger than the size of the z-axis cross-section of the second portion 232_1b of the second rotary shaft 232, or may be similar to the size of the z-axis cross-section of the second portion 232_1b to an extent that press-fit does not occur. Accordingly, even when the second press-fit protrusion 222_4b5 is disposed in the second fastening hole 222_4b1, the second press-fit protrusion 222_4b5 may remain in the original state without deformation. A gap may be formed between the second press-fit protrusion 222_4b5 and the second rotary shaft 232 (e.g., between the protruding upper end or the protruding end of the second press-fit protrusion 222_4b5 and at least a part of the flat surfaces and the curved surfaces of the second rotary shaft 232).

Referring to state 902, while the second rotary shaft 232 is fastened with the second arm part 222, the third portion 232_1c of the second rotary shaft 232 may be first inserted into the fourth arm cam structure 222_4b (e.g., inserted into the second fastening holes 222_4b1 formed in the fourth arm cam structure 222_4b), and while the third portion 232_1c is located between the third arm cam structure 222_4a and the fourth arm cam structure 222_4b, part of the second portion 232_1b of the second rotary shaft 232 (e.g., the edge of the second portion 232_1b in the −x-axis direction) may be located in the second fastening hole 222_4b1 of the fourth arm cam structure 222_4b. According to an embodiment, the size of the z-axis cross-section of the second rotary shaft 232 may be smaller than the size of the z-axis cross-section of the second fastening hole 222_4b1. The size of a virtual z-axis cross-section connecting ends of the second press-fit protrusion 222_4b5 located in the second fastening hole 222_4b1 (e.g., the uppermost ends of a press-fit protrusion protruding from the bottom surface of the second fastening hole 222_4b1) may be larger than the size of the z-axis cross-section of the second portion 232_1b of the second rotary shaft 232, or may be similar to the size of the z-axis cross-section of the second portion 232_1b to an extent that press-fit does not occur. Accordingly, even when the second press-fit protrusion 222_4b5 is disposed in the second fastening hole 222_4b1, the second press-fit protrusion 222_4b5 may remain in the original state without deformation. A gap may be formed between the second press-fit protrusion 222_4b5 and the second rotary shaft 232 (e.g., between the protruding upper end or the protruding end of the second press-fit protrusion 222_4b5 and at least a part of the flat surfaces and the curved surfaces of the second rotary shaft 232).

Referring to state 903, a portion of the second rotary shaft 232 (e.g., at least part of the third portion 232_1c) may pass through the fourth arm cam structure 222_4b and the third arm cam structure 222_4a. Accordingly, the third portion 232_1c may be disposed outside the first fastening hole 222_4a1 of the third arm cam structure 222_4a. In this case, the first press-fit protrusion 222_4a5 formed in the first fastening hole 222_4a1 may be partially brought into contact with the second portion 232_1b of the second rotary shaft 232 and may have a press-fit state. Correspondingly, a portion of the first press-fit protrusion 222_4a5 may be deformed by the contact with the second portion 232_1b. Meanwhile, while the first press-fit protrusion 222_4a5 is partially brought into contact with the second portion 232_1b of the second rotary shaft 232 and has the press-fit state, the second press-fit protrusion 222_4b5 formed in the second fastening hole 222_4b1 may also be partially brought into contact with the first portion 232_1a of the second rotary shaft 232 and may have a press-fit state. Correspondingly, a portion of the second press-fit protrusion 222_4b5 may be deformed by the contact with the first portion 232_1a.

When the second rotary shaft 232 is additionally inserted in the −x-axis direction in state 903, as in state 904, the edge portion of the second portion 232_1b of the second rotary shaft 232 in the −x-axis direction may have a press-fit state with the entire first press-fit protrusion 222_4a5 of the first fastening hole 222_4a1, and all or at least part of the first portion 232_1a of the second rotary shaft 232 may have a press-fit state with the entire second press-fit protrusion 222_4b5 of the second fastening hole 222_4b1. Although the edge portion of the second portion 232_1b of the second rotary shaft 232 in the x-axis direction is disposed in the second fastening hole 222_4b1, the edge portion of the second portion 232_1b may have a non-contact state or a non-press-fit state with the second press-fit protrusion 222_4b5 of the second fastening hole 222_4b1 because the edge portion of the second portion 232_1b has a smaller size than the second fastening hole 222_4b1.

As described above, the second rotary shaft 232 and the second arm part 222 according to an embodiment may have a structure in which the start point where the second portion 232_1b of the second rotary shaft 232 has a press-fit state with the first press-fit protrusion 222_4a5 and the start point where the first portion has a press-fit state with the second press-fit protrusion 222_4b5 are identically formed. In the case of applying this structure, pressure applied in the −x-axis direction may be increased while the first portion 232_1a and the second portion 232_1b of the second rotary shaft 232 are simultaneously press-fit into the third arm cam structure 222_4a and the fourth arm cam structure 222_4b of the second arm part 222. The increased pressure may be applied to at least part of the connecting point of the third arm cam structure 222_4a and the basic body 222_1 of the second arm part 222 and at least part of the connecting point of the fourth arm cam structure 222_4b and the basic body 222_1 of the second arm part 222, and therefore the second arm part 222 may be deformed or cracked. In this regard, as illustrated in FIG. 10, the shape of the second rotary shaft 232 may be differently configured such that the press-fit time point is different.

Figure 10:
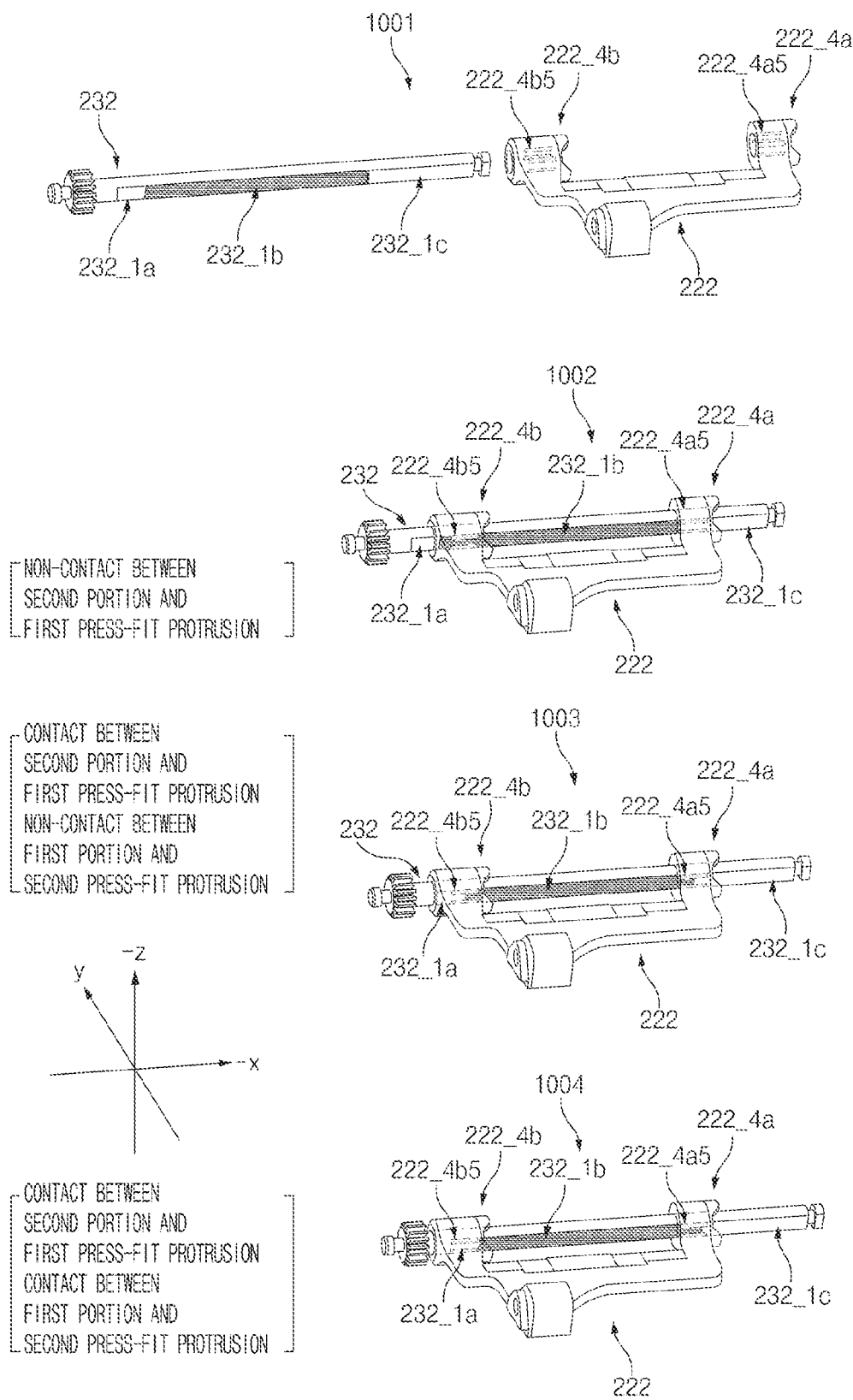
FIG. 10 is a perspective view illustrating an example of a coupling process of the second arm part and the second rotary shaft according to various embodiments.

FIG. 10 is a perspective view illustrating an example of a coupling process of the second arm part and the second rotary shaft according to various embodiments.

Referring to state 1001 of FIG. 10, the ring mounting groove of the second rotary shaft 232 may be disposed close to the fourth arm cam structure 222_4b of the second arm part 222 before the second rotary shaft 232 and the second arm part 222 are fastened with each other.

Referring to state 1002, the second rotary shaft 232 may be fastened with the fourth arm cam structure 222_4b and the third arm cam structure 222_4a, and part of the third portion 232_1c (e.g., the edge facing the x-axis direction) may be disposed in the first fastening hole 222_4a1 of the third arm cam structure 222_4a. As the size of the z-axis cross-section of the third portion 232_1c of the second rotary shaft 232 is smaller than the size of the first fastening hole 222_4a1 (e.g., the empty space other than the first press-fit protrusion 222_4a5), the third portion 232_1c and the first press-fit protrusion 222_4a5 may have a non-contact state, or may have a non-press-fit state even though the third portion 232_1c makes contact with the first press-fit protrusion 222_4a5. A portion of one side of the second portion 232_1b of the second rotary shaft 232 (e.g., a portion of the edge of the second portion 232_1b in the −x-axis direction) may be in a state of not being inserted into the third arm cam structure 222_4a. In this regard, the length of the second portion 232_1b of the second rotary shaft 232 in the x-axis direction may be greater than or equal to the length from the edge of the third arm cam structure 222_4a in the x-axis direction to the edge of the fourth arm cam structure 222_4b in the x-axis direction. A portion of an opposite side of the second portion 232_1b of the second rotary shaft 232 (e.g., the edge of the second portion 232_1b in the x-axis direction) may have a smaller size than the second fastening hole 222_4b1 (e.g., the empty space other than the second press-fit protrusion 222_4b5). Accordingly, the portion of the opposite side of the second portion 232_1b may have a non-contact state with the second press-fit protrusion 222_4b5 of the second fastening hole 222_4b1, or may have a non-press-fit state with the second fastening hole 222_4b1 even though the portion of the opposite side of the second portion 232_1b makes contact with the second press-fit protrusion 222_4b45 of the second fastening hole 222_4b1.

When the second rotary shaft 232 is additionally inserted in the direction from the fourth arm cam structure 222_4b to the third arm cam structure 222_4a, as in state 1003, a portion of the second rotary shaft 232 (e.g., a portion of the edge of the second portion 232_1b in the −x-axis direction) may make contact with the first press-fit protrusion 222_4a5 formed in the first fastening hole 222_4a1, and at least a portion of the first press-fit protrusion 222_4a5 may be deformed as the second portion 232_1b is press-fit. According to an embodiment, the first press-fit protrusion 222_4a5 partially formed in the first fastening hole 222_4a1 may have a press-fit state with part of the second portion 232_1b. At least part of the first portion 232_1a of the second rotary shaft 232 may be disposed in the second fastening hole 222_4b1 of the fourth arm cam structure 222_4b. The second press-fit protrusion 222_4b5 partially formed in the second fastening hole 222_4b1 may have a non-contact state with the first portion 232_1a.

When the second rotary shaft 232 is additionally inserted in the −x-axis direction in state 1003, as in state 1004, the edge portion of the second portion 232_1b of the second rotary shaft 232 in the −x-axis direction may have a press-fit state with the entire first press-fit protrusion 222_4a5 of the first fastening hole 222_4a1, and the position of the press-fitted second portion 232_1b may be changed, compared to that in state 1003. All or at least part of the first portion 232_1a of the second rotary shaft 232 may be disposed to have a press-fit state with the entire second press-fit protrusion 222_4b5 of the second fastening hole 222_4b1.

As described above, the second press-fit protrusion 222_4b5 may have a non-press-fit state while the first press-fit protrusion 222_4a5 formed in the third arm cam structure 222_4a is pressed against the second portion 232_1b of the second rotary shaft 232. Accordingly, pressure may be applied only between the basic body 222_1 and the third arm cam structure 222_4a of the second arm part 222. Thereafter, while the press-fit state of the first press-fit protrusion 222_4a5 is maintained, the press-fit state of the second press-fit protrusion 222_4b5 may progress, and the pressure may be sequentially increased. Accordingly, the hinge structure applied to the foldable electronic device of the disclosure may provide time for the second arm part 222 to adapt to the pressure, thereby reducing damage or deformation of the second arm part 222.

Meanwhile, the structure of the second rotary shaft 232 and the structure of the second arm part 222 described with reference to FIGS. 9 and 10 may be identically or similarly applied to the structure of the first rotary shaft 231 and the structure of the first arm part 221.

Figure 11:
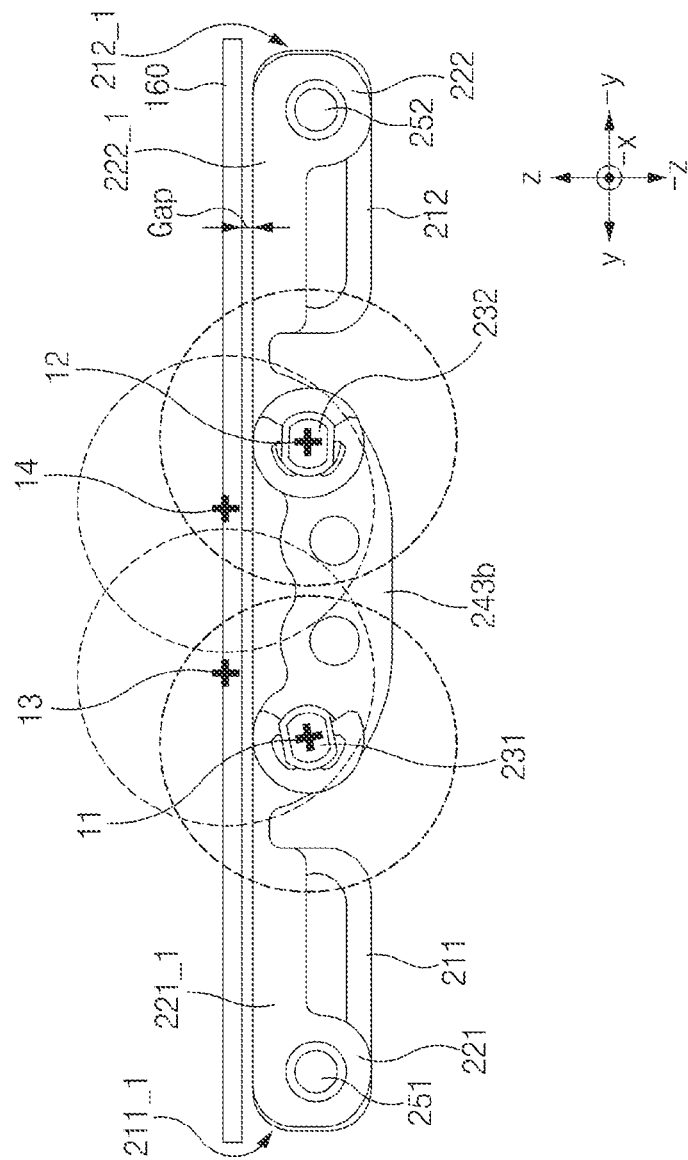
FIG. 11 is a diagram illustrating a first state of some components of the electronic device according to various embodiments.

FIG. 11 is a diagram illustrating a first state of some components of the electronic device according to various embodiments.

Referring to FIGS. 1, 3, and 11, some components of the electronic device 100 may include the first hinge structure 200a and the display 160, and the first hinge structure 200a and the display 160 may have the first state (e.g., a flat state). Prior to description, the drawing illustrated in FIG. 11 may correspond to the second hinge structure 200b and the display 160 depending on the viewing angle.

According to various embodiments, the first hinge structure 200a may include the first rotary member 211, the second rotary member 212, the fixed bracket 213, the first arm part 221, the second arm part 222, the first rotary shaft 231, the second rotary shaft 232, the idle gears 233 and 234, the first moving cam member 241a, the second moving cam member 241b, the first elastic body 242a, the second elastic body 242b, the third elastic body 242c, the fourth elastic body 242d, the center bracket 243a, and the shaft bracket 243b. The first rotary member 211 may be connected with the first arm part 221 through the first fastening part 251. The second rotary member 212 may be connected with the second arm part 222 through the second fastening part 252.

According to various embodiments, while the first rotary member 211 and the second rotary member 212 maintain a flat state, the display 160 may maintain a flat state. The first arm part 221 may rotate about the first rotary shaft 231 within a specified angle range (e.g., a range of 0 degrees to 100 degrees or a range of 0 degrees to 95 degrees). The second arm part 222 may rotate about the second rotary shaft 232 within a specified angle range. The first rotary member 211 may rotate about the third axis 13 within an angle range that is the same as or similar to that of the first arm part 221. The second rotary member 212 may rotate about the fourth axis 14 within an angle range that is the same as or similar to that of the second arm part 222. The third axis 13 may be formed in a higher position than the first rotary shaft 231 in the direction toward the display 160 (e.g., the z-axis direction). The fourth axis 14 may be formed in a higher position than the second rotary shaft 232 in the direction toward the display 160 (e.g., the z-axis direction). The gap between the third axis 13 and the fourth axis 14 may be smaller than the gap between the first rotary shaft 231 and the second rotary shaft 232. According to various embodiments, the third axis 13 and the fourth axis 14 may be formed side by side on the horizontal axis (e.g., the y-axis). According to an embodiment, the third axis 13 and the fourth axis 14 may be formed on the same layer as the display 160, or may be formed above the display 160 (e.g., in the air above the display 160.). For example, the third axis 13 and the fourth axis 14 may be virtual axes.

According to various embodiments, while the first rotary member 211 and the second rotary member 212 maintain a flat state, a first bracket body 211_1 of the first rotary member 211 and a second bracket body 212_1 of the second rotary member 212 may be disposed side by side. According to an embodiment, based on the illustrated drawing, the upper surface of the first bracket body 211_1 and the upper surface of the second bracket body 212_1 may be identically disposed to face upward (e.g., the z-axis direction). According to an embodiment, the first arm part 221 and the second arm part 222 may also be disposed side by side while the first rotary member 211 and the second rotary member 212 maintain the flat state, and thus both the first basic body 221_1 of the first arm part 221 and the second basic body 222_1 of the second arm part 222 may face the same direction (e.g., the z-axis direction based on the illustrated drawing). Accordingly, the first bracket body 211_1, the second bracket body 212_1, the first basic body 221_1, and the second basic body 222_1 may all be disposed side by side with respect to the horizontal axis and may all be disposed to face the same upper direction based on the illustrated drawing. The first bracket body 211_1, the second bracket body 212_1, the first basic body 221_1, and the second basic body 222_1 may support the rear surface of the display 160 without a height difference.

According to various embodiments, a predetermined gap may be formed between the central portion of the display 160, which is bendable, and the hinge structures 200a and 200b. An adhesive layer may be disposed between the peripheral areas (e.g., the first portion 161 and the second portion 162) other than the central portion 163 of the display 160 and the hinge structures 200a and 200b.

According to various embodiments, in the first state (e.g., a flat state of the display 160), the ridges and valleys of the first cam 241a_1a of the first moving cam member 241a may be disposed to be engaged with the valleys and ridges of the first arm cam structure 221_4a. The ridges and valleys of the second cam 241a_1b of the first moving cam member 241a may be disposed to be engaged with the valleys and ridges of the third arm cam structure 222_4a. The ridges and valleys of the third cam 241b_1a of the second moving cam member 241b may be disposed to be engaged with the valleys and ridges of the second arm cam structure 221_4b. The ridges and valleys of the fourth cam 241b_1b of the second moving cam member 241b may be disposed to be engaged with the valleys and ridges of the fourth arm cam structure 222_4b.

Figure 12:
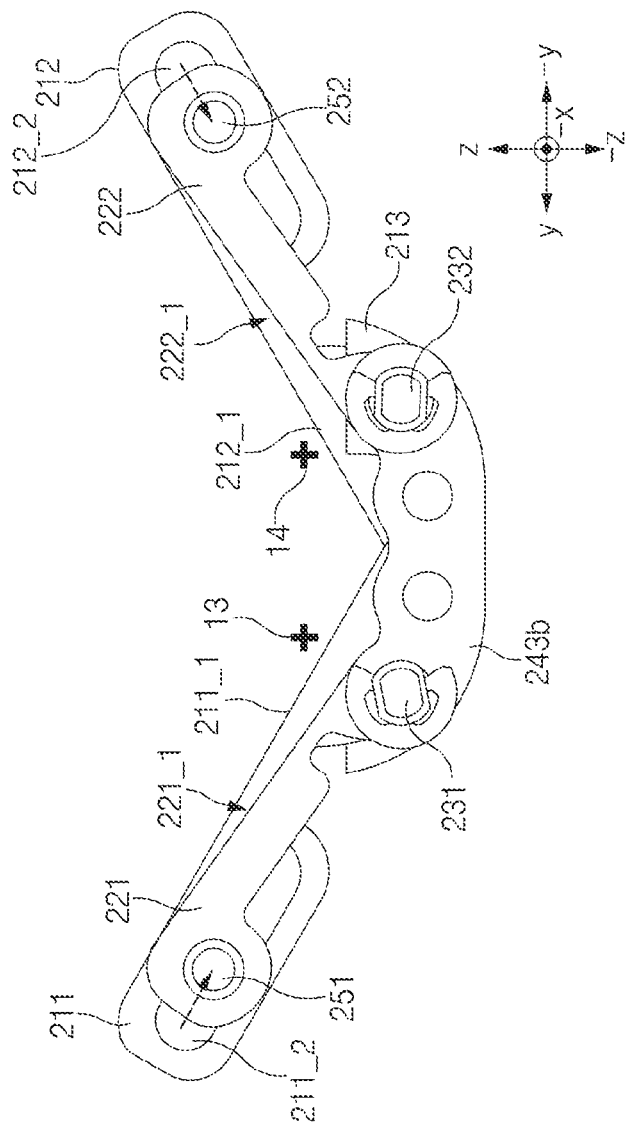
FIG. 12 is a diagram illustrating a first angle state of some structures of the electronic device according to various embodiments.

FIG. 12 is a diagram illustrating a first angle state of some structures of the electronic device according to various embodiments.

Referring to FIGS. 1, 3, and 12, the first hinge structure 200a (or, the second hinge structure 200b) may include the first angle state (e.g., the state in which the upper surfaces (the surfaces facing the z-axis direction) of the first rotary member 211 and the second rotary member 212 form an angle of 30 degrees with the horizontal axis (the y-axis)). As described above, the first hinge structure 200a may include the first rotary member 211, the second rotary member 212, the fixed bracket 213, the first arm part 221, the second arm part 222, the first moving cam member 241a, the second moving cam member 241b, the first elastic body 242a, the second elastic body 242b, the third elastic body 242c, the fourth elastic body 242d, the first rotary shaft 231, the second rotary shaft 232, the center bracket 243*a*, and the shaft bracket 243*b*. The first rotary member 211 may be connected with the first arm part 221 through the first fastening part 251. The second rotary member 212 may be connected with the second arm part 222 through the second fastening part 252.

According to various embodiments, the first housing (e.g., the first housing 110 of FIG. 1) to which the first rotary member 211 is fixed or the second housing (e.g., the second housing 120 of FIG. 1) to which the second rotary member 212 is fixed may be rotated through a predetermined angle (e.g., a predetermined unit angle such as 5 degrees, 10 degrees, or 15 degrees) in the direction of the vertical axis (e.g., the z-axis) from one point on the horizontal axis (e.g., the y-axis) based on the illustrated drawing by external pressure. For example, the first rotary member 211 connected to the first housing 110 may rotate about the third axis 13 by a first angle (e.g., 30 degrees) in the direction of the vertical axis (e.g., the z-axis) from one point on the horizontal axis (e.g., the y-axis). When the first rotary member 211 is rotated by the first angle by the external pressure, the corresponding pressure may be transmitted to the first arm part 221 through the first fastening part 251. Accordingly, the first arm part 221 may rotate about the first rotary shaft 231 by the first angle in the direction of the vertical axis (e.g., the z-axis) on the horizontal axis (e.g., the y-axis). In this operation, the first arm cam structure 221_4*a* and the second arm cam structure 221_4*b* may rotate depending on the rotation of the first arm part 221. The first rotary shaft 231 inserted into the first arm cam structure 221_4*a* and the second arm cam structure 221_4*b* may be rotated by the force transmitted depending on the rotation of the first arm cam structure 221_4*a* and the second arm cam structure 221_4*b*, and the first shaft gear (e.g., 231_2 of FIG. 3) of the first rotary shaft 231 may rotate while the first rotary shaft 231 rotates. The first idle gear 233 and the second idle gear 234 engaged with the first shaft gear may rotate depending on the rotation of the first shaft gear. Consequently, the second shaft gear 232_2 engaged with the second idle gear 234 may rotate, and the second rotary shaft 232 may rotate correspondingly. The third arm cam structure 222_4*a* and the fourth arm cam structure 242_4*b* may rotate depending on the rotation of the second rotary shaft 232, the second arm part 222 may rotate depending on the rotation of the third arm cam structure 222_4*a* and the fourth arm cam structure 242_4*b*, and the second rotary member 212 connected with the second arm part 222 through the second fastening part 252 may rotate depending on the rotation of the second arm part 222. Although it has been described that the second rotary member 212 simultaneously rotates while the external input is applied to the first rotary member 211, the disclosure is not limited thereto. For example, when external pressure is applied to the second rotary member 212, the second arm part 222 connected with the second rotary member 212 through the second fastening part 252 may rotate, and the second rotary shaft 232 connected to the second arm part 222, the second idle gear 234 connected to the second rotary shaft 232, the first idle gear 233 connected to the second idle gear 234, the first rotary shaft 231 connected to the first idle gear 233, the first arm part 221 having the first arm cam structure 221_4*a* and the second arm cam structure 221_4*b* connected to the first rotary shaft 231, and the first rotary member 211 connected with the first arm part 221 through the first fastening part 251 may rotate. Alternatively, when pressure is simultaneously applied to the first rotary member 211 and the second rotary member 212 from the outside, the first arm part 221 and the second arm part 222 may simultaneously rotate through a predetermined angle.

As described above, the first hinge structure 200*a* may have a structure in which the first rotary member 211 and the second rotary member 212 are simultaneously rotated by pressure (or force) applied from the outside. Accordingly, the first rotary member 211 and the second rotary member 212 may be simultaneously rotated even though external pressure is applied to the second housing 120 to which the second rotary member 212 is connected, or external pressure is simultaneously applied to the first housing 110 and the second housing 120. As the first housing 110 and the second housing 120 of the electronic device 100 according to an embodiment of the disclosure are simultaneously rotated, torsion of the first housing 110 and the second housing 120 may be suppressed, and a stable hinge motion may be performed.

According to an embodiment, as the axes 13 and 14 of the first rotary member 211 and the second rotary member 212 are disposed between the first rotary shaft 231 and the second rotary shaft 232 of the first arm part 221 and the second arm part 222, the amount of rotation of the first rotary member 211 and the amount of rotation of the first arm part 221 may differ from each other for each rotation timing. Accordingly, the upper surface of the first bracket body 211_1 of the first rotary member 211 may further rotate with respect to the vertical axis (e.g., the z-axis) than the upper surface of the basic body 221_1 of the first arm part 221. As the first rotary member 211 and the first arm part 221 are connected through the first fastening part 251, the first fastening part 251 may slide along a first slide hole 211_2 of the first rotary member 211 by a predetermined distance while the first rotary member 211 rotates. Similarly, the upper surface of the second bracket body 212_1 may further rotate with respect to the vertical axis (e.g., the z-axis) than the second basic body 222_1. Furthermore, as the second rotary member 212 and the second arm part 222 are connected through the second fastening part 252, the second fastening part 252 may slide along a second slide hole 212_2 of the second rotary member 212 by a predetermined distance while the second rotary member 212 rotates.

As described above, as the first arm part 221 rotates in the state in which the display 160 of the electronic device 100 is folded with a specific angle (e.g., with an angle of 30 degrees or −30 degrees between the upper surface of the display 160 and the horizontal axis), the inclined portions close to the ridges among the inclined portions between the ridges and the valleys of the first arm cam structure 221_4*a* may make contact with the inclined portions close to the ridges among the inclined portions between the ridges and the valleys of the first cam 241*a*_1*a* of the first moving cam member 241*a*, and the inclined portions close to the ridges among the inclined portions between the ridges and the valleys of the second arm cam structure 221_4*b* may make contact with the inclined portions close to the ridges among the inclined portions between the ridges and the valleys of the third cam 241*b*_1*a* of the second moving cam member 241*b*. Similarly, as the second arm part 222 rotates, the inclined portions close to the ridges among the inclined portions between the ridges and the valleys of the third arm cam structure 222_4*a* may make contact with the inclined portions close to the ridges among the inclined portions between the ridges and the valleys of the second cam 241*a*_1*b* of the first moving cam member 241*a*, and the inclined portions close to the ridges among the inclined portions between the ridges and the valleys of the fourth arm cam structure 222_4*b* may make contact with the inclined portions close to the ridges among the inclined portions between the ridges and the valleys of the fourth cam 241b_1b of the second moving cam member 241b.

Figure 13:
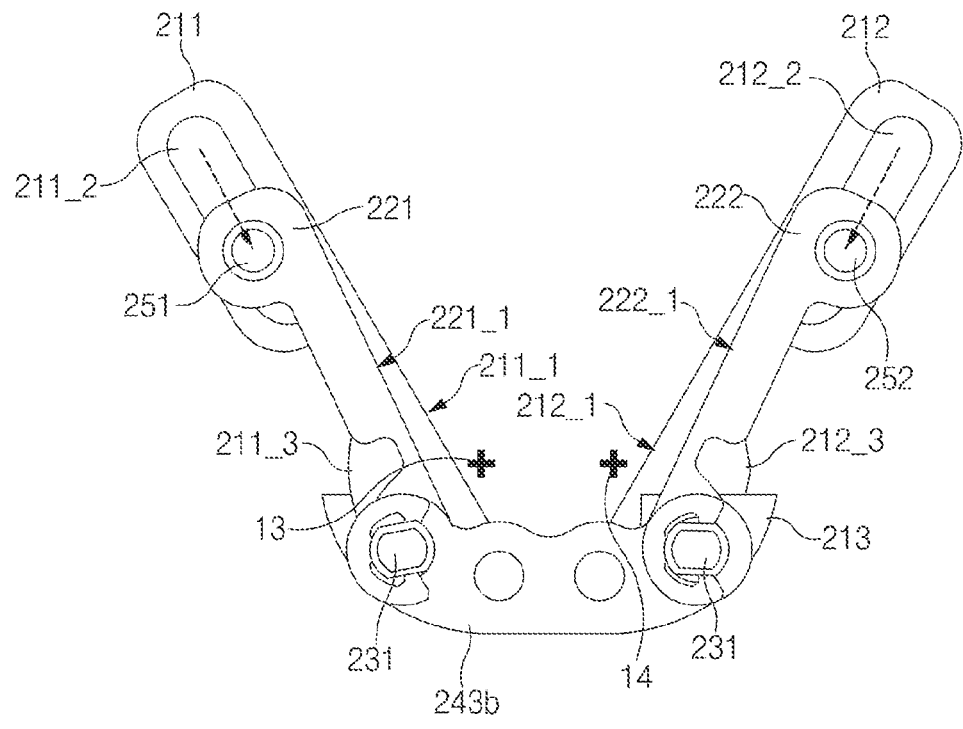
FIG. 13 is a diagram illustrating a second angle state of a first hinge structure according to various embodiments.

FIG. 13 is a diagram illustrating a second angle state of the first hinge structure according to various embodiments.

Referring to FIGS. 1, 3, and 13, the first hinge structure 200a may include the second angle state. The first hinge structure 200a may include, for example, the first rotary member 211, the second rotary member 212, the fixed bracket 213, the first arm part 221, the second arm part 222, a gear structure 230, the first moving cam member 241a, the second moving cam member 241b, the first elastic body 242a, the second elastic body 242b, the third elastic body 242c, the fourth elastic body 242d, the first rotary shaft 231, the second rotary shaft 232, the center bracket 243a, and the shaft bracket 243b. The first rotary member 211 may be connected with the first arm part 221 through the first fastening part 251, and the second rotary member 212 may be connected with the second arm part 222 through the second fastening part 252.

According to various embodiments, the first housing (e.g., the first housing 110 of FIG. 1) or the second housing (e.g., the second housing 120 of FIG. 1) may be rotated by a second angle (e.g., 60 degrees) in the direction of the vertical axis (e.g., the z-axis) from one point on the horizontal axis (e.g., the y-axis) based on the illustrated drawing by external pressure (or force). For example, when external pressure or force is transmitted to the first housing 110 or the second housing 120, the first rotary member 211 or the second rotary member 212 may rotate about the third axis 13 or the fourth axis 14 by the second angle (e.g., 60 degrees) in the direction of the vertical axis (e.g., the z-axis) from one point on the horizontal axis (e.g., the y-axis). In the process of performing the above-described operation, the applied force may be mutually transmitted through the first arm part 221 or the second arm part 222, the first rotary shaft 231 and the second rotary shaft 232, and the idle gears 233 and 234, and the first rotary member 211, the second rotary member 212, the first arm part 221, and the second arm part 222 may simultaneously rotate.

According to various embodiments, when the first rotary member 211 and the second rotary member 212 rotate through the second angle, the first fastening part 251 and the second fastening part 252 may slide in the first slide hole 211_2 and the second slide hole 212_2 and may be located closer to the vertical axis (e.g., the z-axis) than when the first rotary member 211 and the second rotary member 212 rotate through the second angle. In the above operation process, a first rail 211_3 of the first rotary member 211 may rotate outward from the center of the fixed bracket 213 to the left based on the illustrated drawing, and a second rail 212_3 of the second rotary member 212 may rotate outward from the center of the fixed bracket 213 to the right. As the axes of rotation of the first rotary member 211 and the first arm part 221 differ from each other and the axes of rotation of the second rotary member 212 and the second arm part 222 differ from each other, the distance between the upper surface of the first bracket body 211_1 and the upper surface of the second bracket body 212_1 may be closer to the vertical axis (e.g., the z-axis) than the distance between the upper surface of the first basic body 221_1 and the upper surface of the second basic body 222_1.

As described above, as the first arm part 221 rotates in the state in which the display 160 of the electronic device 100 is folded with a specific angle (e.g., with an angle of 60 degrees or −60 degrees between the upper surface of the display 160 and the horizontal axis), at least some of the ridges of the first arm cam structure 221_4a may make contact with at least some of the ridges of the first cam 241a_1a of the first moving cam member 241a, and at least some of the ridges of the second arm cam structure 221_4b may make contact with the ridges of the third cam 241b_1a of the second moving cam member 241b. Similarly, as the second arm part 222 rotates, at least some of the ridges of the third arm cam structure 222_4a may make contact with the ridges of the second cam 241a_1b of the first moving cam member 241a, and at least some of the ridges of the fourth arm cam structure 222_4b may make contact with the ridges of the fourth cam 241b_1b of the second moving cam member 241b.

Although it has been described that in the first angle state, the inclined portions adjacent to the ridges of the cam structures make contact with the inclined portions adjacent to the ridges of the cams and in the second angle state, at least some of the ridges of the cam structures make contact with the ridges of the cams, the disclosure is not limited thereto. For example, the electronic device 100 may have various angle states (e.g., the angle formed by the upper surface of one side of the display and the horizontal axis may have a specified angle range corresponding to a free-stop state due to friction between the cam structures and the cams, or may have various angles, for example, 1 degree, 5 degrees, 15 degrees, 30 degrees, 45 degrees, 60 degrees, and the like), and the portions where the inclined portions between the ridges and the valleys of the cam structures make contact with the inclined portions between the ridges and the valleys of the cams may vary depending on the angle states. Alternatively, the sizes of the areas by which the ridges of the cam structures make contact with the ridges of the cams may vary depending on the angle states.

Figure 14:
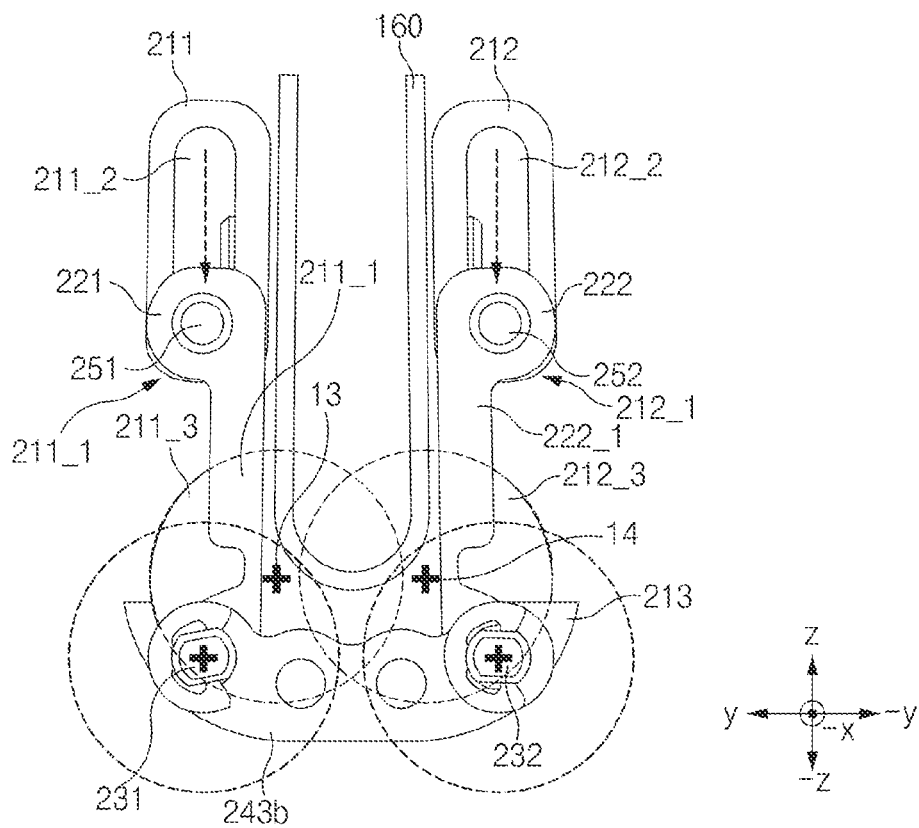
FIG. 14 is a diagram illustrating a second state of some structures of the electronic device according to various embodiments.

FIG. 14 is a diagram illustrating a second state of some structures of the electronic device according to various embodiments.

Referring to FIGS. 1, 3, and 14, the electronic device 100 may include the first hinge structure 200a and the display 160. The second state of the first hinge structure 200a may include a folded state. The first hinge structure 200a may include, for example, the fixed bracket 213, the first rotary member 211, the second rotary member 212, the first arm part 221, the second arm part 222, the first fastening part 251, the second fastening part 252, the first rotary shaft 231, the second rotary shaft 232, the shaft gears of the first rotary shaft 231 and the second rotary shaft 232, the idle gears 233 and 234, the first moving cam member 241a, the second moving cam member 241b, the first elastic body 242a, the second elastic body 242b, the third elastic body 242c, the fourth elastic body 242d, the center bracket 243a, and the shaft bracket 243b.

According to an embodiment, the first rotary member 211 and the second rotary member 212 may be disposed to face each other. Based on the illustrated drawing, as edges of the first housing 110 and the second housing 120 (e.g., the ends in the z-axis direction based on FIG. 17) are disposed adjacent to each other, the first rotary member 211 in the illustrated drawing may be disposed parallel to the vertical axis (e.g., the z-axis), or the first rotary member 211 may rotate about the third axis 13 and may be disposed to be further inclined by a specified angle in the −y-axis direction with respect to the vertical axis (e.g., the z-axis). According to various embodiments, similarly to the first rotary member 211, the second rotary member 212 may be disposed parallel to the vertical axis (e.g., the z-axis), or the second rotary member 212 may rotate about the fourth axis 14 and may be disposed to be further inclined by a specified angle in the y-axis direction with respect to the vertical axis (e.g., the z-axis). For example, the third axis 13 may be the central axis of rotation of the first rail 211_3, and the fourth axis 14 may be the central axis of rotation of the second rail 212_3. The first arm part 221 may rotate about the first rotary shaft 231 and may be disposed side by side with the first rotary member 211, and the second arm part 222 may rotate about the second rotary shaft 232 and may be disposed side by side with the second rotary member 212. Accordingly, the central portion of the display 160 may be bent in the shape of "U", and the remaining area may be maintained in a flat state.

According to various embodiments, as the first rotary member 211 and the first arm part 221 are vertically disposed (or, inclined by the specified angle in the −y-axis direction with respect to the vertical axis (e.g., the z-axis)), the upper surface of the first bracket body 211_1 of the first rotary member 211 and the upper surface of the basic body 221_1 of the first arm part 221 may be disposed side by side without a height difference therebetween. Due to the difference in length between the first rotary member 211 and the first arm part 221, the first fastening part 251 may be located on the lower side of the first slide hole 211_2 of the first rotary member 211 (e.g., at the edge in the −z-axis direction based on FIG. 17). According to various embodiments, when the electronic device 100 is in a flat state, the first fastening part 251 may be located at the upper edge of the first slide hole 211_2 of the first rotary member 211. Similarly, when the electronic device 100 is in the folded state, the second fastening part 252 may be located at the lower edge of the second slide hole 212_2.

According to various embodiments, in the state in which the display 160 of the electronic device 100 is folded (e.g., in the state in which the central portion of the display 160 is deformed in the shape of "U"), depending on rotation of the first arm part 221, the ridges and valleys of the first arm cam structure 221_4a may be engaged with the valleys and ridges of the first cam 241a_1a of the first moving cam member 241a, and the ridges and valleys of the second arm cam structure 221_4b may be engaged with the valleys and ridges of the third cam 241b_1a of the second moving cam member 241b. Similarly, as the second arm part 222 rotates, the ridges and valleys of the third arm cam structure 222_4a may be engaged with the valleys and ridges of the second cam 241a_1b of the first moving cam member 241a, and the ridges and valleys of the fourth arm cam structure 222_4b may be engaged with the valleys and ridges of the fourth cam 241b_1b of the second moving cam member 241b.

The electronic device 100 according to the various embodiments may implement the plurality of cam structures without an increase in the thickness of the hinge structure, thereby increasing the detent load of the hinge structure. Using the increased detent load of the hinge structure, the electronic device 100 may improve a phenomenon occurring in a folded or flat state of the terminal in a room-temperature or low-temperature environment (e.g., the phenomenon in which the gap between the ends of the housings 110 and 120 is widened in the folded state) even though the reaction force of the display 160 (or, the flexible display) (or, the repulsive force or the force by which the display in the folded state is unfolded) is increased. The electronic device 100 may allow for an increase in the reaction force of the display 160 through the improved detent load. Accordingly, the stiffness of the display 160 may be raised (e.g., the display 160 may be manufactured to be thicker than before), and thus cracks or surface damage of a portion (e.g., the central portion 163 of the display 160) on which a load depending on folding is concentrated in the folded state may be reduced.

Figure 15:
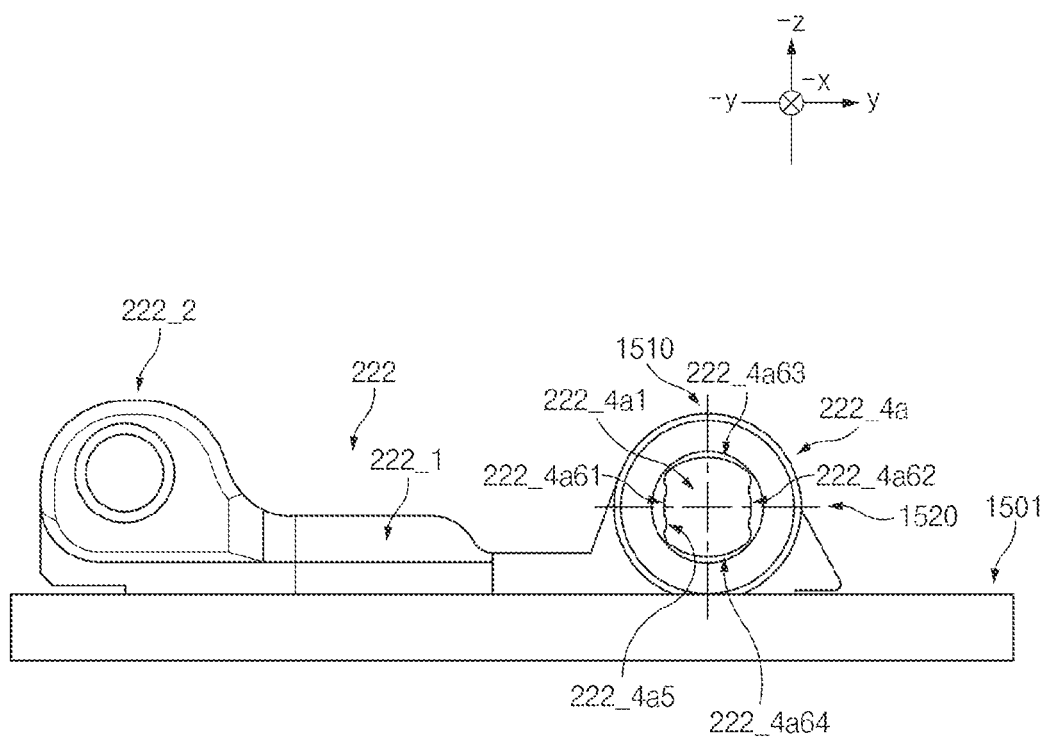
FIG. 15 is a diagram illustrating an example second arm part according to various embodiments.
Figure 16:
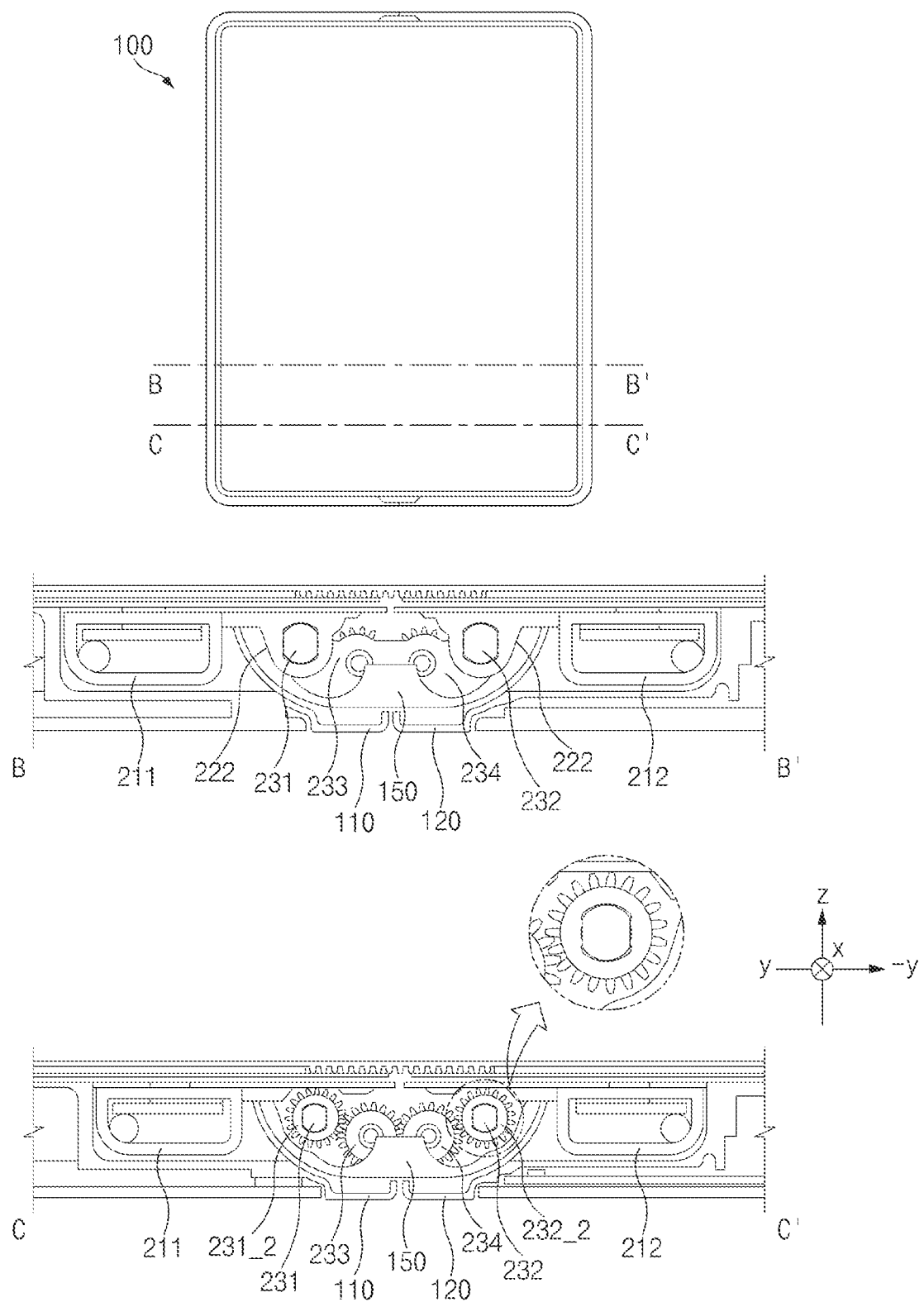
FIG. 16 is a diagram including cross-sectional view illustrating a flat state of the electronic device to which the other form of the second arm part is applied according to various embodiments.
Figure 17:
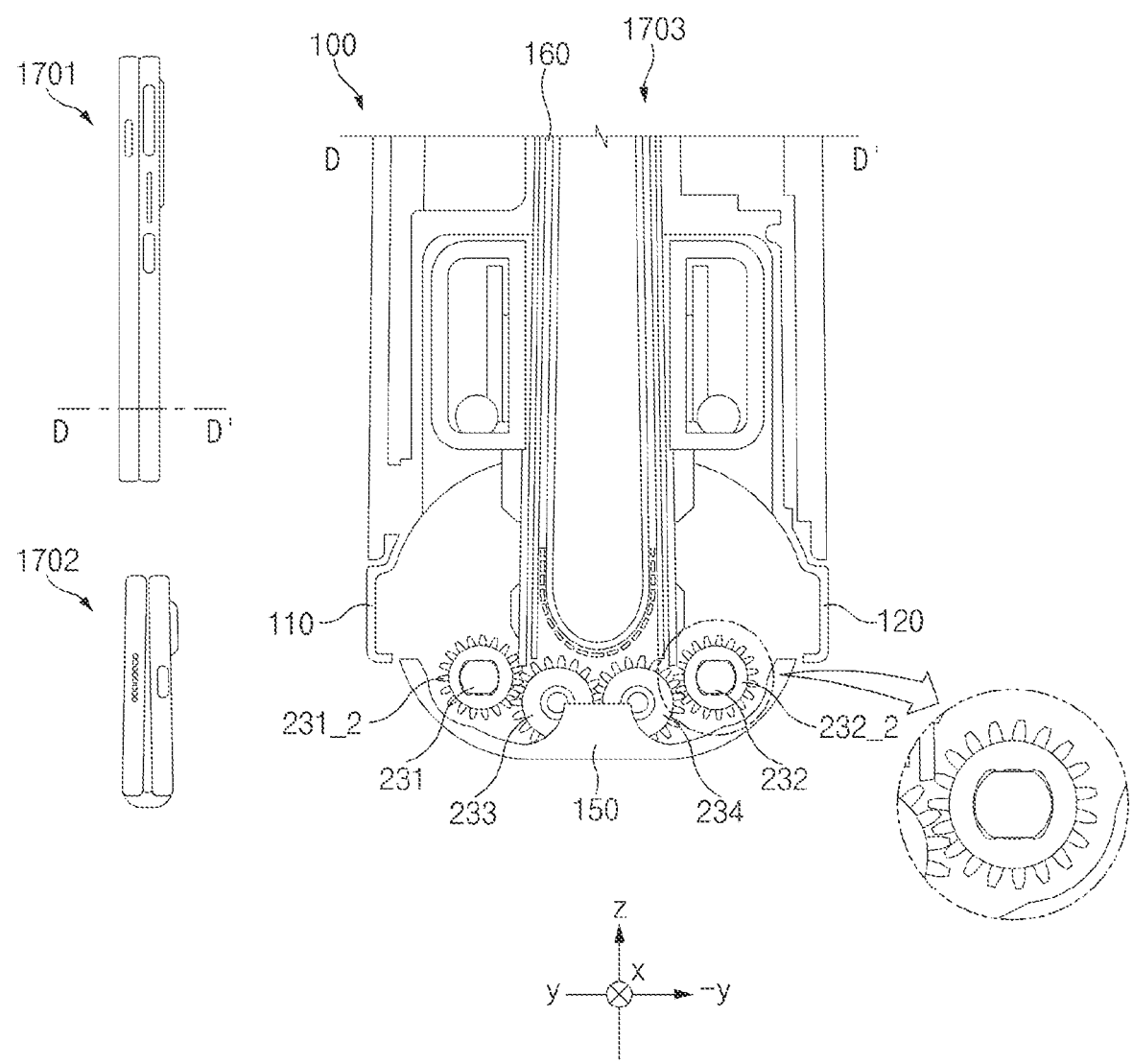
FIG. 17 is a diagram including a cross-sectional view illustrating a folded state of the electronic device to which the other form of the second arm part is applied according to various embodiments.

FIG. 15 is a diagram illustrating an example form of the second arm part according to various embodiments, FIG. 16 is a diagram including sectional views illustrating a flat state of the electronic device to which the form of the second arm part illustrated in FIG. 15 is applied according to various embodiments, and FIG. 17 is a diagram including sectional views illustrating a folded state of the electronic device to which the form of the second arm part illustrated in FIG. 15 is applied according to various embodiments.

Referring to FIG. 15, the second arm part 222 according to an embodiment may include at least a basic body 222_1, a connecting portion 222_2 formed on one side of the basic body 222_1 and used for connection with the second rotary member, and a third arm cam structure 222_4a formed on an opposite side of the basic body 222_1 and fastened with the second rotary shaft. Meanwhile, as the second arm part 222 is illustrated based on the angle viewed in the x-axis direction in the state in which the second arm part 222 is disposed on a sintered mounting jig, the third arm cam structure 222_4a may appear to overlap a fourth arm cam structure 222_4b in the illustrated drawing. According to an embodiment, the fourth arm cam structure 222_4b may have a shape that is the same as, or similar to, the shape of the third arm cam structure 222_4a.

According to various embodiments, the third arm cam structure 222_4a may include a modified first fastening hole 222_4a1, and the width of a first axis 1510 (or, a first virtual axis) across the vertical center line of the modified first fastening hole 222_4a1 (or, the vertical axis length of the first fastening hole) may be greater than the width of a second axis 1520 (or, a second virtual axis) across the horizontal center line (or, the horizontal axis length of the first fastening hole). In regard to the formation of the modified first fastening hole 222_4a1, the third arm cam structure 222_4a may include a first sidewall 222_4a61, at least a portion of which includes a flat area, a second sidewall 222_4a62 including at least a flat area and disposed to face the first sidewall 222_4a61, a third sidewall 222_4a63 disposed between the first sidewall 222_4a61 and the second sidewall 222_4a62 and formed to be convex in the z-axis direction, and a fourth sidewall 222_4a64 disposed between the first sidewall 222_4a61 and the second sidewall 222_4a62 and formed to be convex in the −z-axis direction. The third sidewall 222_4a63 and the fourth sidewall 222_4a64 may be disposed to face each other with respect to the second axis 1520.

As the opposite ends of the third sidewall 222_4a63 of the modified first fastening hole 222_4a1 having the above-described structure are supported by the upper end of the first sidewall 222_4a61 (e.g., the upper end in the −z-axis direction) and the upper end of the second sidewall 222_4a62 (e.g., the upper end in the −z-axis direction), it is possible to prevent and/or reduce a phenomenon (e.g., deflection) in which at least a portion of the third sidewall 222_4a63 is deformed in the z-axis direction by a surrounding environment (e.g., an environment in which high heat and pressure are applied, an environment in which high heat and the gravity are applied, or an environment in which the second arm part 222 containing high heat is cooled at predetermined temperature and pressure) in the process of manufacturing the second arm part 220.

Meanwhile, the above-described structure of the modified first fastening hole 222_4a1 may be applied to the second fastening hole 222_4b1 to form a modified second fastening hole and may be identically applied to the fastening holes of the first arm part 221.

Referring to FIGS. 16 and 17, as the relatively long first axis 1510 mentioned in FIG. 15 is applied to the first arm part 221 having the modified first fastening hole 222_4a1 formed to face the z-axis direction and the second arm part 222 having the modified second fastening hole 222_4b1, a modified first rotary shaft 231 and a modified second rotary shaft 232 may be applied to the first arm part 221 and the second arm part 222. For example, when the foldable electronic device 100 is in the flat state, the modified first rotary shaft 231 may be formed such that, based on the center point of the shaft, the length in the z-axis direction is greater than the length in the y-axis direction. Similarly, the modified second rotary shaft 232 may be formed such that, based on the center point of the shaft, the length in the z-axis direction is greater than the length in the y-axis direction. According to various embodiments, when the foldable electronic device 100 is in the folded state, the modified first rotary shaft 231 may be formed such that, based on the center point of the shaft, the length in the y-axis direction is greater than the length in the z-axis direction. Similarly, when the foldable electronic device 100 is in the folded state, the modified second rotary shaft 232 may be formed such that, based on the center point of the shaft, the length in the y-axis direction is greater than the length in the z-axis direction. In FIG. 17, state 1701 illustrates the central portion of the first housing 110 and the central portion of the second housing 120 disposed adjacent to each other when the foldable electronic device 100 is in the folded state. State 1703 illustrates the lateral portion of the first housing 110 and the lateral portion of the second housing 120 disposed adjacent to each other when the foldable electronic device 100 is in the folded state, and state 1705 illustrates at least part of the section taken along line D-D' in state 1701.

According to various embodiments, even though the modified first rotary shaft 231 and the modified second rotary shaft 232 are applied to the first arm part 221 and the second arm part 222, the peripheral shape other than the shape of the fastening holes of the first arm part 221 and the second arm part 222 may have a structure that is the same as, or similar to, the structure described above with reference to FIGS. 1 to 14. Accordingly, the first arm part 221 and the second arm part 222 may be connected, through the same connecting structure, with the first rotary member 211 and the second rotary member 212 described above. Furthermore, as the same first shaft gear 231_2 and the same second shaft gear 232_2 are formed on the modified first rotary shaft 231 and the modified second rotary shaft 232, the first shaft gear 231_2 may be connected to the first idle gear 233, and the second shaft gear 232_2 may be connected to the second idle gear 234. The shaft gears 231_2 and 232_2 and the idle gears 233 and 234 may be disposed in the hinge housing 10, and when the foldable electronic device 100 is in the flat state, at least a portion of the hinge housing 150 may be hidden by the first housing 110 and the second housing 120. Alternatively, when the foldable electronic device 100 is in the folded state, at least a portion of the hinge housing 150 may be exposed to the outside through between the first housing 110 and the second housing 120.

According to various example embodiments described above, a foldable electronic device according to an example embodiment may include: a display, a first housing and a second housing on which the display is seated, and a hinge structure corresponding a hinge member or a hinge connecting the first housing and the second housing. The hinge structure may include: a first rotary support (or a first rotary member) connected with the first housing, a second rotary support (or a second rotary member) connected with the second housing, a first arm part configured to rotate in response to rotation of the first rotary support, a second arm part configured to rotate in response to rotation of the second rotary support, a first rotary shaft coupled to the first arm part, and a second rotary shaft coupled to the second arm part. The second arm part may include a first arm cam structure including a cam having a first fastening hole formed therein into which one side of the second rotary shaft is inserted and a second arm cam structure including a cam having a second fastening hole formed therein into which an opposite side of the second rotary shaft is inserted. An inside surface of at least one of the first fastening hole or the second fastening hole may include a first sidewall vertically disposed in the direction toward the display when the foldable electronic device is in a flat state, a second sidewall vertically disposed in the direction toward the display and disposed to face the first sidewall, a third sidewall connecting one end of the first sidewall and one end of the second sidewall and forming a curved surface, and a fourth sidewall formed to connect an opposite end of the first sidewall and an opposite end of the fourth sidewall and disposed to face the third sidewall.

According to various example embodiments, the structure of the first to fourth sidewalls may be identically or similarly applied to fastening holes of at least one arm cam structure formed on the first arm part. As described above, when the foldable electronic device is in the flat state, the first sidewall and the second sidewall may be formed in the direction perpendicular to the front surface of the display, and the third sidewall and the fourth sidewall disposed between the first sidewall and the second sidewall may have a convex shape. Accordingly, deformation may be reduced in the manufacturing process of the hinge structure.

According to various example embodiments, the foldable electronic device may further include, on the first sidewall and the second sidewall, at least one press-fit protrusion having a specified height in a direction toward the center of the hole or in a direction protruding from the bottom surface of the first sidewall or the second sidewall.

According to various example embodiments, based on the foldable electronic device being in the flat state, a flat area of the first rotary shaft (or, the second rotary shaft) may be disposed perpendicular to the front surface (or, the rear surface) of the display, or may be disposed approximately perpendicular to the front surface (or, the rear surface) of the display (e.g., within a specified range (e.g., ±10 degrees) with respect to 90 degrees), to correspond to the shapes of the first to fourth sidewalls.

According to various example embodiments, based on the foldable electronic device being in a folded state, a flat area of the first rotary shaft (or, the second rotary shaft) may be disposed parallel to the front surface (or, the rear surface) of the display, or may be disposed approximately parallel to the front surface (or, the rear surface) of the display (e.g., within a specified range (e.g., ±10 degrees) with respect to 180 degrees), to correspond to the shapes of the first to fourth sidewalls.

According to various example embodiments, based on the foldable electronic device being in the flat state, a flat area of the first rotary shaft may be disposed perpendicular to the front surface (or, the rear surface) of the display or may be disposed approximately perpendicular to the front surface (or, the rear surface) of the display (e.g., within a specified range (e.g., ±10 degrees) with respect to 180 degrees), and a flat area of the second rotary shaft may be disposed perpendicular to the front surface (or, the rear surface) of the display or may be disposed approximately perpendicular to the front surface (or, the rear surface) of the display (e.g., within a specified range (e.g., ±10 degrees) with respect to 180 degrees).

Figure 18:
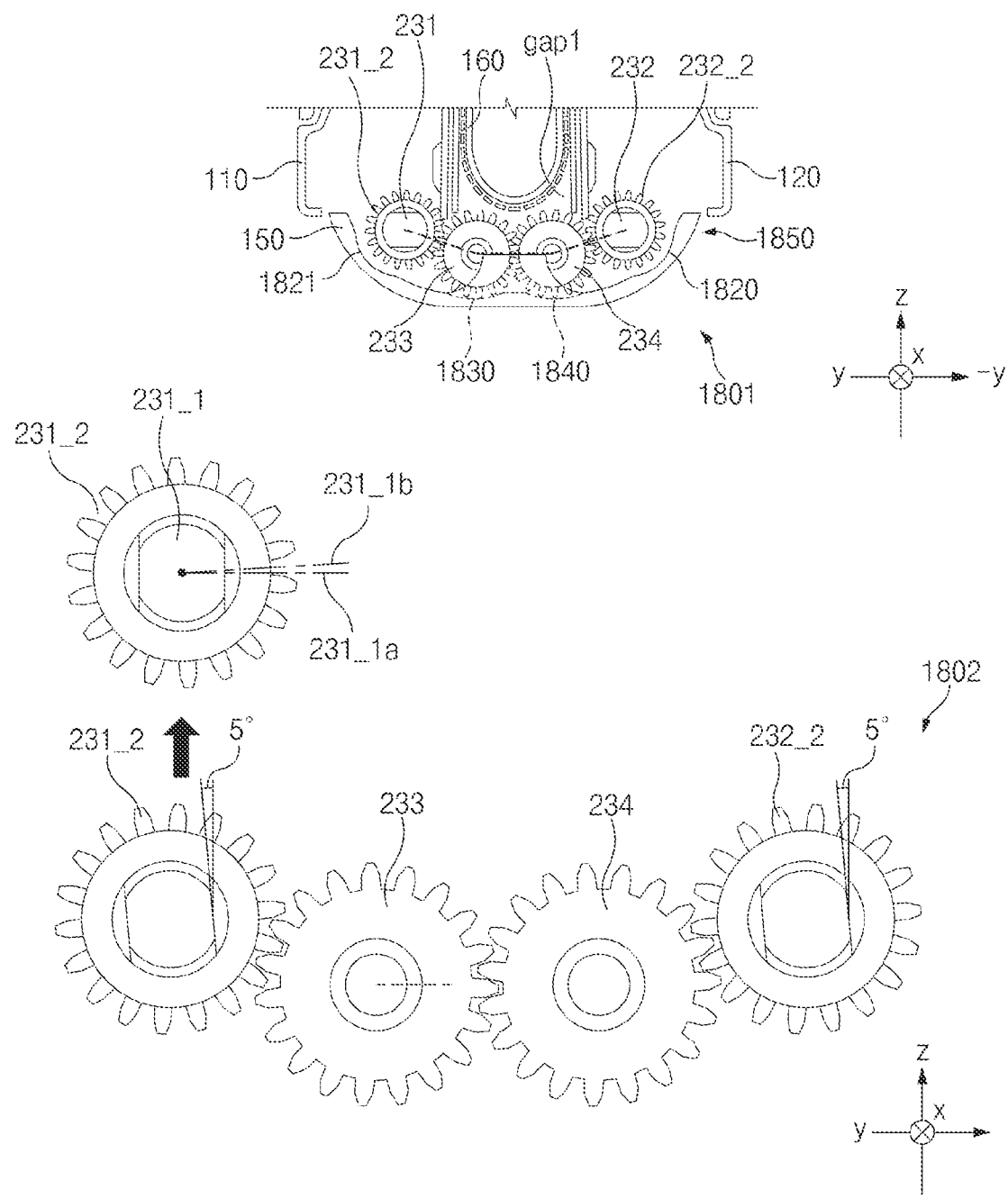
FIG. 18 is a diagram illustrating an example of the foldable electronic device including an arrangement of gears according to various embodiments.

FIG. 18 is a sectional view illustrating an example of the foldable electronic device including an arrangement of gears according to various embodiments. In FIG. 18, state 1801 is a view illustrating a portion of a section when the foldable electronic device is in a folded state, and state 1802 is a view illustrating the arrangement of the gears when the foldable electronic device is in a flat state according to various embodiments.

Referring to FIG. 18, because at least a portion of the display 160 is bent in the shape of "U" when the foldable electronic device 100 is in the folded state as in state 1801, a gap gap1 may be required to prevent and/or reduce collision of the bent area of the display 160 and the gears (or, collision that is likely to occur when the foldable electronic device in the folded state is dropped). In this regard, the central axis of the first idle gear 233 and the central axis of the second idle gear 234 may be disposed side by side based on the y-axis, and the central axis of the first shaft gear 231_2 may be disposed above the central axis of the first idle gear 233 in the z-axis direction (e.g., the direction toward the display 160). The central axis of the second shaft gear 232_2 may be disposed above the central axis of the second idle gear 234 in the z-axis direction and may be disposed side by side with the central axis of the first shaft gear 231_2 based on the y-axis. The first shaft gear 231_2 disposed on the first rotary shaft 231 may include a smaller number of teeth than the first idle gear 233 and may be disposed to be engaged with the first idle gear 233.

In accordance with (or, correspondingly to) or independently of the arrangement relationship between the shaft gears 231_2 and 232_2 and the idle gears 233 and 234 described above, the hinge housing 150 may include concave shapes 1810 and 1820 such that the shaft gears 231_2 and 232_2 are mounted therein and may include concave shapes 1830 and 1840 such that the idle gears 233 and 234 are mounted therein. Additionally, at least a portion 1850 of the outer surface of the hinge housing 150 may include a curved surface corresponding to a range of rotation of the first housing 110 and the second housing 120. Alternatively, the outer curved shape 1850 of the hinge housing 150 may be formed to correspond to a range of rotation of the first housing 110 and the second housing 120.

Referring to state 1802, as illustrated, at least one hinge structure applied to the foldable electronic device may include at least the first shaft gear 231_2, the second shaft gear 232_2, the first idle gear 233, and the second idle gear 234. As described above with reference to FIG. 15, in the case where the arm part having the relatively long first axis 1510 disposed to face the z-axis direction is applied to the hinge structure, when the foldable electronic device is in the flat state, the flat areas of the first pillar portion 231_1 disposed in the center of the first shaft gear 231_2 may be vertically disposed based on the horizontal line (or, the x-y plane), and the angle between the flat areas and the z-axis may be 20 degrees or less (e.g., 5 degrees or less in the case where the first idle gear 233 and the second idle gear 234 have 19 teeth and the shaft gears 231_2 and 232_2 have 18 teeth). According to various embodiments, in the case of drawing a virtual first line segment 231_1a (e.g., a line segment drawn from the center of the shaft gear 231_2 or 232_2 to the flat area of the pillar portion to have the shortest distance) in the y-axis direction based on the center point of the first rotary shaft 231 or the second rotary shaft 232, the angle between a virtual second line segment 231_1b connecting the center of the shaft gear 231_2 or 232_2 and one point of a valley between teeth and the first line segment 231_1a may be 5 degrees or less. In the case of implementing the rotary shafts 231 and 232 in the above-described structure, the first shaft gear 231_2 and the second shaft gear 232_2 may have the same shape. Accordingly, the first rotary shaft 231 and the second rotary shaft 232 may be manufactured and applied without distinction between the left and right sides of the first rotary shaft 231 and the second rotary shaft 232. Furthermore, in the case of arranging the first rotary shaft 231 and the second rotary shaft 232 as in state 1802, the degree of asymmetry of the first shaft gear 231_2 and the second shaft gear 232_2 based on between the first idle gear 233 and the second idle gear 234 may be reduced, and thus a force balance may be more easily designed.

Figure 19:
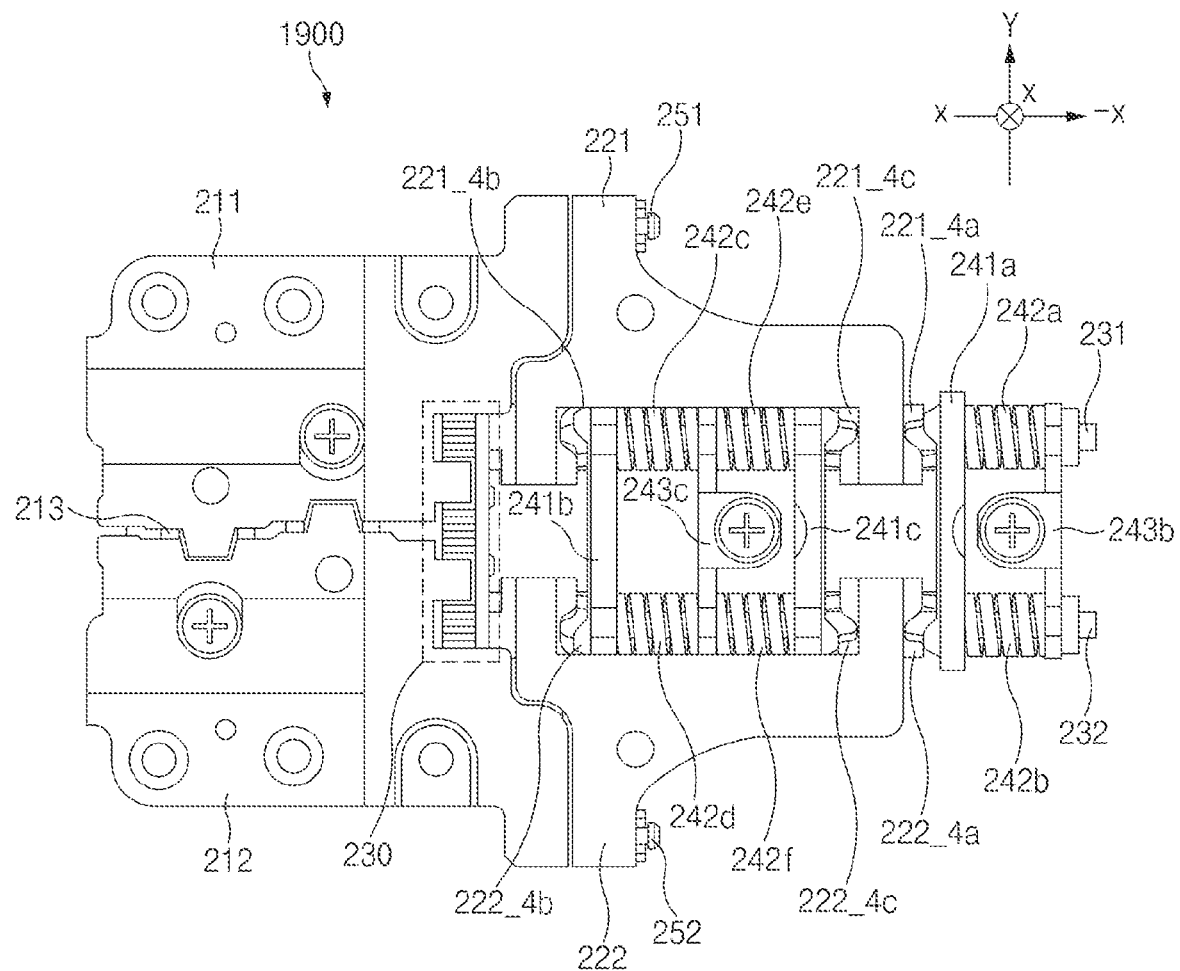
FIG. 19 is a diagram illustrating an example of the hinge structure applied to the foldable electronic device according to various embodiments.

FIG. 19 is a diagram illustrating an example of the hinge structure applied to the foldable electronic device according to various embodiments.

Referring to FIGS. 2 to 4 and 19, compared to the above-described hinge structure 200a, the hinge structure illustrated in FIG. 19 may further include, in a multi-detent structure, an additional arm cam structure, an additional moving cam member corresponding thereto, and an additional elastic member for providing elasticity. For example, the hinge structure 1900 may be applied in an expanded form of the above-described various hinge structures (e.g., 200a and 200b) or in a form replacing at least one of the above-described hinge structures.

According to various embodiments, the hinge structure 900 may include at least rotary members 211 and 212, a fixed bracket 213, arm parts 221 and 222, and a gear structure 230 and may include a multi-detent structure formed by three pairs of cam structures and cam members. The rotary members, the fixed bracket, and the gear structure may be configured to be similar or identical to at least some of the structures described above with reference to FIGS. 2 to 18. Accordingly, detailed descriptions about the remaining components other than the arm parts 221 and 222 and the cam members are replaced with the descriptions of the above-described structures. Furthermore, motions of the arm parts 221 and 222 of the hinge structure 1900 may be the same as or similar to the motions of the arm parts described above.

The arm parts 221 and 222 included in the hinge structure 1900 may implement a detent operation while being engaged with a plurality of moving cam members 241a, 241b, and 241c.

The first arm part 221 may include a first arm cam structure 221_4a fastened with one side of the moving cam member 241a included in the multi-detent structure 240, a second arm cam structure 221_4b fastened with one side of the moving cam member 241b included in the multi-detent structure 240, and a fifth arm cam structure 221_4c fastened with one side of the moving cam member 241c included in the multi-detent structure 240, and the second arm part 222 may include a third arm cam structure 222_4a fastened with an opposite side of the moving cam member 241a, a fourth arm cam structure 222_4b fastened with an opposite side of the moving cam member 241b, and a sixth arm cam structure 222_4c fastened with an opposite side of the moving cam member 241c.

A first rotary shaft 231 and a second rotary shaft 232 fastened to the first arm part 221 and the second arm part 222, respectively, may have a configuration and a shape that are the same as, or similar to, the configuration and the shape of the first rotary shaft and the second rotary shaft described above. According to an embodiment, at least one of the first rotary shaft 231 or the second rotary shaft 232 may have a structure in which thicknesses are different for respective positions as described above with reference to FIG. 5. According to various embodiments, the rotary shafts 231 and 232 described with reference to FIG. 19 may be formed to be longer than the above-described rotary shafts. In relation to supporting a detent function, the hinge structure 1900 may include a plurality of elastic bodies 242a, 242b, 242c, 242d, 242e, and 242f. For example, the plurality of elastic bodies may include the first elastic body 242a disposed between one side of a shaft bracket 243b and one side of the first moving cam member 241a, the second elastic body 242b disposed between an opposite side of the shaft bracket 243b and an opposite side of the first moving cam member 241a, the third elastic body 242c disposed between one side of a center bracket 243a in the x-axis direction and one side of the second moving cam member 241b, the fourth elastic body 242d disposed between an opposite side of the center bracket 243a in the x-axis direction and an opposite side of the second moving cam member 241b, the fifth elastic body 242e disposed between one side of the center bracket 243a in the −x-axis direction and one side of the third moving cam member 241c, and the sixth elastic body 242f disposed between an opposite side of the center bracket 243a in the −x-axis direction and an opposite side of the third moving cam member 241c. The plurality of elastic bodies may have characteristics or shapes similar to those of the above-described elastic bodies.

The above-described hinge structure 1900 may include more elastic bodies, cam structures, and cam members and thus may support generation of torque required for the detent performance of the foldable electronic device even though the diameters of the cam structures and the cam members are decreased. Accordingly, in the case where the hinge structure 1900 is applied, cam structures and cam members that have a smaller diameter may be designed, and thus slimness of the foldable electronic device may be improved without deterioration in the detent performance.

Figure 20:
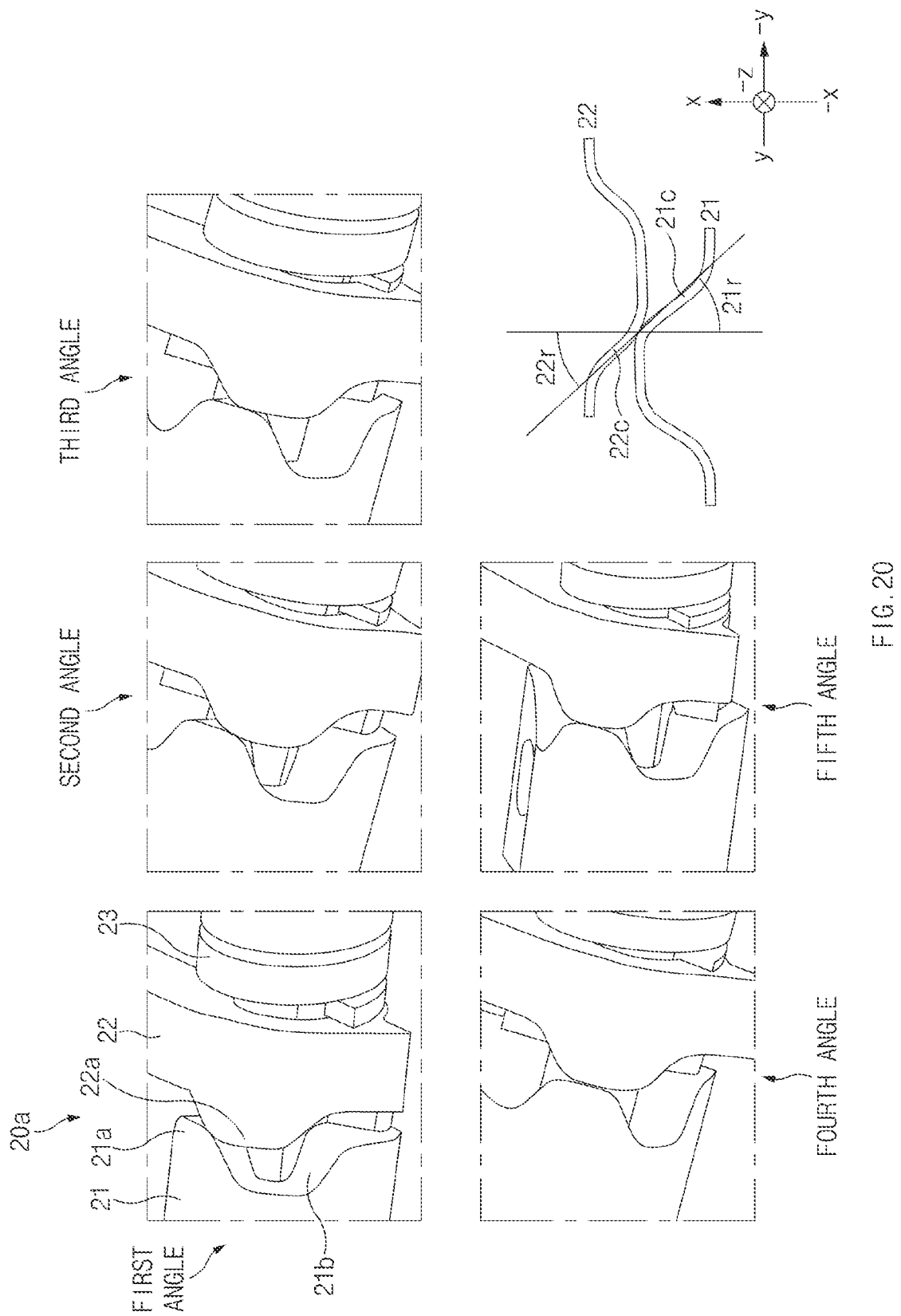
FIG. 20 is a diagram illustrating an example of a first type cam device according to various embodiments.

FIG. 20 is a diagram illustrating an example of a first type cam device according to various embodiments.

Referring to FIGS. 1 to 20, the first type cam device 20a according to an embodiment may be disposed such that a first type cam structure 21 and a first type cam member 22 are engaged with each other. The first type cam structure 21 may be, for example, at least one of the cam structures disposed on the above-described arm parts. The first type cam member 22 may be at least one of the cam members disposed on the above-described moving cam members.

The first type cam structure 21 may include, for example, a first ridge 21a and a first valley 21b and may include at least one first inclined portion 21c (or, an inclined area) between one side of the first ridge 21a and the first valley 21b. According to various embodiments, the first type cam structure 21 may further include an inclined portion extending to an opposite side of the first ridge 21a, and the inclined portion extending to the opposite side may have an inclination that is the same as, or similar to, the inclination of the first inclined portion 21c. At least a portion of the upper end of the first ridge 21a in the x-axis direction may be formed to be flat, and the flat area may be disposed horizontally (e.g., parallel to the y-axis) or may be formed to have a predetermined inclination. One end of the first inclined portion 21c and one end of the other inclined portion may be continuously disposed at the left and right ends of the first ridge 21a. An opposite end of the first inclined portion 21c may be connected with one side of the first valley 21b. When the first ridge 21a of the first type cam structure 21 protrudes in the x-axis direction, the first inclined portion 21c may form a first inclination angle 21r with the −x-axis.

The first type cam member 22 may include, for example, a second ridge 22a and a second inclined portion 22c connected, at one end thereof, with one end of the second ridge 22a. Additionally, an opposite end of the second inclined portion 22c may be connected with one side of a valley of the first type cam member 22. According to various embodiments, the first type cam member 22 may further include an inclined portion extending from an opposite end of the second ridge 22a. The inclined portion extending from the opposite end of the second ridge 22a may have an inclination that is the same as, or similar to, the inclination of the second inclined portion 22c. Similarly to the first ridge 21a, at least a portion of the second ridge 22a may be formed to be flat, and the flat area may be horizontally disposed or may be formed to have a predetermined inclination. When the second ridge 22a of the first type cam member 22 protrudes in the −x-axis direction, the second inclined portion 22c may form a second inclination angle 22r with the x-axis. The second inclination angle 22r may be the same as or similar to the first inclination angle 21r. Alternatively, the first inclination angle 21r and the second inclination angle 22r may be adjusted within a predetermined angle range.

The first type cam device 20a may have various mounting states. For example, as illustrated, the first type cam device 20a may have first to fifth angle states. The first angle state may correspond to, for example, a flat state of the foldable electronic device including the first type cam device 20a (or, an included angle of 180 degrees between the first housing and the second housing). In the first angle state, the first inclined portion 21c of the first type cam structure 21 and the second inclined portion 22c of the first type cam member 22 may have a line contact state. As the first inclined portion 21c and the second inclined portion 22c have the line contact state, the second inclined portion 22c may be forced to move toward the first valley 21b by the elastic force of an elastic member 23, and the flat state of the foldable electronic device may be more firmly maintained correspondingly.

According to various embodiments, when the angle between the first housing and the second housing is gradually decreased by pressure applied to the first housing or the second housing of the foldable electronic device, the first type cam device 20a may be in the fourth angle state via the second angle state and the third angle state. The second angle state and the third angle state, in which the angle between the first housing and the second housing exceeds 150 degrees (e.g., 170 degrees, 160 degrees, or any angle therebetween), may include a state in which the first type cam structure 21 and the first type cam member 22 of the first type cam device 20a have a line contact state (e.g., the area where the first ridge 21a and the second ridge 22a make contact with each other is linear).

The fourth angle state may include, for example, a state in which the angle between the first housing and the second housing of the foldable electronic device including the first type cam device 20a is 150 degrees or less (excluding the fifth angle state), and the fifth angle state may include a state in which the angle between the first housing and the second housing is 140 degrees or less. According to various embodiments, the fourth angle state may include a state in which at least a portion of the first ridge 21a of the first type cam structure 21 and at least a portion of the second ridge 22a of the first type cam member 22 make surface-to-surface contact with each other in a first size. The fifth angle state may include a state in which at least a portion of the first ridge 21a of the first type cam structure 21 makes surfaceto-surface contact with at least a portion of the second ridge 22a of the first type cam member 22 in a second size larger than the first size.

Figure 21:
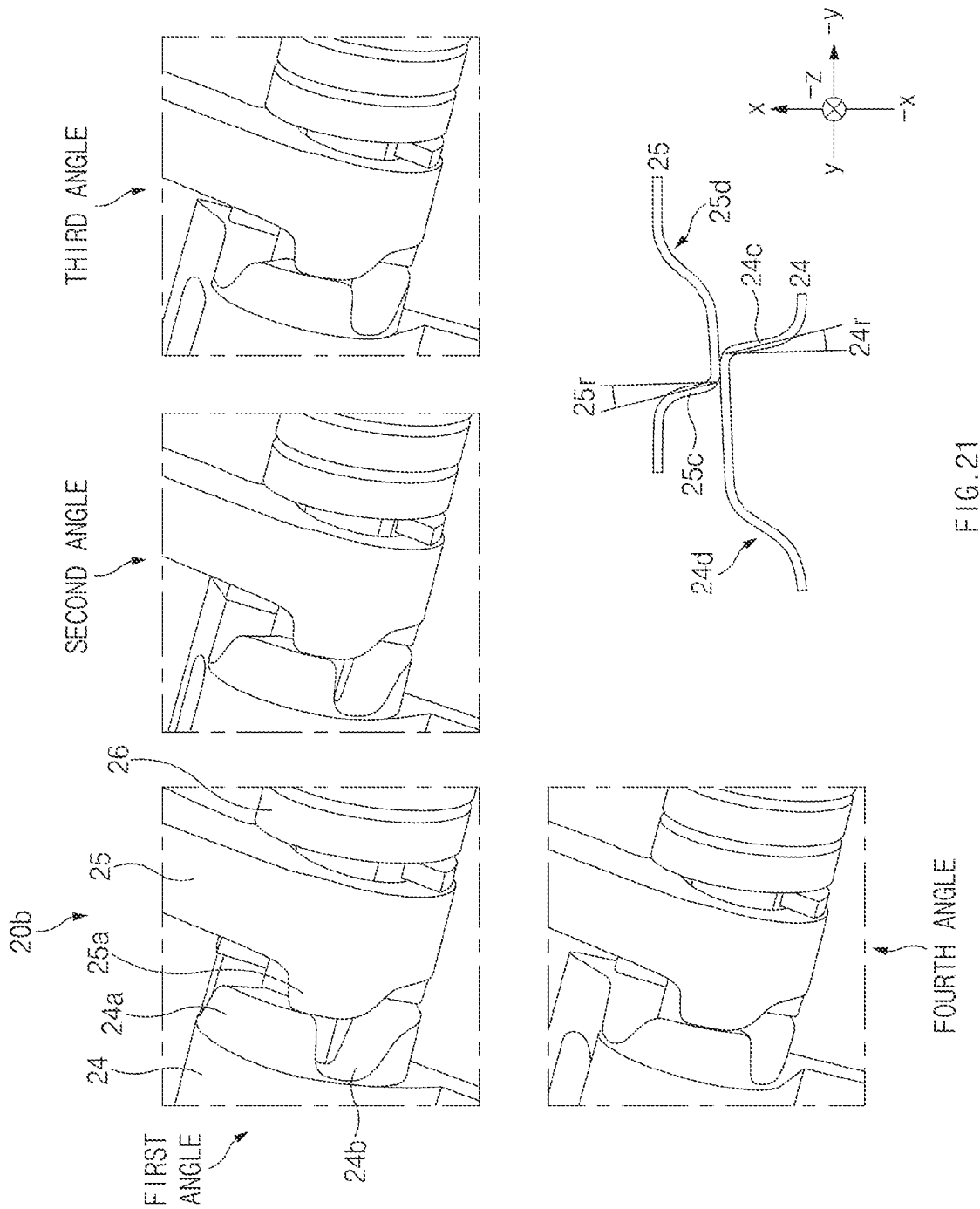
FIG. 21 is a diagram illustrating the shape of a second type cam device according to various embodiments.

FIG. 21 is a diagram illustrating the shape of a second type cam device according to various embodiments.

Referring to FIGS. 1 to 21, the second type cam device 20b according to an embodiment may be disposed such that a second type cam structure 24 and a second type cam member 25 are engaged with each other. The second type cam structure 24 may be, for example, at least one of the cam structures disposed on the above-described arm parts. The second type cam member 25 may be at least one of the cam members disposed on the above-described moving cam members.

The second type cam structure 24 may include, for example, a third ridge 24a and a third valley 24b and may include a third inclined portion 24c disposed between one side of the third ridge 24a and the third valley 24b and a fourth inclined portion 24d extending to an opposite side of the third ridge 24a. At least a portion of the upper end of the third ridge 24a in the x-axis direction may be formed to be flat, and the flat area may be horizontally disposed or may be formed to have a predetermined inclination. One end of the third inclined portion 24c and one end of the fourth inclined portion 24d may be continuously disposed at the left and right ends of the third ridge 24a. An opposite end of the third inclined portion 24c may be connected with one side of the third valley 24b. When the third ridge 24a of the second type cam structure 24 protrudes in the x-axis direction, the third inclined portion 24c may form a third inclination angle 24r with the −x-axis. The fourth inclined portion 24d may have a predetermined inclination angle with the opposite end of the third ridge 24a based on the x-axis, the inclination angle of the fourth inclined portion 24d may be greater than the third inclination angle 24r, and the fourth inclined portion 24d may be formed to be gentler than the third inclined portion 24c.

The second type cam member 25 may include, for example, a fourth ridge 25a, a fifth inclined portion 25c connected, at one end thereof, with one end of the fourth ridge 25a, and a sixth inclined portion 25d extending from an opposite end of the fourth ridge 25a. Similarly to the third ridge 24a, at least a portion of the fourth ridge 25a may be formed to be flat, and the flat area may be disposed parallel to the y-axis or may be formed to have a predetermined inclination. When the fourth ridge 25a of the second type cam member 25 protrudes in the −x-axis direction, the fifth inclined portion 25c may form a fourth inclination angle 25r with the x-axis. The fourth inclination angle 25r may be the same as or similar to the third inclination angle 24r. Alternatively, the third inclination angle 24r and the fourth inclination angle 25r may be adjusted within a predetermined angle range. The sixth inclined portion 25d may have a gentler inclination than the fifth inclined portion 25c. The size of the flat area of the fourth ridge 25a may be smaller than or equal to the size of the flat area of the third ridge 24a.

Similarly to the first type cam device 20a, the second type cam device 20b may have various mounting states. For example, the first housing and the second housing of the foldable electronic device including the second type cam device 20b may have first to fourth angle states. In the first angle state corresponding to a flat state of the foldable electronic device, the third ridge 24a and the fourth ridge 25a of the second type cam device 20b may have a surface contact state of a first size (or, a partial surface contact state). In the second angle state corresponding to the state in which the angle between the first housing and the second housing is 170 degrees, the third ridge 24a and the fourth ridge 25a may have a surface contact state of a second size larger than the first size.

In the third angle state corresponding to the state in which the angle between the first housing and the second housing is 160 degrees, the third ridge 24a and the fourth ridge 25a may have a surface contact state of a third size larger than the second size. The surface contact state of the third size may include, for example, a state in which the entire flat area of the fourth ridge 25a makes contact with the flat area of the third ridge 24a. In the fourth angle state corresponding to the state in which the angle between the first housing and the second housing is 150 degrees, the third ridge 24a and the fourth ridge 25a may have a surface contact state of the same size as the third size. In this case, the position of the fourth ridge 25a on the third ridge 24a may be different from that in the third angle state. The second type cam device 20b may support providing high torque by increasing the degree of compression of an elastic member 26 when the foldable electronic device is in the flat state.

As described above, the second type cam device 20b according to various embodiments, which includes the third inclined portion 24c and the fifth inclined portion 25c having a relatively steep inclination, may secure a relatively wide ridge top area, thereby providing high elastic force and high torque through the surface contact of the ridges of the second type cam structure 24 and the ridges of the second type cam member 25. Accordingly, the second type cam device 20b according to the embodiment may provide torque required for the detent function of the foldable electronic device.

According to various embodiments, the fourth inclined portion 24d and the sixth inclined portion 25d that have a relatively gentle inclination may have a line contact state when the foldable electronic device 100 is in a folded state.

Figure 22:
FIG. 22 is a diagram illustrating contact states of cam structures and cam members of the first type cam device and the second type cam device according to various embodiments.

FIG. 22 is a diagram illustrating example contact states of the cam structures and the cam members of the first type cam device and the second type cam device according to various embodiments.

Referring to FIGS. 1 to 22, the first type cam device 20a may form line contact between the cam structure Arm and the cam member Cam in a state in which the angle between the first housing and the second housing of the foldable electronic device is more than 150 degrees and may form partial surface contact or surface contact between the cam structure Arm and the cam member Cam in a state in which the angle between the first housing and the second housing is 150 degrees or less.

The second type cam device 20b may form partial surface contact between the cam structure Arm and the cam member Cam even when the foldable electronic device is in a flat state and may form surface contact between the cam structure Arm and the cam member Cam in a state in which the angle between the first housing and the second housing is 170 degrees or less.

In the first type cam device 20a and the second type cam device 20b, the amount of torque generated by the elastic members may be relatively small while the cam structures 21 and 24 and the cam members 22 and 25 make line contact with each other, and the amount of torque generated by the elastic members may be relatively large while the cam structures 21 and 24 and the cam members 22 and 25 make surface-to-surface contact with each other. Accordingly, the first type cam device 20a and the second type cam device 20b described above may be complexly applied to support securing torque for providing the detent function of the foldable electronic device.

Figure 23:
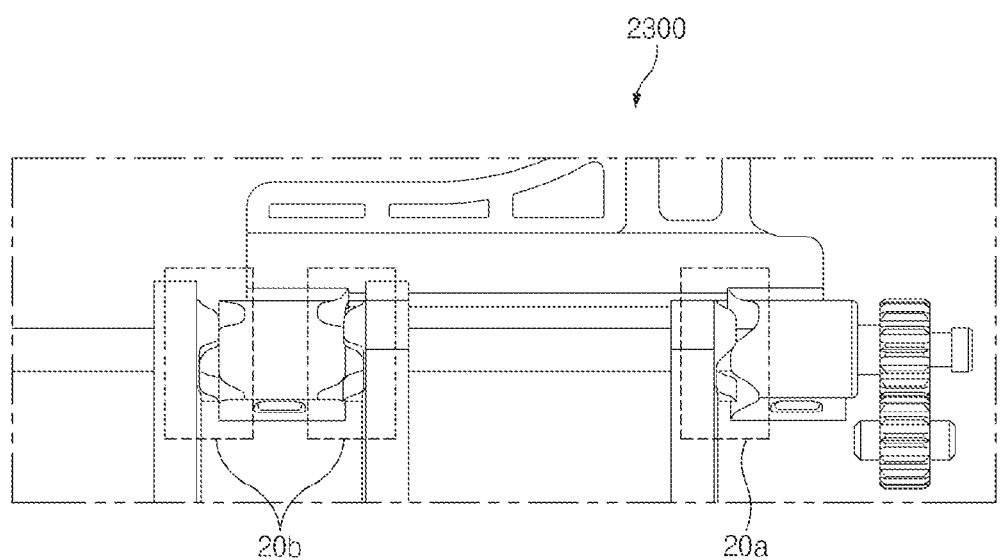
FIG. 23 is a diagram illustrating a flat state of a first type hinge structure according to various embodiments.
Figure 24:
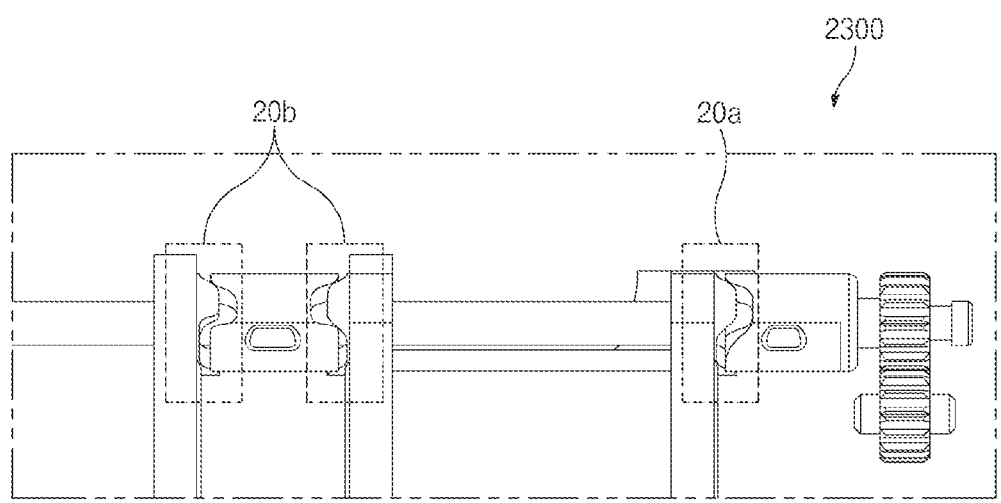
FIG. 24 is a diagram illustrating a folded state of the first type hinge structure according to various embodiments.

FIG. 23 is a diagram illustrating a flat state of a first type hinge structure according to various embodiments, and FIG. 24 is a diagram illustrating a folded state of the first type hinge structure according to various embodiments.

Referring to FIGS. 19, 23, and 24, the first type hinge structure 2300 may include one first type cam device 20a and two second type cam devices 20b. The first type cam device 20a may include the first type cam structure 21 having the first inclined portion 21c and the first type cam member 22 having the second inclined portion 22c that have been described above with reference to FIG. 20. The second type cam device 20b may include the second type cam structure 24 having the third inclined portion 24c and the second type cam member 25 having the fifth inclined portion 25c that have been described above with reference to FIG. 21.

In the drawings, the second type cam devices 20b may be disposed adjacent to each other, and the first type cam device 20a may be disposed to be spaced apart from the second type cam devices 20b. However, the disclosure is not limited thereto. For example, the second type cam device 20b and the first type cam device 20a may be disposed adjacent to each other (or, disposed to face each other), and the other second type cam device 20b may be disposed in a position spaced apart from the first type cam device 20a. Furthermore, the positions of the second type cam device 20b and the first type cam device 20a adjacent to each other may be changed.

Figure 25:
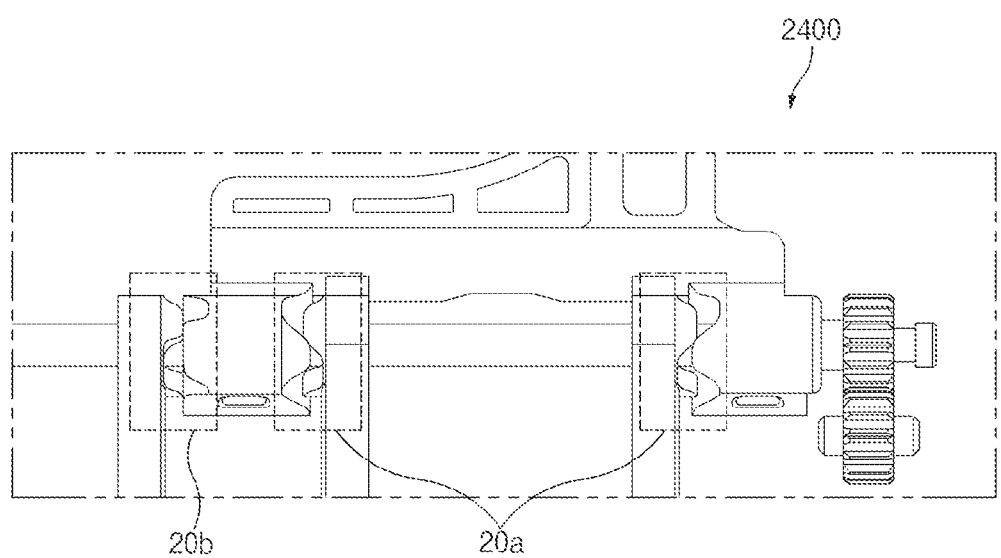
FIG. 25 is a diagram illustrating a flat state of a second type hinge structure according to various embodiments.
Figure 26:
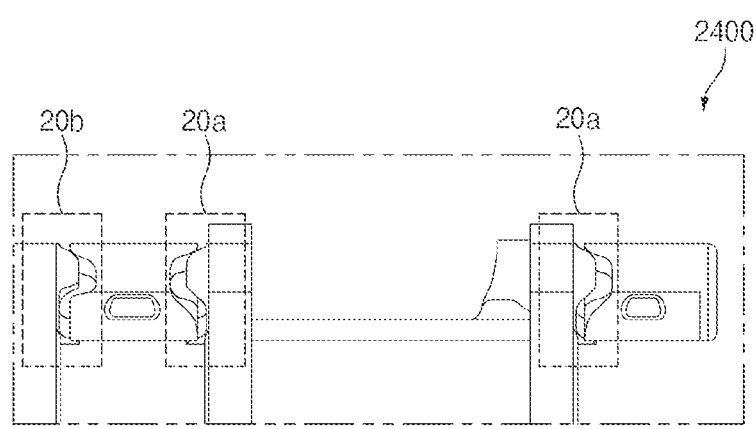
FIG. 26 is a diagram illustrating a folded state of the second type hinge structure according to various embodiments.

FIG. 25 is a diagram illustrating a flat state of a second type hinge structure according to various embodiments, and FIG. 26 is a diagram illustrating a folded state of the second type hinge structure according to various embodiments.

Referring to FIGS. 19, 25, and 26, the second type hinge structure 2400 may include two first type cam devices 20a and one second type cam devices 20b. The first type cam device 20a may include the first type cam structure 21 having the first inclined portion 21c and the first type cam member 22 having the second inclined portion 22c that have been described above with reference to FIG. 20. The second type cam device 20b may include the second type cam structure 24 having the third inclined portion 24c and the second type cam member 25 having the fifth inclined portion 25c that have been described above with reference to FIG. 21.

In the drawings, the second type cam device 20b and the first type cam device 20a may be disposed adjacent to each other, and the other first type cam device 20a may be disposed to be spaced apart from the first type cam device 20a adjacent to the second type cam device 20b. However, the disclosure is not limited thereto. For example, based on the drawings, the first type cam devices 20a may be disposed adjacent to each other, and the second type cam device 20b may be disposed in a position spaced apart from the first type cam devices 20a. Furthermore, the positions of the second type cam device 20b and the first type cam device 20a adjacent to each other may be changed.

Figure 27:
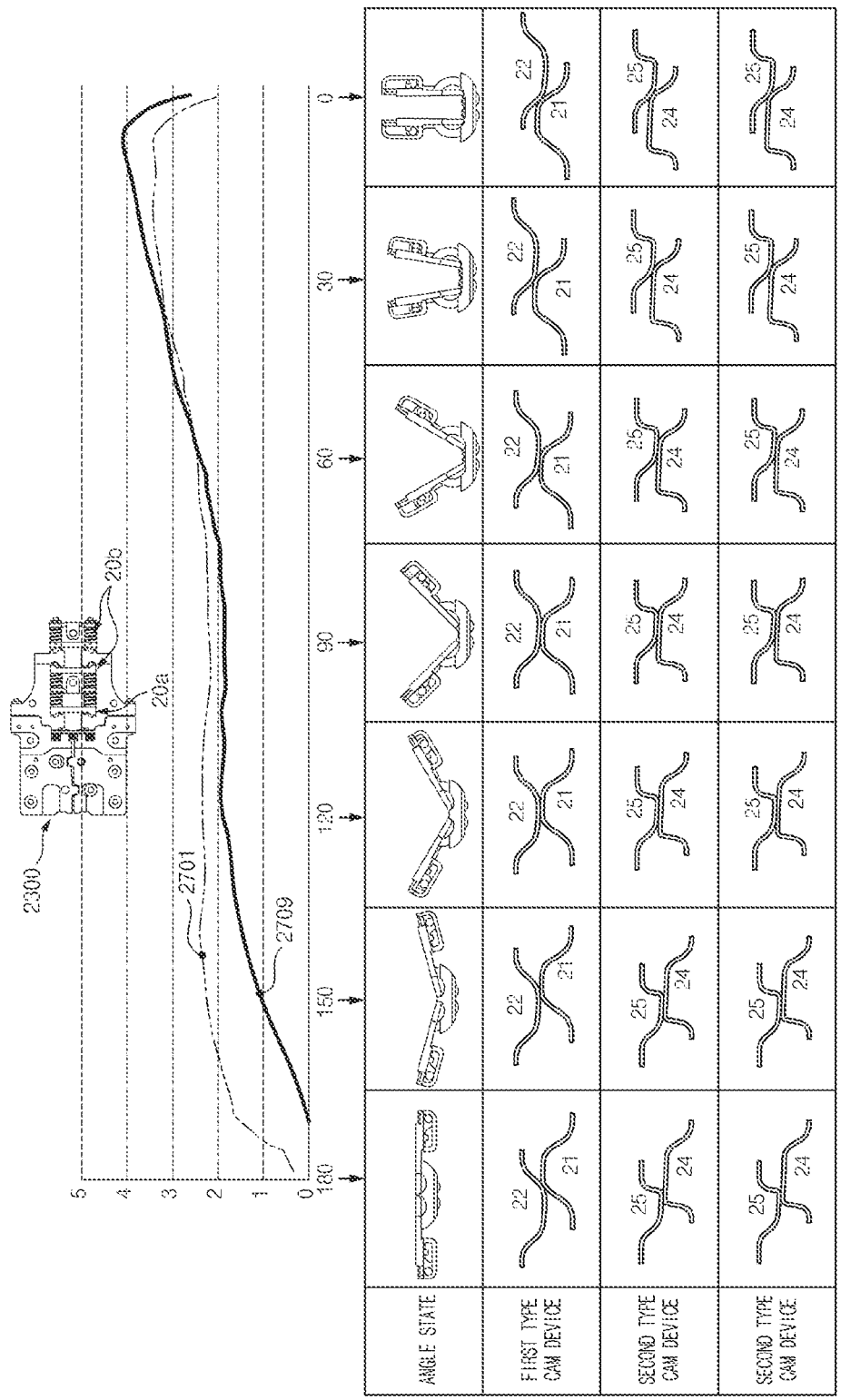
FIG. 27 is a diagram illustrating states of cam devices and torque variations depending on a folding angle of the foldable electronic device to which the first type hinge structure is applied according to various embodiments.

FIG. 27 is a diagram illustrating example states of cam devices and torque variations depending on a folding angle of the foldable electronic device to which the first type hinge structure is applied according to various embodiments.

Referring to FIGS. 19 to 27, the foldable electronic device employing the first type hinge structure 2300 may have, for example, an angle state of 0 degrees to 180 degrees. The 0-degree state may correspond to a folded state of the foldable electronic device, and the 180-degree state may correspond to a flat state of the foldable electronic device. As described above with reference to FIGS. 23 and 24, the first type hinge structure may include the two second type cam devices 20b and the one first type cam device 20a.

According to various embodiments, when the foldable electronic device is unfolded with an angle of 180 degrees, the cam structure and the cam member included in the one first type cam device 20a may have a line contact state, and the cam structures and the cam members included in the two second type cam devices 20b may partially have a surface contact state. According to various embodiments, when the foldable electronic device is unfolded with an angle of 90 degrees, the cam structure and the cam member included in the one first type cam device 20a may have a maximum surface contact state, and the cam structures and the cam members included in the two second type cam devices 20b may also have a maximum surface contact state. As the surface contact of the second type cam devices 20b is maintained while the foldable electronic device is folded with an angle of 60 degrees in the flat state, folding of the elastic members may remain constant. Accordingly, the foldable electronic device may maintain mounting states at various angles (e.g., may maintain a corresponding angle in the case where additional pressure is not applied) by securing high torque by a relatively high elastic force.

According to various embodiments, when the foldable electronic device is folded with an angle of 0 degrees, the cam structure and the cam member included in the one first type cam device 20a may have a line contact state, and the cam structures and the cam members included in the two second type cam devices 20b may also have a line contact state. As the cam structures and the cam members of the first type cam device 20a and the second type cam devices 20b all have the line contact state on the inclined surfaces, the elastic forces supplied by the elastic members may act such that the first type cam device 20a and the second type cam devices 20b rotate in one direction (e.g., the direction in which the foldable electronic device is folded). Accordingly, the foldable electronic device may more firmly maintain the folded state.

According to various embodiments, as the first type cam device 20a and the second type cam devices 20b have a line contact state even in the state in which the foldable electronic device is folded with an angle of 30 degrees, the foldable electronic device may automatically operate in the folded state (or, the closed state) even though there is little or no additional pressure.

In the graph showing the torque variations, graph 2709 represents the case where the cam structures and the cam members applied to the hinge structure of the foldable electronic device include only the first type cam devices 20a. Referring to graph 2701, when the first type hinge structure 2300 to which the second type cam devices 20b are partially applied is employed, improved torque for folding and unfolding motions may be provided, as compared with when only the first type cam devices 20a are applied.

Figure 28:
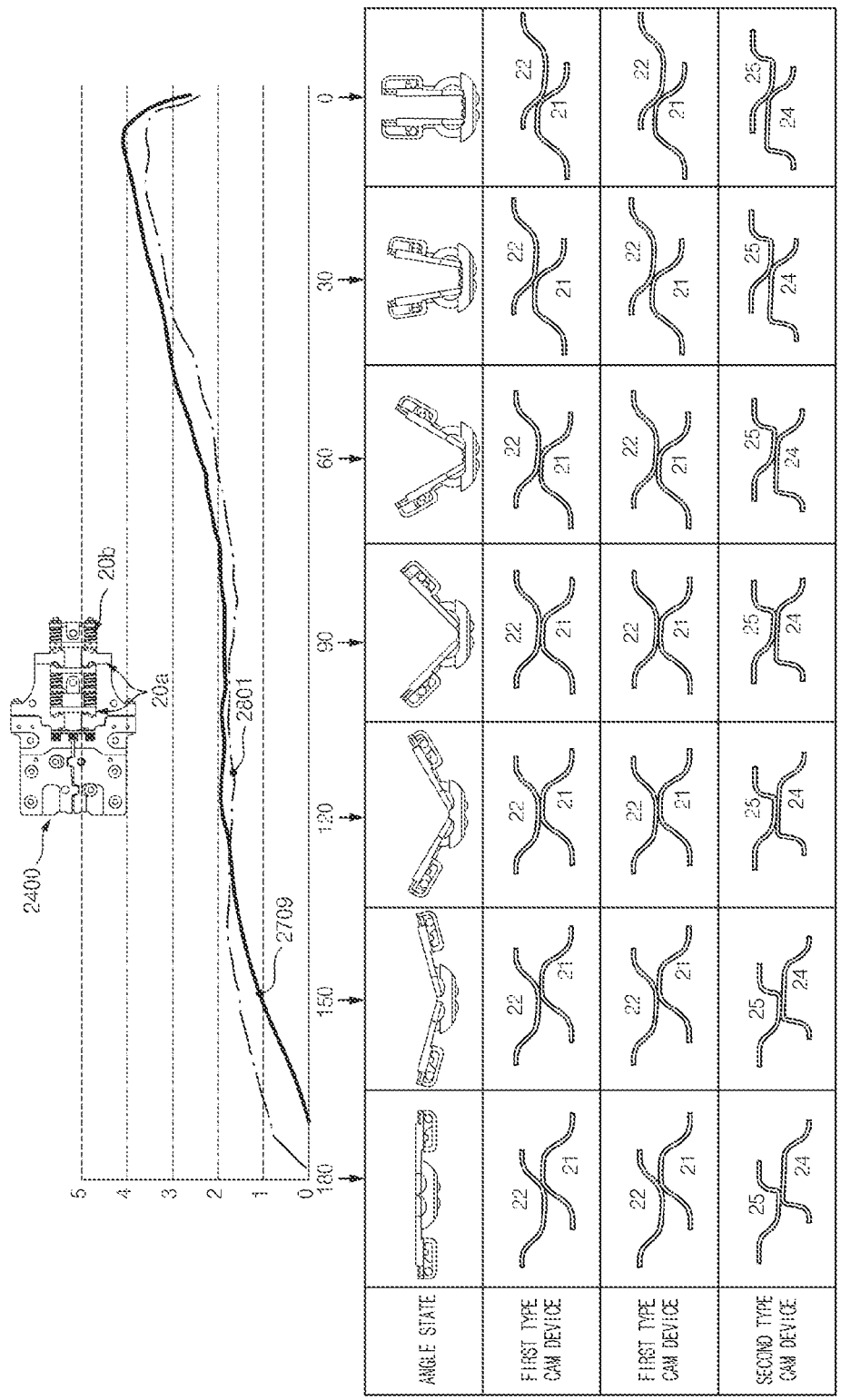
FIG. 28 is a diagram illustrating states of cam devices and torque variations depending on a folding angle of the foldable electronic device to which the second type hinge structure is applied according to various embodiments.

FIG. 28 is a diagram illustrating example states of cam devices and torque variations depending on a folding angle of the foldable electronic device to which the second type hinge structure is applied according to various embodiments.

Referring to FIGS. 19 to 28, the foldable electronic device employing the second type hinge structure 2400 may have, for example, an angle state of 0 degrees to 180 degrees. The 0-degree state may correspond to a folded state of the foldable electronic device, and the 180-degree state may correspond to a flat state of the foldable electronic device. As described above with reference to FIGS. 25 and 26, the second type hinge structure may include the one second type cam device 20b and the two first type cam devices 20a.

According to various embodiments, when the foldable electronic device is unfolded with an angle of 180 degrees, the cam structures and the cam members included in the two first type cam devices 20a may have a line contact state, and the cam structure and the cam member included in the one second type cam device 20b may partially have a surface contact state. According to various embodiments, when the foldable electronic device is unfolded with an angle of 90 degrees, the cam structures and the cam members included in the two first type cam devices 20a may have a maximum surface contact state, and the cam structure and the cam member included in the one second type cam device 20b may also have a maximum surface contact state. As the surface contact of the second type cam device 20b is maintained while the foldable electronic device is folded with an angle of 60 degrees in the flat state, relatively smaller torque may be secured when the second type hinge structure 2400 is employed than when the first type hinge structure 2300 is employed, but torque sufficient to maintain various mounting angles of the foldable electronic device may be secured.

According to various embodiments, when the foldable electronic device is folded with an angle of 0 degrees, the cam structures and the cam members included in the two first type cam devices 20a may have a line contact state, and the cam structure and the cam member included in the one second type cam device 20b may also have a line contact state. As the cam structures and the cam members of the first type cam devices 20a and the second type cam device 20b all have the line contact state on the inclined surfaces, as in the first type hinge structure 2300, the elastic forces supplied by the elastic members may act such that the first type cam devices 20a and the second type cam device 20b rotate in one direction (e.g., the direction in which the foldable electronic device is folded). Accordingly, the foldable electronic device may more firmly maintain the folded state.

According to various embodiments, as the first type cam devices 20a and the second type cam device 20b have a line contact state even in the state in which the foldable electronic device is folded with an angle of 30 degrees, the foldable electronic device may automatically operate in the folded state (or, the closed state) even though there is little or no additional pressure.

In the graph showing the torque variations, graph 2709 represents the case where the cam structures and the cam members applied to the hinge structure of the foldable electronic device include only the first type cam devices 20a. Referring to graph 2801, when the second type hinge structure 2400 to which the first type cam devices 20a and the one second type cam device 20b are applied is employed, improved torque for folding and unfolding motions may be provided, as compared with when only the first type cam devices 20a are applied.

According to the various example embodiments described above, a foldable electronic device according to an embodiment may include: a display, a first housing and a second housing on which the display is seated, and a hinge structure connecting the first housing and the second housing. The hinge structure may include: a first rotary support (or a first rotary member) connected with the first housing, a second rotary support (or a second rotary member) connected with the second housing, a first arm part configured to rotate in response to rotation of the first rotary support, a second arm part configured to rotate in response to rotation of the second rotary support, a first rotary shaft coupled to the first arm part, and a second rotary shaft coupled to the second arm part. The second arm part may include a plurality of cams into which one side of the second rotary shaft is inserted. The plurality of cams may include a first type cam having an arm cam having a first inclined portion forming a first inclination and a cam engaged with the arm cam and having a second inclined portion having an inclination the same as or similar to the first inclination, and a second type cam having an arm cam having a third inclined portion forming a second inclination steeper than the first inclination and a cam engaged with the arm cam and having a fourth inclined portion having an inclination the same as or similar to the second inclination.

According to various example embodiments, based on the foldable electronic device being in a flat state (e.g., when the angle between the first housing and the second housing is 180 degrees or an angle close thereto), ridges of the arm cam structure of the first type cam and ridges of the cam thereof may make contact with each other by a first size, and ridges of the arm cam structure of the second type cam and ridges of the cam thereof may make contact with each other by a second size (e.g., the second size being larger than the first size, and the second size corresponds to surface contact between ridges when the first size corresponds to line contact between ridges). The tops of the ridges may be formed to be at least partially flat, and the flat areas of the ridges may be formed to be horizontal based on a specific axis or may be formed to be inclined at a predetermined angle.

According to various example embodiments, in the first type cam, the sizes of the flat areas of the ridges of the arm cam structure may be the same as or similar to the sizes of the flat areas of the ridges of the cam (e.g., within a predetermined error range).

According to various example embodiments, in the second type cam, the sizes of the flat areas of the ridges of the arm cam may be different from the sizes of the flat areas of the ridges of the cam member. For example, the sizes of the flat areas of the ridges of the arm cam may be larger than the sizes of the flat areas of the ridges of the cam.

According to various example embodiments, based on the foldable electronic device being in a folded state (e.g., when the angle between the first housing and the second housing is 0 degrees or an angle close thereto), the first type cam may have a line contact state (e.g., the state in which the inclined portion of the arm cam of the first type cam and the inclined portion of the cam of the first type cam make contact with each other), and the second type cam may also have a line contact state (e.g., the state in which the inclined portion of the arm cam of the second type cam and the inclined portion of the cam of the second type cam make contact with each other). According to various example embodiments, the inclined portions of the second type cam that make line contact with each other may have a gentler inclination than the other inclined portions.

Figure 29:
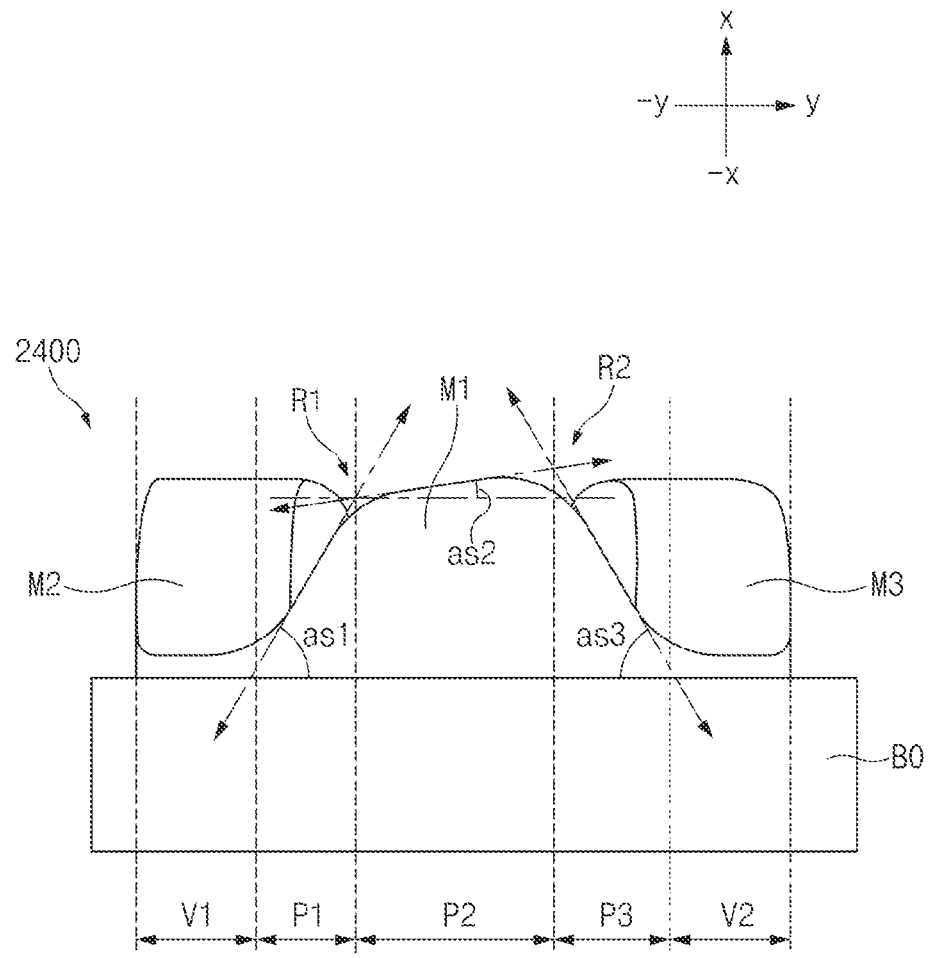
FIG. 29 is a diagram illustrating an example of a cam shape according to various embodiments.

FIG. 29 is a diagram illustrating an example of a cam shape according to various embodiments, and FIG. 30 is a diagram illustrating an example of a contact state of some ridges of a cam and a cam structure according to various embodiments. Prior to description, the cam 2400a according to an embodiment may be applied to at least one of the cams or the cam structures described above with reference to FIGS. 2 to 28.

Referring to FIG. 29, the cam 2400a (or, the cam structure) according to an embodiment may include a cam support portion B0, a plurality of ridges M1, M2, and M3, and a plurality of valleys V1 and V2. In the illustrated drawing, the cam 2400*a* including three ridges M1, M2, and M3 and three valleys V1 and V2 (a valley hidden by the first ridge M1 not being illustrated) is illustrated. However, the disclosure is not limited thereto. For example, the cam 2400*a* may have a structure including two or more ridges and two or more valleys. The plurality of ridges M1, M2, and M3 may all have the same structure. Alternatively, at least one of the plurality of ridges M1, M2, and M3 may have a different form from the other ridges. For example, as illustrated, at least one ridge may have a structure in which a second portion P2 corresponding to the center of the ridge is inclined at a predetermined inclination angle (an inclination angle greater than 0 degrees, for example, about 5 degrees), and at least one other ridge may have a structure which the central portion of the ridge is flat.

According to an embodiment, as illustrated, at least one of the plurality of ridges M1, M2, and M3, for example, the first ridge M1 may include a first portion P1 having a first inclination angle as1, the second portion P2 having a second inclination angle as2, and a third portion P3 having a third inclination angle as3. One side (e.g., the end facing the −y-axis direction) of the first portion P1 may be connected with one side (e.g., the end facing the y-axis direction) of the first valley V1, and an opposite side (e.g., the end facing the y-axis direction) of the first portion P1 may be connected with one side (e.g., the end facing the −y-axis direction) of the second portion P2. The first portion P1 may include, for example, a ridge line having the first inclination angle as1 based on the y-axis. The first inclination angle as1 may include an acute angle smaller than 90 degrees in the direction from the −y-axis to the y-axis based on the x-axis.

The one side (e.g., the end facing the −y-axis direction) of the second portion P2 may be connected with the opposite side (e.g., the end facing the y-axis direction) of the first portion P1, and an opposite side (e.g., the end facing the y-axis direction) of the second portion P2 may be connected with one side (e.g., the end facing the −y-axis direction) of the third portion P3. The second portion P2 may further protrude beyond the first portion P1 and the third portion P3 in the x-axis direction. The border area between the first portion P1 and the second portion P2 may be rounded with a specified first curvature R1. The second portion P2 may have the second inclination angle as2 based on the y-axis. The second inclination angle as2 may include an acute angle smaller than 90 degrees in the direction from the −y-axis to the y-axis based on the x-axis, and the absolute value of the second inclination angle as2 may be smaller than the absolute value of the first inclination angle as1.

The one side (e.g., the end facing the −y-axis direction) of the third portion P3 may be connected with the opposite side (e.g., the end facing the y-axis direction) of the second portion P2, and an opposite side (e.g., the end facing the y-axis direction) of the third portion P3 may be connected with one side (e.g., the end facing the −y-axis direction) of the second valley V2. The third portion P3 may be formed to have a predetermined inclination from the second portion P2 toward the y-axis. The border area between the second portion P2 and the third portion P3 may be rounded with a specified second curvature R2. The second curvature R2 may be smaller than the first curvature R1 (e.g., the first curvature R1 being gentler than the second curvature R2). The third portion P3 may have the third inclination angle as3 based on the −y-axis. The third inclination angle as3 may include an acute angle smaller than 90 degrees in the direction from the y-axis to the −y-axis based on the x-axis, and the absolute value of the third inclination angle as3 may be greater than the absolute value of the second inclination angle as2. According to various embodiments, the absolute value of the third inclination angle as3 may be greater than or equal to the absolute value of the first inclination angle as1.

Referring to FIG. 30, the cam shape described with reference to FIG. 29 may be applied to at least one cam or at least one cam structure described above with reference to FIGS. 2 to 28. For example, in the illustrated drawing, a protrusion of the cam 2400*a* may be disposed to protrude in the direction from the x-axis to the −x-axis, and a protrusion of the cam structure 2400*b* may be disposed to protrude in the direction from the −x-axis to the x-axis. Alternatively, a bumpy structure of the cam 2400*a* and a bumpy structure of the cam structure 2400*b* may be disposed to face each other. As illustrated, at least part of a second portion 2400*a*_P2 of the cam 2400*a* and at least part of a second portion 2400*b*_P2 of the cam structure 2400*b* may make contact with each other while an electronic device (e.g., the electronic device of FIG. 2) is in a free-stop section (a section in which the electronic device is mounted within a specified angle range by friction between the cam 2400*a* and the cam structure 2400*b*). According to an embodiment, when the electronic device has a free-stop state described with reference to FIG. 15 or 16, a display (the display 160 of FIG. 1 or 2) may exert a repulsive force so as to be restored to a flat state (the state of FIG. 14).

According to an embodiment, the cam 2400*a* may be pushed in the y-axis direction by the restoring force of the display (e.g., the repulsive force of the display acts in the counterclockwise direction), and the cam structure 2400*b* may be pushed in the −y-axis direction by the restoring force of the display (e.g., the repulsive force of the display acts in the clockwise direction). Because the second portion 2400*a*_P2 of the cam 2400*a* and the second portion 2400*b*_p2 of the cam structure 2400*b* make contact with each other with the above-described second inclination angle as2 in this process, the cam 2400*a* and the cam structure 2400*b* of the disclosure may cancel out at least part of the repulsive force (or, the restoring force) generated in the unfolding direction of the display, thereby suppressing a push in the free-stop state that is likely to occur regardless of a user's intention (e.g., a change of the angle between a first housing (e.g., the first housing 110 of FIG. 1 or 2) and a second housing (e.g., the second housing 120 of FIG. 1 or 2)). According to various embodiments, as in FIG. 15 or 16, the electronic device may have a mounting state of a specific angle (or, a free-stop state). In this case, as the cam 2400*a* and the cam structure 2400*b* are disposed to be engaged with each other as illustrated, the repulsive force or the restoring force of the display may cancel out force acting toward a flat state as in FIG. 14. Although FIG. 30 illustrates the structure in which the top portions of the ridges of the cam 2400*a* and the cam structure 2400*b* have the second inclination angle as2, the disclosure is not limited thereto. For example, the second portion P2 having the second inclination angle as2 may be formed on only one of the cam 2400*a* and the cam structure 2400*b*.

Meanwhile, in FIG. 30, the rotation in the unfolding direction has been described based on the direction in which the cam 2400*a* rotates from the −y-axis (or, the left) to the y-axis (or, the right). However, the disclosure is not limited thereto. For example, depending on the design form of the electronic device, the direction in which the cam 2400*a* rotates from the y-axis to the −y-axis may be a direction in which the display operates from a folded state to a flat state.

The hinge structures of the foldable electronic device described above are not limited to the embodiments described with reference to the respective drawings, and the hinge structures described with reference to the respective drawings may be complexly applied. For example, a foldable electronic device according to an embodiment may include at least one first type hinge structure 2300 described with reference to FIGS. 23 and 24, or may include at least one second type hinge structure 2400 described with reference to FIGS. 25 and 26. For example, a foldable electronic device may employ only a plurality of first type hinge structures 2300, may employ only a plurality of second type hinge structures 2400, or may complexly employ the first type hinge structure 2300 and the second type hinge structure 2400.

Furthermore, at least one of the first type cam device 20*a* or the second type cam device 20*b* described with reference to FIGS. 20 and 21 may be applied to the hinge structure of FIGS. 2 to 4 in which one arm part includes two cam structures. For example, an arm part may employ only a plurality of first type cam devices 20*a*, may employ only a plurality of second type cam devices 20*b*, or may complexly employ the first type cam device 20*a* and the second type cam device 20*b*.

In addition, the structure of the fastening holes described with reference to FIG. 15 may be applied to at least one of the hinge structures described with reference to FIGS. 1 to 14 and 16 to 28, and the structure of the shaft gears 231_2 and 232_2 described with reference to FIG. 18 may be applied to at least one of the hinge structures according to the various embodiments described above.

According to the various example embodiments described above, a foldable electronic device according to an example embodiment may include a first housing and a second housing, a flexible display, at least a portion of which is seated on the first housing and the second housing, and a hinge structure corresponding a hinge member or a hinge that connects the first housing and the second housing (or, at least a portion of which is disposed between the first housing and the second housing or that connects at least a portion of the first housing and at least a portion of the second housing). The hinge structure may include: a first rotary support coupled with the first housing, a second rotary support coupled with the second housing, a first arm part configured to rotate in response to rotation of the first rotary support and including (or, includes at least) a first arm cam and a second arm cam spaced apart from the first arm cam, a second arm part configured to rotate in response to rotation of the second rotary member and including (or, includes at least) a third arm cam and a fourth arm cam spaced apart from the third arm cam structure, a first rotary shaft passing through a first fastening hole formed in the first arm cam structure and a second fastening hole formed in the second arm cam, and a second rotary shaft passing through a third fastening hole formed in the third arm cam and a fourth fastening hole formed in the fourth arm cam. Shapes of cross-sections of the third fastening hole and the fourth fastening hole viewed in an axial direction in which the second rotary shaft is inserted may include flat areas and curved areas. The second rotary shaft may be formed such that a first thickness of a first portion at least partially disposed in the fourth fastening hole differs from a second thickness of a second portion at least partially disposed in the third fastening hole.

According to various example embodiments, the second rotary shaft may include a pillar portion at least partially disposed in the third fastening hole and the fourth fastening hole and a shaft gear formed at an edge on one side of the pillar portion.

According to various example embodiments, the pillar portion may include the first portion disposed adjacent to the shaft gear and at least partially disposed in the fourth fastening hole based on the second rotary shaft being fastened to the second arm part, the second portion extending from the first portion and at least partially disposed in the third fastening hole, and a third portion extending from the second portion and disposed through the third fastening hole.

According to various example embodiments, a first thickness of the first portion may be greater than a second thickness of the second portion.

According to various example embodiments, the second thickness of the second portion may be greater than a third thickness of the third portion.

According to various example embodiments, the second portion may have a length longer than a length from an inlet of the third fastening hole of the third arm cam to an outlet of the fourth fastening hole of the fourth arm cam.

According to various example embodiments, the foldable electronic device may further include: a first press-fit protrusion disposed on an inside surface that forms the third fastening hole, the first press-fit protrusion contacting the second portion of the pillar portion, and a second press-fit protrusion disposed on an inside surface that forms the fourth fastening hole, the second press-fit protrusion contacting the first portion of the pillar portion.

According to various example embodiments, the first press-fit protrusion and the second press-fit protrusion may have a semi-cylindrical shape, and the semi-cylindrical shape may be deformed based on on insertion of the second rotary shaft.

According to various example embodiments, a first protrusion height of the first press-fit protrusion may differ from a second protrusion height of the second press-fit protrusion.

According to various example embodiments, the second protrusion height may be less than the first protrusion height.

According to various example embodiments, at least a part of the first press-fit protrusion and the second press-fit protrusion may be disposed between the flat area and the curved area.

According to various example embodiments, the first press-fit protrusion may have a rail protrusion shape extending from one point on a starting portion of the third fastening hole or an intermediate point of the third fastening hole to one point on an ending portion of the third fastening hole.

According to various example embodiments, based on the third portion of the pillar portion of the second rotary shaft being inserted into the third fastening hole via the fourth fastening hole and the second portion of the pillar portion starting to make contact with the press-fit protrusion, the first portion of the pillar portion may not make contact with the second press-fit protrusion.

According to various example embodiments, a first area of a cross-section of the third fastening hole may differ from a second area of a cross-section of the fourth fastening hole.

According to various example embodiments, the first area may be smaller than the second area.

According to various example embodiments, the foldable electronic device may further include: a third press-fit protrusion formed in the first fastening hole of the first arm part and a fourth press-fit protrusion formed in the second fastening hole of the first arm part.

According to various example embodiments, a height of the third press-fit protrusion may be greater than a height of the fourth press-fit protrusion.

According to various example embodiments, based on the first rotary shaft being inserted into the first fastening hole via the second fastening hole, a thickness of the first rotary shaft disposed in the first fastening hole may be less than a thickness of the first rotary shaft disposed in the second fastening hole.

According to various example embodiments, an empty space of one cross-section of the first fastening hole may have a smaller size than an empty space of one cross-section of the second fastening hole.

According to various example embodiments, based on the first rotary shaft being inserted into the first fastening hole via the second fastening hole, a thickness of the first rotary shaft passing through the first fastening hole and deviating from the first fastening hole may be less than a thickness of the first rotary shaft disposed in the first fastening hole, and a thickness of the first rotary shaft disposed in the second fastening hole may be greater than a thickness of the first rotary shaft disposed in the first fastening hole.

FIGS. 1 to 30 described above illustrate an example of a structure applicable to a foldable electronic device, and except for some structures applied to a structure capable of performing a folding or unfolding motion of the foldable electronic device, the components described with reference to the corresponding drawings may be selectively added or omitted. For example, in the embodiments of the disclosure, based on the structure of FIG. 5 in which the plurality of cams are connected to the shaft, the remaining components may be added or omitted. Furthermore, one surface of a shaft may be formed in multiple stages, and as described with reference to FIG. 15, two shafts may be identically aligned in one direction. Accordingly, features of an embodiment described with reference to a specific drawing may be applied to a structure of another embodiment. Moreover, in the process of describing a specific drawing, other specific drawings have been additionally referred to, but the disclosure is not limited thereto. The components mentioned in the description of the specific drawing may refer to components described with reference to at least some of the unspecified drawings included in the disclosure.

Each component (e.g., a module or a program) according to various embodiments may include single entity or a plurality of entities, a part of the above-described sub-components may be omitted, or other sub-components may be further included in various embodiments. Alternatively or additionally, after being integrated in one entity, some components (e.g., a module or a program) may identically or similarly perform the function executed by each corresponding component before integration.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents.

What is claimed is:

1. A foldable electronic device comprising:
    a first housing and a second housing;
    a flexible display, at least a portion of which is seated on the first housing and the second housing; and
    a hinge structure configured to connect the first housing and the second housing,
    wherein the hinge structure includes:
    a first rotary support coupled with the first housing;
    a second rotary support coupled with the second housing;
    a first arm part configured to rotate in response to rotation of the first rotary support, the first arm part including at least a first arm cam and a second arm cam spaced apart from the first arm cam;
    a second arm part configured to rotate in response to rotation of the second rotary support, the second arm part including at least a third arm cam and a fourth arm cam spaced apart from the third arm cam;
    a first rotary shaft configured to pass through a first fastening hole formed in the first arm cam and a second fastening hole formed in the second arm cam; and
    a second rotary shaft configured to pass through a third fastening hole formed in the third arm cam and a fourth fastening hole formed in the fourth arm cam,
    wherein shapes of cross-sections of the third fastening hole and the fourth fastening hole viewed in an axial direction in which the second rotary shaft is inserted include flat areas and curved areas, and
    wherein the second rotary shaft has a first thickness of a first portion at least partially disposed in the fourth fastening hole differing from a second thickness of a second portion at least partially disposed in the third fastening hole.

2. The foldable electronic device of claim 1, wherein the second rotary shaft includes:
    a pillar portion at least partially disposed in the third fastening hole and the fourth fastening hole; and
    a shaft gear formed at an edge on one side of the pillar portion.

3. The foldable electronic device of claim 2, wherein the pillar portion includes:
    the first portion disposed adjacent to the shaft gear, the first portion being at least partially disposed in the fourth fastening hole based on the second rotary shaft being fastened to the second arm part;
    the second portion extending from the first portion and at least partially disposed in the third fastening hole; and
    a third portion extending from the second portion and disposed through the third fastening hole.

4. The foldable electronic device of claim 3, wherein the first thickness of the first portion is greater than the second thickness of the second portion.

5. The foldable electronic device of claim 3, wherein the second thickness of the second portion is greater than a third thickness of the third portion.

6. The foldable electronic device of claim 3, wherein the second portion has a length longer than a length from an inlet of the third fastening hole of the third arm cam to an outlet of the fourth fastening hole of the fourth arm cam.

7. The foldable electronic device of claim 3, further comprising:
    a first press-fit protrusion disposed on an inside surface forming the third fastening hole, the first press-fit protrusion being in contact with the second portion of the pillar portion; and
    a second press-fit protrusion disposed on an inside surface forming the fourth fastening hole, the second press-fit protrusion being in contact with the first portion of the pillar portion.

8. The foldable electronic device of claim 7, wherein a first protrusion height of the first press-fit protrusion differs from a second protrusion height of the second press-fit protrusion.

9. The foldable electronic device of claim 7, wherein at least a part of the first press-fit protrusion and the second press-fit protrusion is disposed between the flat area and the curved area.

10. The foldable electronic device of claim 7, wherein the first press-fit protrusion has a rail protrusion shape extending from one point on a starting portion of the third fastening hole or an intermediate point of the third fastening hole to a point on an ending portion of the third fastening hole.

11. The foldable electronic device of claim 1, wherein a first area of a cross-section of the third fastening hole differs from a second area of a cross-section of the fourth fastening hole.

12. The foldable electronic device of claim 11, wherein the first area is smaller than the second area.

13. The foldable electronic device of claim 1, further comprising:
   a third press-fit protrusion formed in the first fastening hole of the first arm part; and
   a fourth press-fit protrusion formed in the second fastening hole of the first arm part.

14. The foldable electronic device of claim 13, wherein a height of the third press-fit protrusion is greater than a height of the fourth press-fit protrusion.

15. The foldable electronic device of claim 1, wherein an inside surface of at least one of the first fastening hole or the second fastening hole includes a first sidewall vertically disposed in a direction toward the display based on the foldable electronic device being in a flat state, a second sidewall vertically disposed in the direction toward the display and disposed to face the first sidewall, a third sidewall connecting one end of the first sidewall and one end of the second sidewall and forming a curved surface, and a fourth sidewall connecting an opposite end of the first sidewall and an opposite end of the fourth sidewall and disposed to face the third sidewall.

* * * * *